(12) United States Patent
Wiener et al.

(10) Patent No.: US 7,333,176 B2
(45) Date of Patent: Feb. 19, 2008

(54) DE-FOCUS UNIFORMITY CORRECTION

(75) Inventors: Roberto B. Wiener, Bethel, CT (US); Alexander Kremer, Stamford, CT (US); Elizabeth Stone, Stamford, CT (US); Richard Zimmerman, Brookfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/647,419

(22) Filed: Dec. 29, 2006

(65) Prior Publication Data

US 2007/0109518 A1 May 17, 2007

Related U.S. Application Data

(62) Division of application No. 11/022,888, filed on Dec. 28, 2004, now Pat. No. 7,173,688.

(51) Int. Cl.
*G03B 27/52* (2006.01)
*G03B 27/42* (2006.01)
*G03B 27/72* (2006.01)

(52) U.S. Cl. .............. 355/55; 355/53; 355/69

(58) Field of Classification Search ............ 355/52, 355/53, 55, 67–71, 77; 356/399–401; 250/548; 430/311

See application file for complete search history.

(56) References Cited

U.S. PATENT DOCUMENTS 6,771,350 B2 * 8/2004 Nishinaga ............... 355/53
6,813,004 B1 * 11/2004 Horikoshi et al. ............ 355/69
7,026,082 B2 4/2006 Eurlings et al.
7,027,130 B2 * 4/2006 Spence et al. ............... 355/69
7,173,688 B2 2/2007 Wiener et al.
2007/0103665 A1 5/2007 Zimmerman et al.

FOREIGN PATENT DOCUMENTS

JP 2006-203192 A 8/2006

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A system and method for uniformity correction such that a defined uniformity specification is met while minimizing a set of selected constraints is provided. The system includes illumination optics, an opto-mechanical correction system, a contrast device, projection optics and a correction module coupled to the correction system. The correction system includes a plurality of adjustable components such as fingers. The correction module is configured to determine adjustments to the components to correct uniformity. A method for discretizing the continuous intensity integral is also provided. The illumination slot is divided into a grid having multiple grid points. "pupils" are then superimposed onto the grid. Multiple second grids are also defined. Each ""pupil"" is mapped to a second grid such that the center of the second grid is coincident with the ""pupil"" center. The continuous intensity integral is then discretized using the first grid, plurality of second grids, and ""pupil"" mappings.

17 Claims, 48 Drawing Sheets

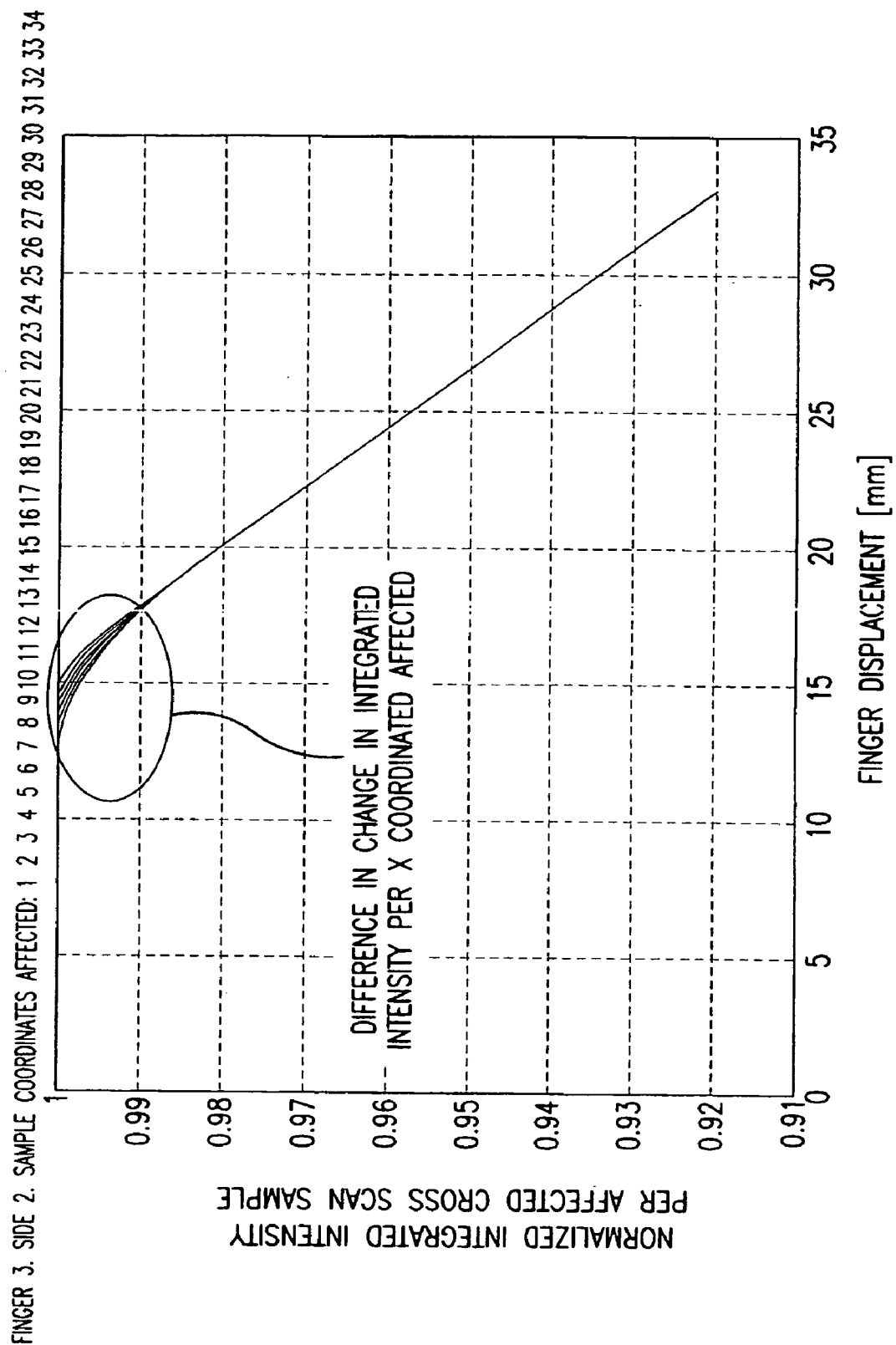

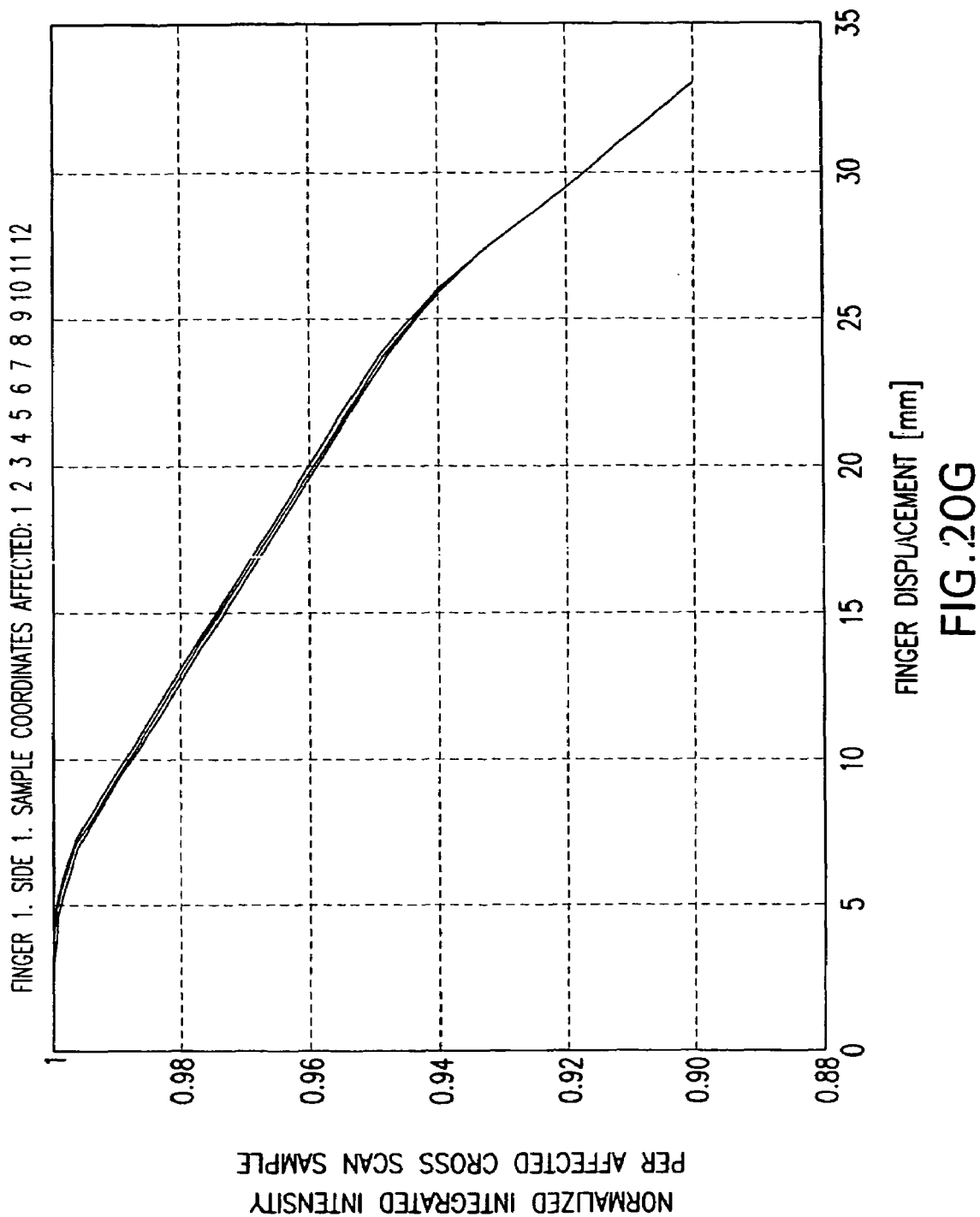

DE-FOCUS UNIFORMITY CORRECTION

CROSS-REFERENCE TO RELATED APPLICATIONS

This application is a divisional of U.S. patent application Ser. No. 11/022,888, filed Dec. 28, 2004, entitled "Method for Calculating an Intensity," which is now U.S. Pat. No. 7,173,688 which is incorporated herein by reference in its entirety.

FIELD OF THE INVENTION

The present invention is generally related to uniformity correction in lithography systems.

BACKGROUND OF THE INVENTION

Conventional lithography systems include, among other things, an illumination system to produce a uniform intensity distribution of a received laser beam. It is desirable that the resulting illumination be as uniform as possible and that any uniformity errors be kept as small as possible. Illumination uniformity influences the ability of an illumination system to produce uniform line widths across an entire exposure field. Illumination uniformity errors can significantly impact the quality of devices produced by the lithography system.

One example of a popular conventional lithography system is a "step-and-scan" system. A "step-and-scan" system creates an illuminated slot narrower than one exposure field on the wafer. The system then scans this field along the fully exposure field and then steps to another field. This process is repeated. Because of the nature of the system's operation, radiation energy in the scan direction is integrated and as a result, can be non-uniform. However, the field must be uniform in the cross-scan direction. In other words, integrated energy along each scan line should remain the same.

In order to correct for uniformity errors, uniformity must be calculated, often in real-time. Uniformity is calculated as the ratio between the difference of the maximum and minimum value of the integral of the intensity in the cross scan (i.e., x) direction divided by the sum of the maximum and minimum value of the integral of the intensity. The integral of the intensity at each cross scan coordinate is given by a continuous triple integral equation including the product of transmissibility and "pupil" shape.

Finding a comprehensive way to express the product of the transmissibility and "pupil" shape as a function of the uniformity correction mechanism adds complexity. In addition, any algorithm that requires real-time computation of three integrals over every coordinate of interest is the illumination slot is not practical.

Therefore, a need exists for a uniformity correction system that can discretize the intensity integral.

A further need exists for a system that can determine and make adjustments to a correction system such that a defined uniformity specification is met while minimizing a set of selected constraints.

SUMMARY OF THE INVENTION

The present invention is directed to a system and method for uniformity correction by making adjustments to a correction system such that a defined uniformity specification is met while minimizing a set of selected constraints. The present invention is further directed to a method for discretizing the continuous intensity integral.

In accordance with an aspect of the present invention, the system for de-focus uniformity correction includes a uniformity correction system coupled to a correction module. The uniformity correction system includes one or more adjustable variables or degrees of freedom that allow the manipulation of intensity over a zone of the illumination slot. The correction module is configured to determine values for adjustments to the adjustable variable or degrees of freedom of the correction system to correct uniformity.

In accordance with an aspect of the present invention, a map that represents the effect of each adjustable component on the intensity is generated. The uncorrected uniformity profile is then measured.

In accordance with another aspect of the invention, the intensity integral is calculated. In an embodiment, optional initial values for adjustments to the one or more adjustable components of the uniformity correction system to correct for a standard uncorrected uniformity profile are calculated. The corrected uniformity profile is then measured. The value for adjustments to one or more adjustable components is then calculated to correct the measured uncorrected uniformity profile. The adjustment values are then communicated to the uniformity correction system.

In a further aspect of the present invention, the uniformity correction system adjusts the adjustable components based on the received values. The corrected uniformity profile is then optionally measured. If the uniformity specifications are met, uniformity correction ends. If the uniformity specifications are not met, the uncorrected uniformity profile is optionally modified and values for the one or more adjustable components are recalculated. In an alternate embodiment, if the uniformity specifications are not met, the generated map is optionally modified and values for the one or more adjustable components are recalculated.

In accordance with another aspect of the invention, the intensity integral is calculated. An illumination slot is divided into a first grid having a plurality of grid points. Each illumination slot grid point is defined by a first and second direction (e.g., x and y direction) coordinate. A plurality of pupils are then superimposed on the illumination grid. The center of each "pupil" is represented by a grid point. A plurality of second grids is also defined. Each second grid has a plurality grid points defined by third and fourth direction coordinates. Each of the plurality of pupils maps to a second grid. The center of the second grid is coincident with the center of the "pupil" mapped to the second grid. The continuous intensity integral is then discretized using the first grid, plurality of second grids, and "pupil" mappings.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 5A:
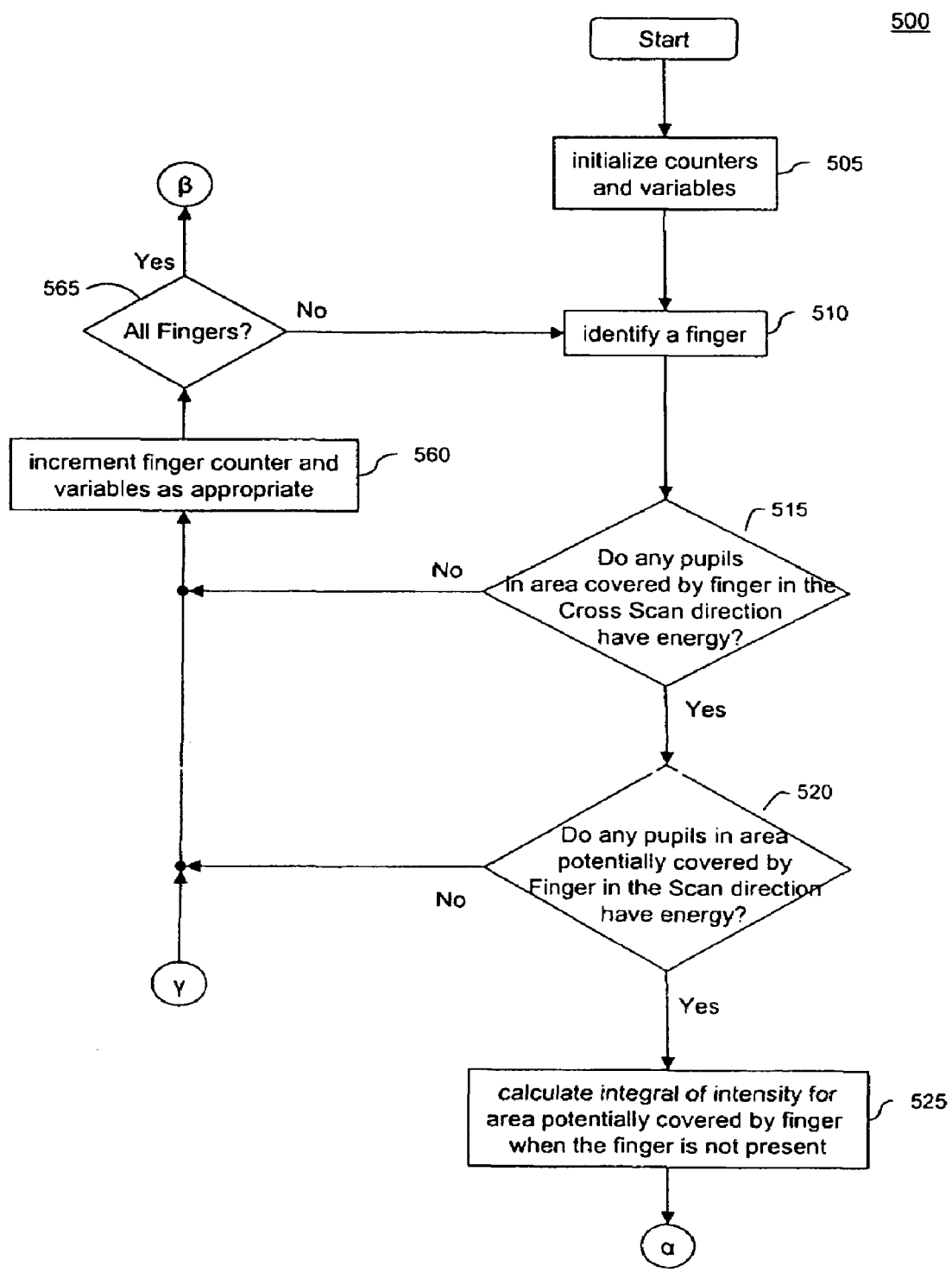
Figure 5B:
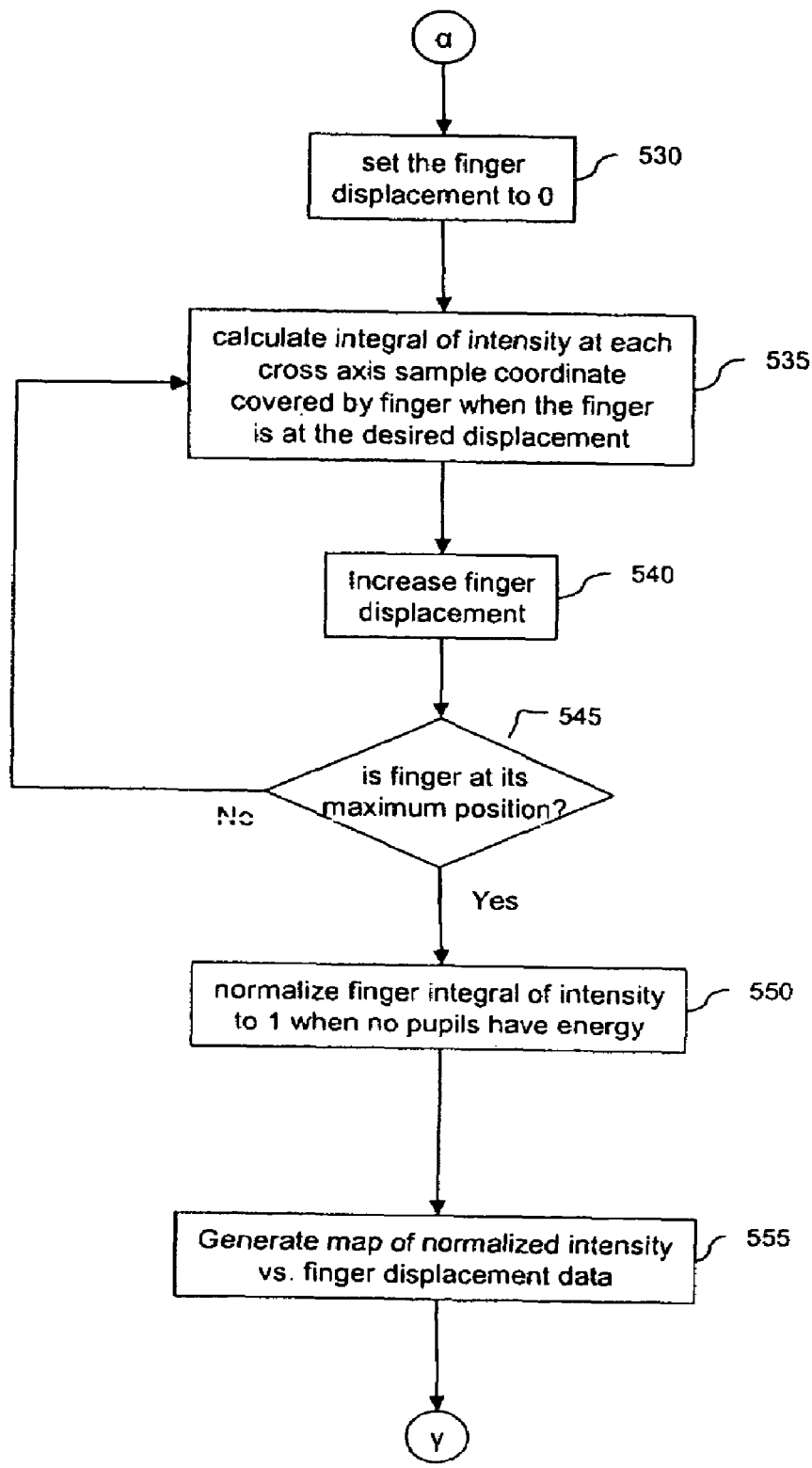
Figure 5C:
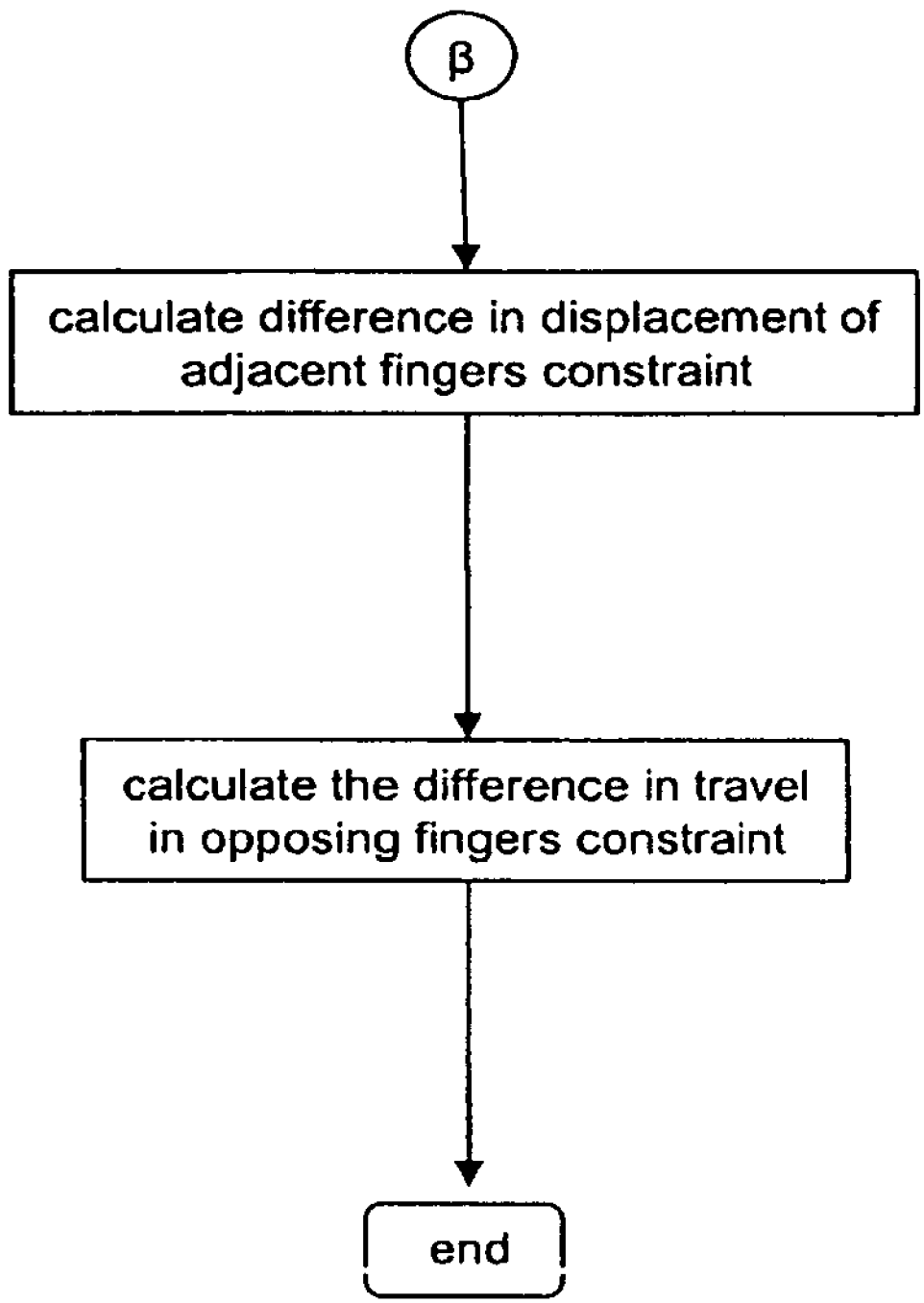

FIGS. 5A-C depict a flowchart of an exemplary method for determining the adjustments to one or more fingers in a correction system having a double-sided configuration, according to an embodiment of the invention.

Figure 6:
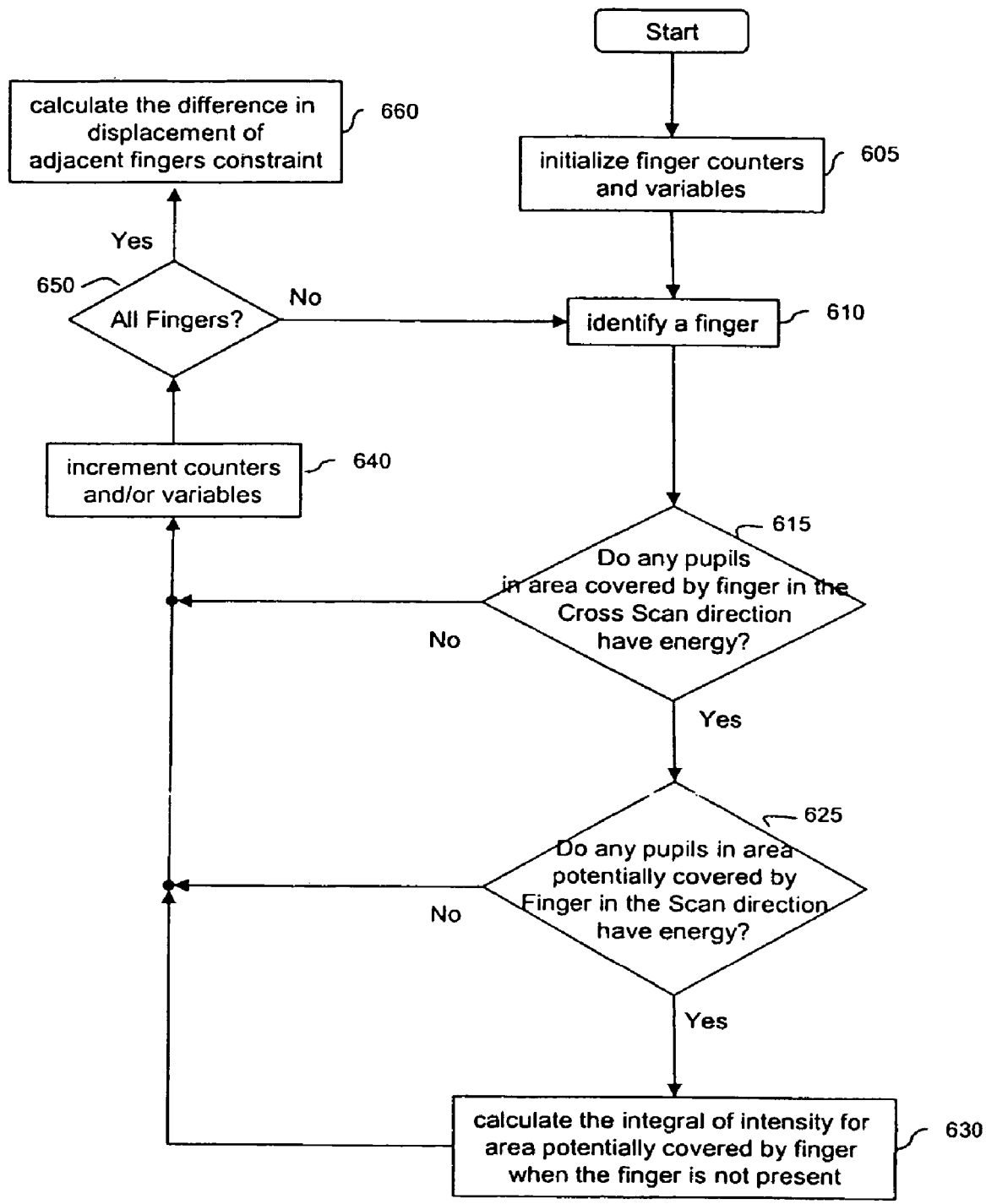

FIG. 6 depicts a flowchart of an exemplary method for determining the adjustments to one or more fingers in a correction system having a segmented configuration, according to an embodiment of the present invention.

Figure 7:
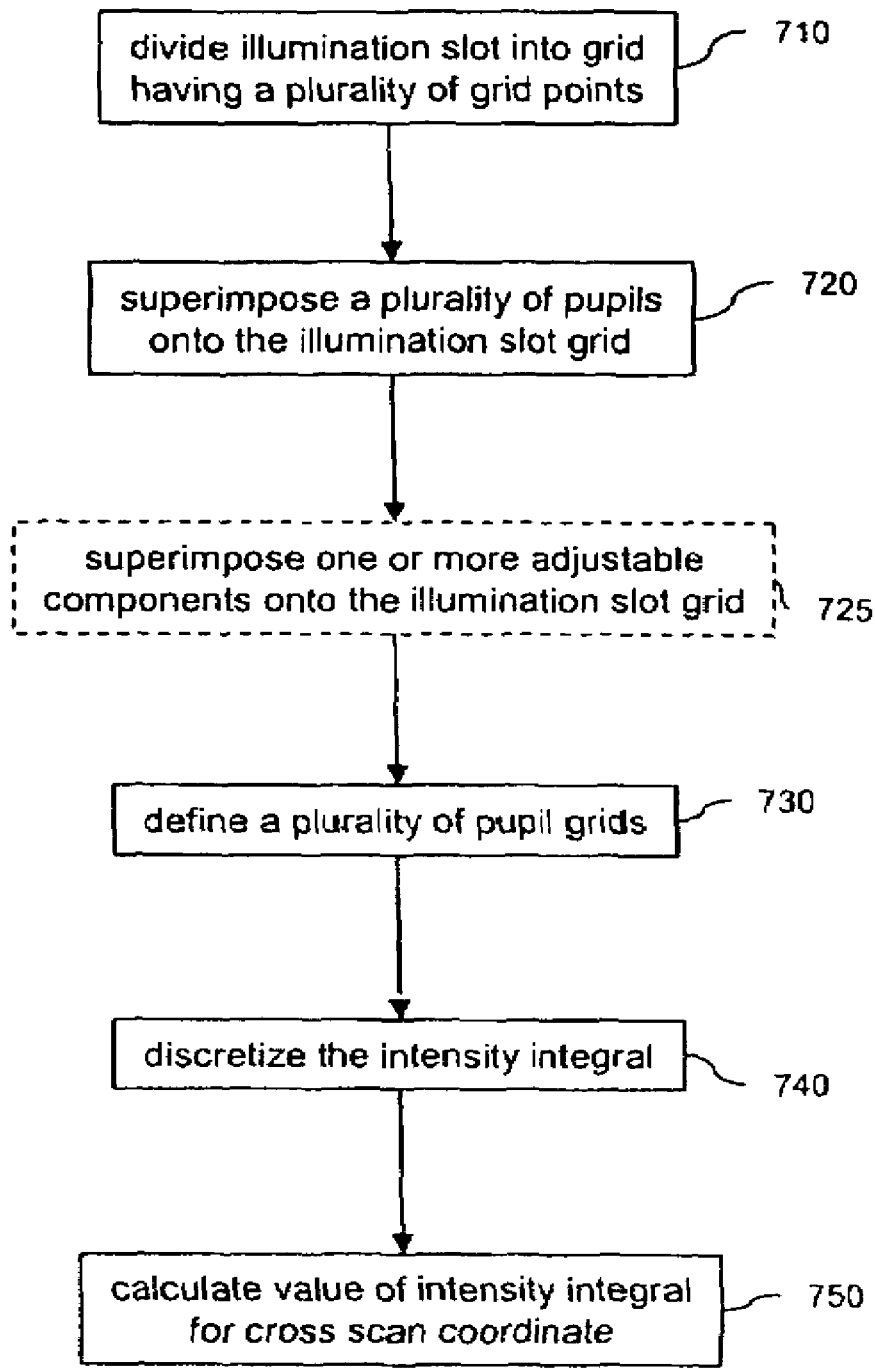

FIG. 7 depicts a flowchart of a method for calculating the integral of intensity at a cross scan coordinate, according to an embodiment of the present invention.

FIGS. 8A-D depict an analytical representation of the illumination slot at the correction system plane, according to an embodiment of the present invention.

Figure 9:
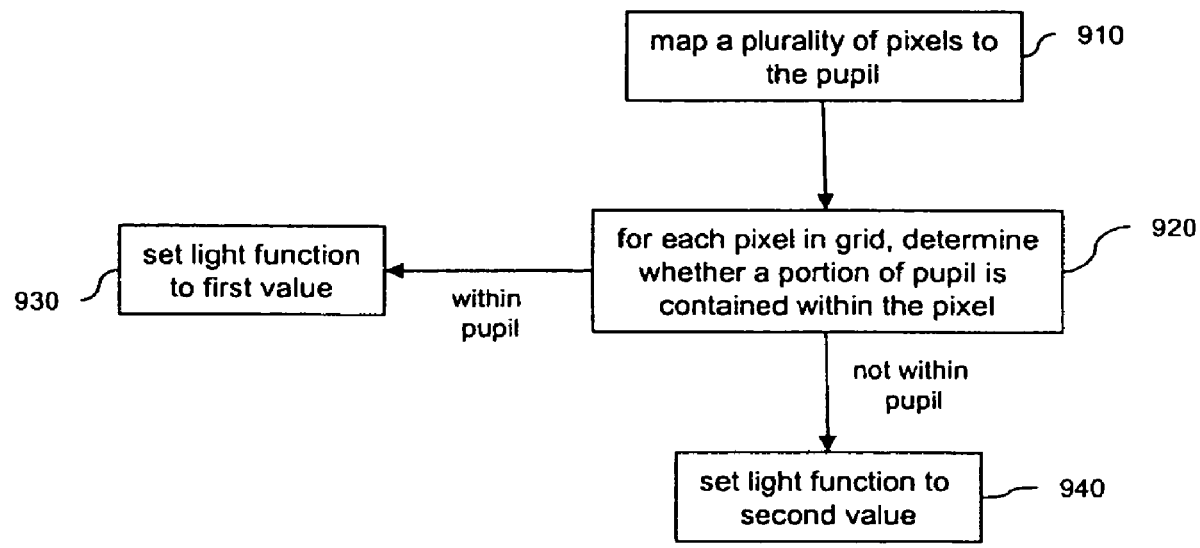

FIG. 9 depicts a flowchart of a method for calculating the light function for a "pupil", according to an embodiment of the present invention.

Figure 10:
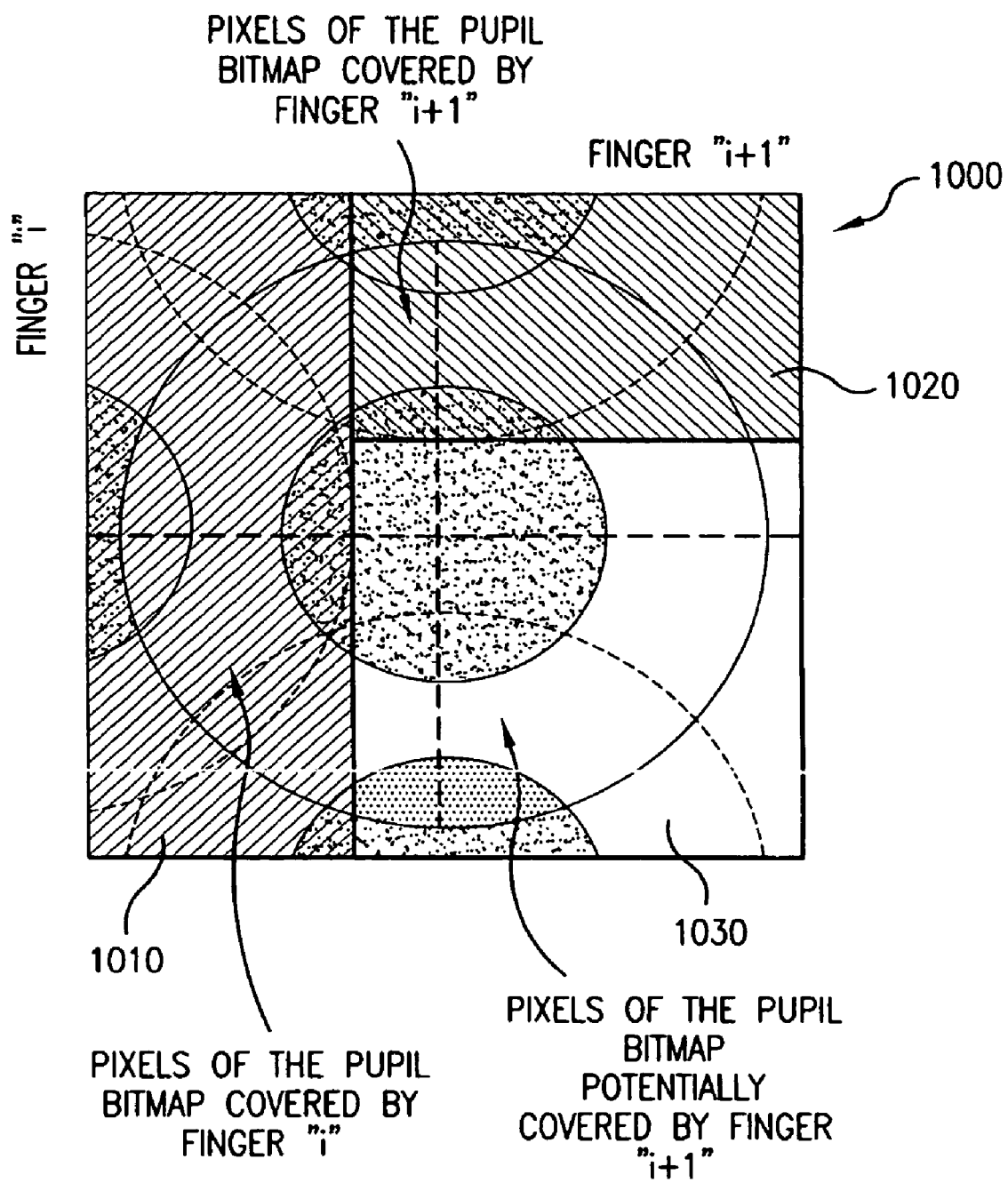

FIG. 10 is an illustration depicting components of the equation for the integral of intensity, according to an embodiment of the present invention.

Figure 11A:
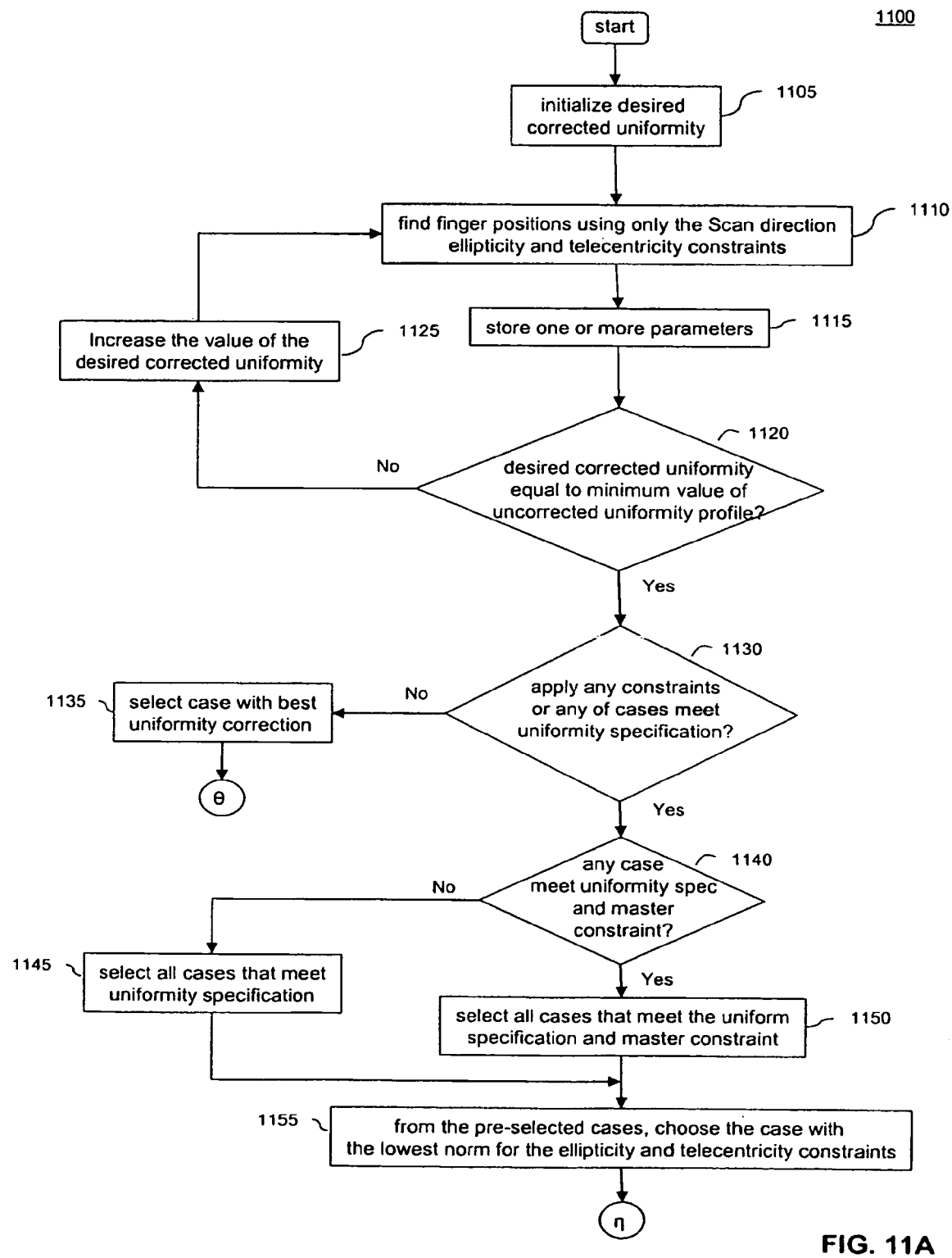

FIGS. 11A and B depict a flowchart of an exemplary method for calculating finger positions in a correction system having a double-sided configuration, according to an embodiment of the present invention.

Figure 12A:
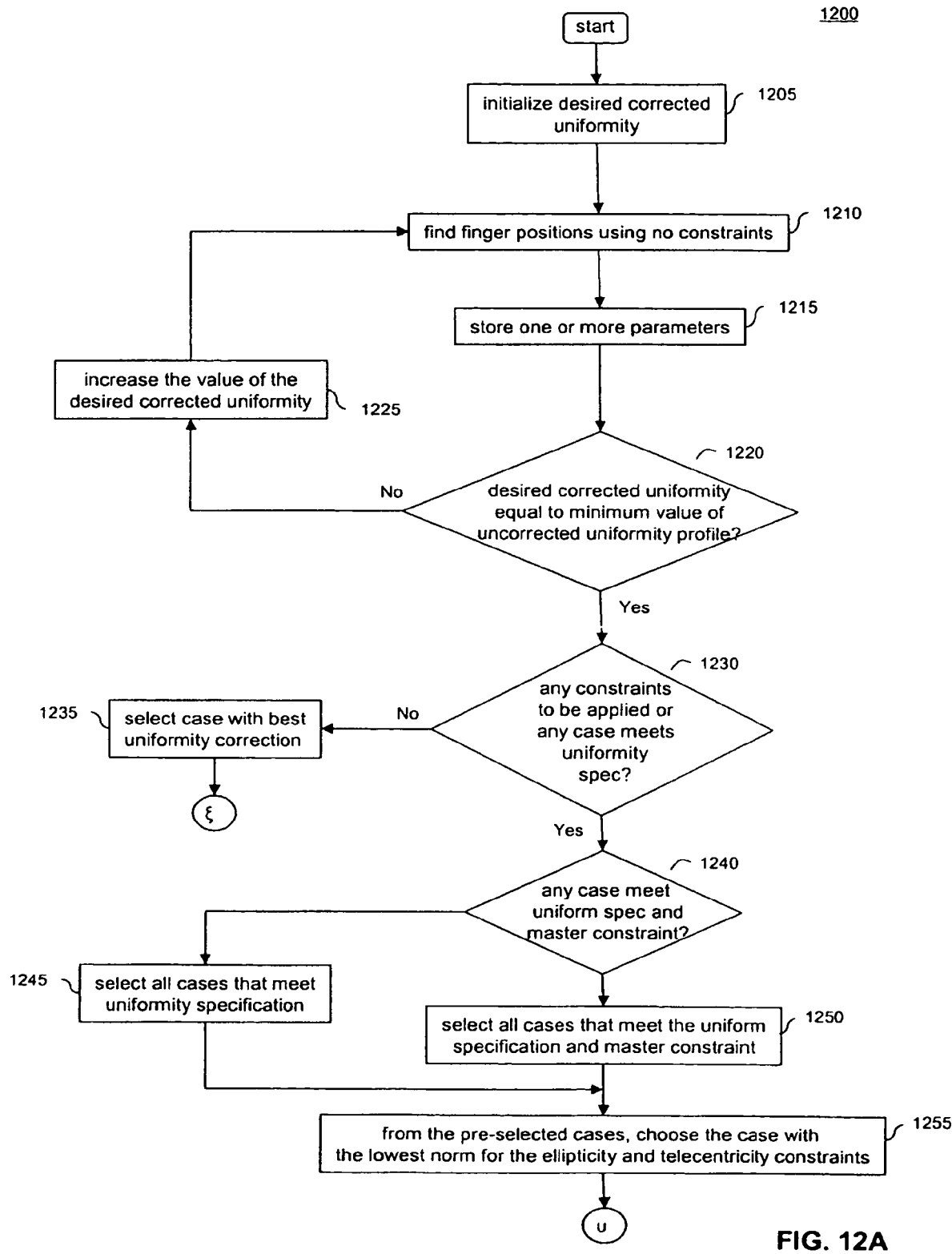

FIGS. 12A and B depict a flowchart of an exemplary method for calculating finger positions in a correction system having a segmented configuration, according to an embodiment of the present invention.

Figure 13A:
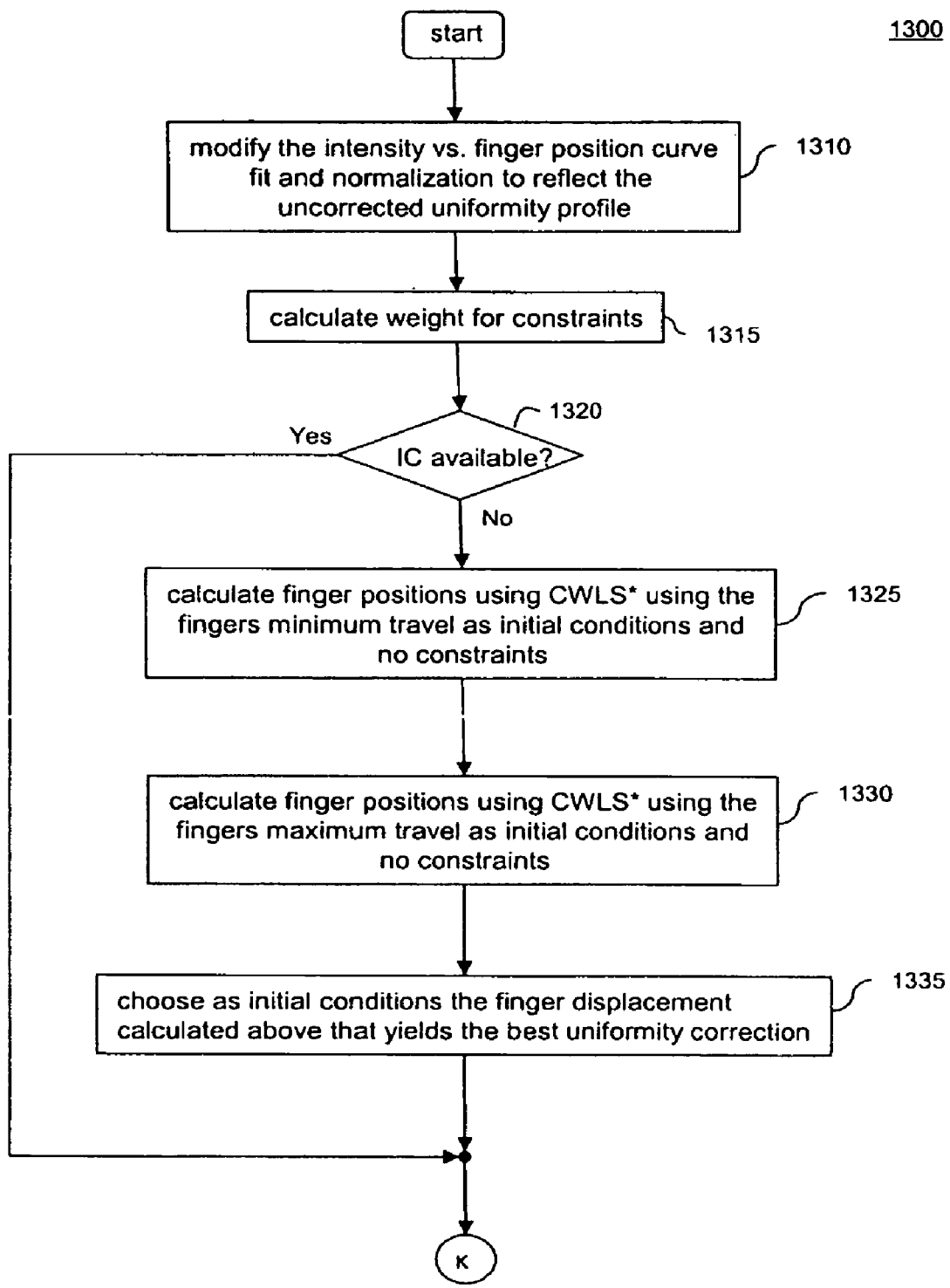
Figure 13B:
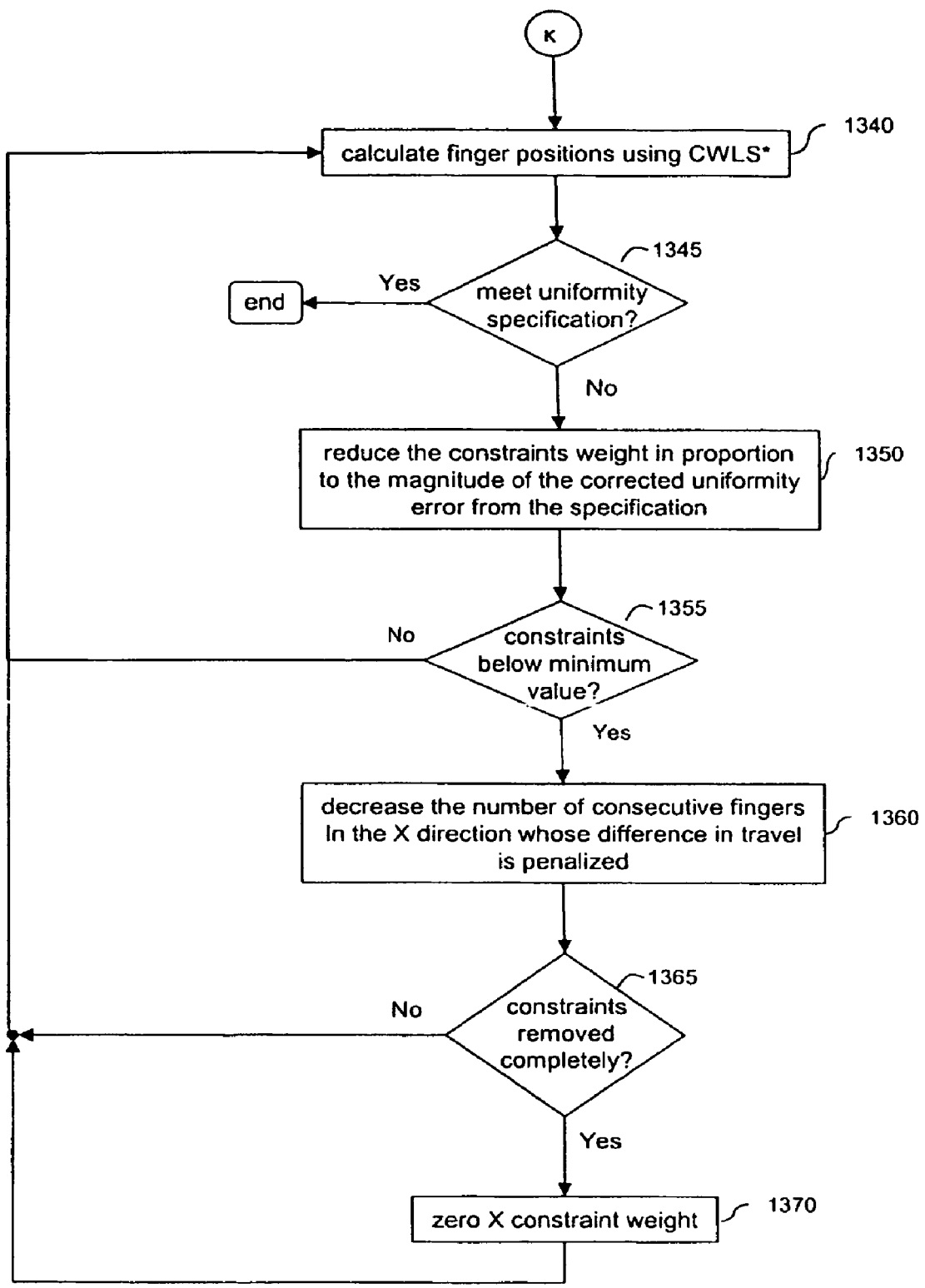

FIGS. 13A and 13B depict a flowchart of an exemplary method for calculating finger positions in a correction system having a double-sided configuration, according to an embodiment of the present invention.

Figure 14:
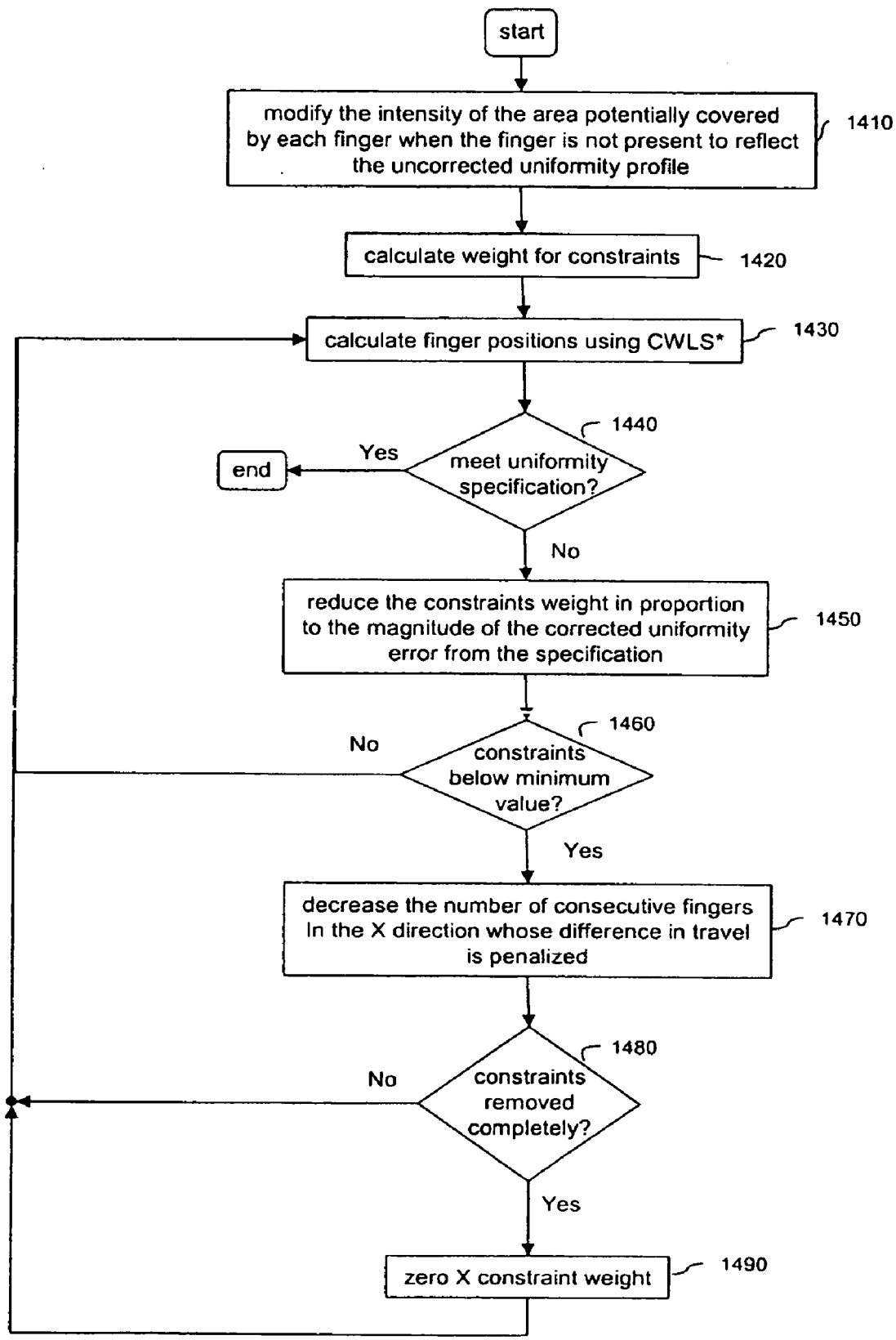
Figure 15:
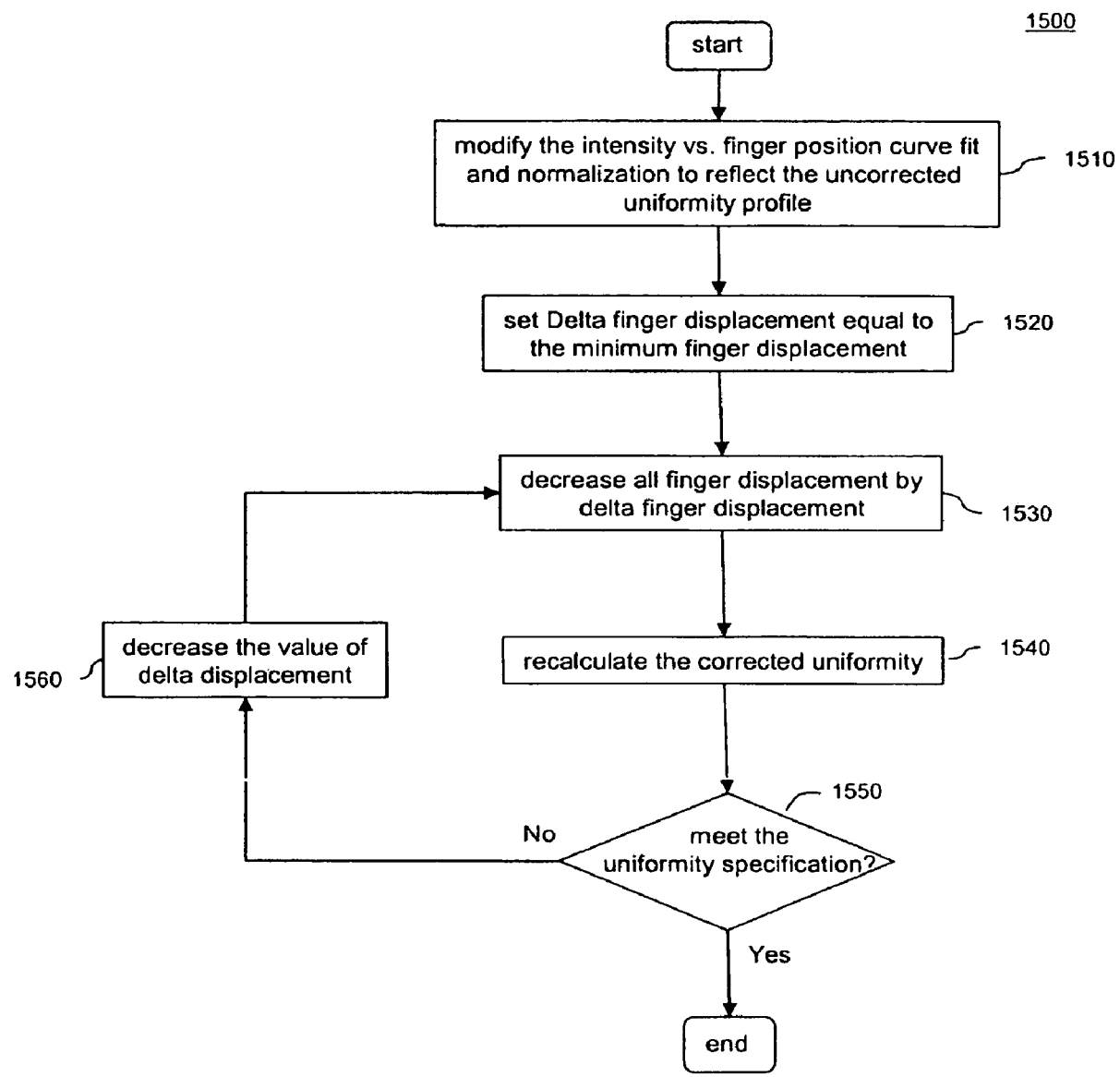

FIG. 14 depicts a flowchart of an exemplary method for calculating finger positions in a correction system having a segmented configuration, according to an embodiment of the present invention FIG. 15 depicts a flowchart of an exemplary method for light loss reduction for a correction system having a double-sided configuration, according to an embodiment of the present invention.

Figure 16:
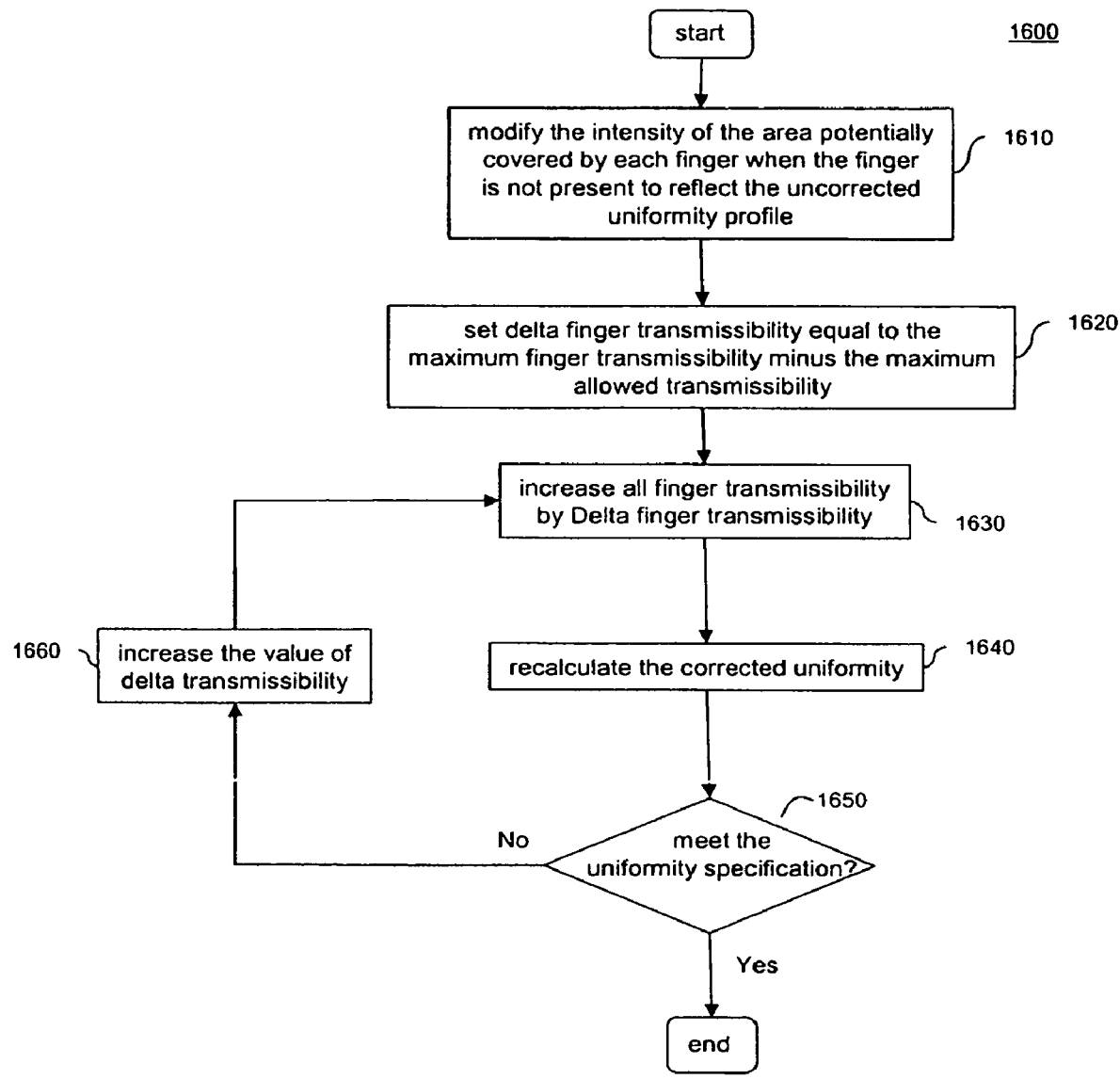
Figure 17A:
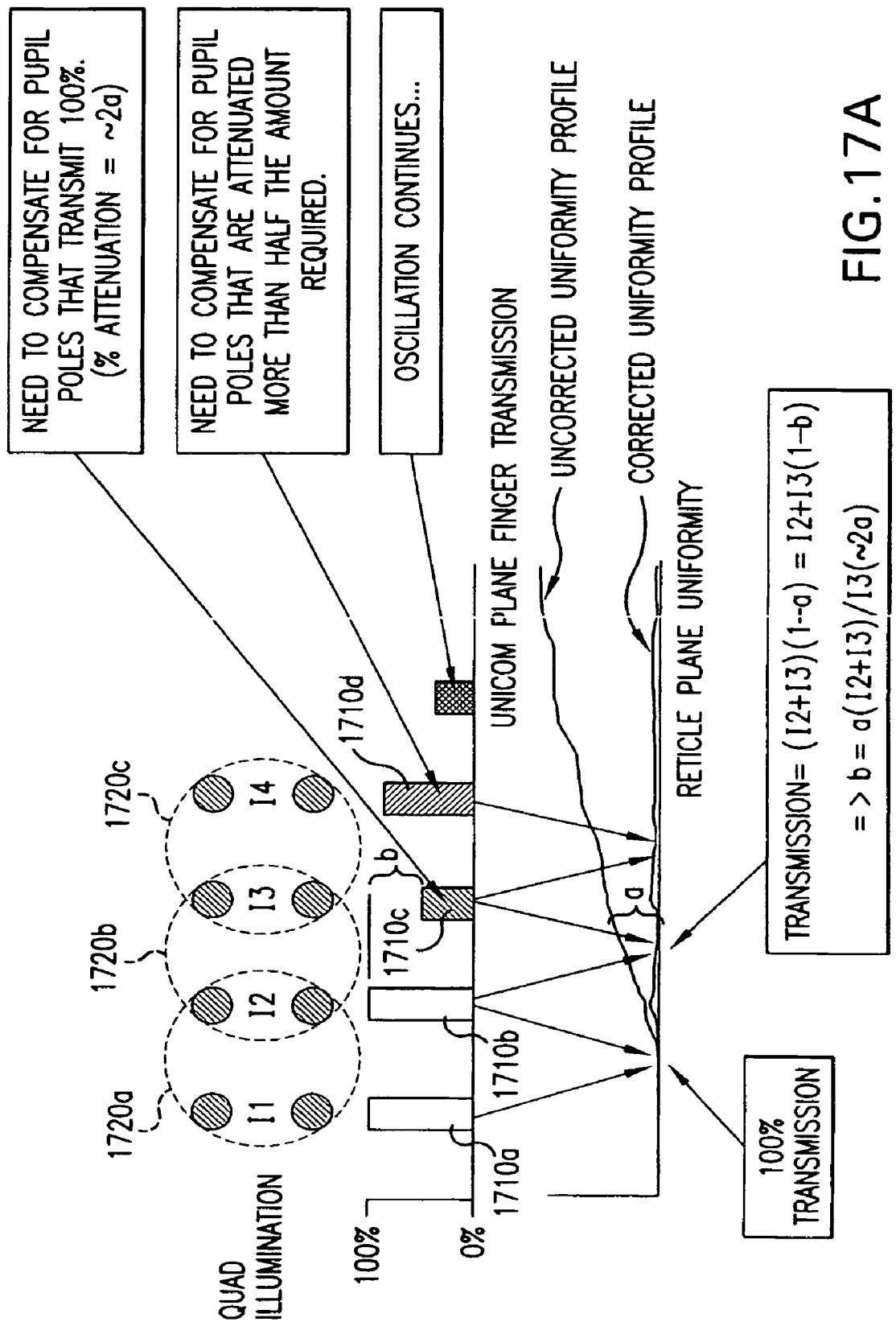

FIG. 16 depicts a flowchart of an exemplary method for light loss reduction for a correction system having a segmented configuration, according to an embodiment of the present invention FIGS. 17A and B illustrate an example of finger position or transmissibility oscillations.

FIGS. 18 A-H present exemplary pupil shape and illumination profiles for a 0.26 sigma conventional illumination pupil.

FIGS. 19A-I present exemplary pupil shape and illumination profiles for a 0.68/0.85 sigma, quazar illumination pupil.

FIGS. 20A-H present exemplary pupil shape and illumination profiles for a 0.80/0.97 sigma, quazar illumination pupil.

Figure 21:
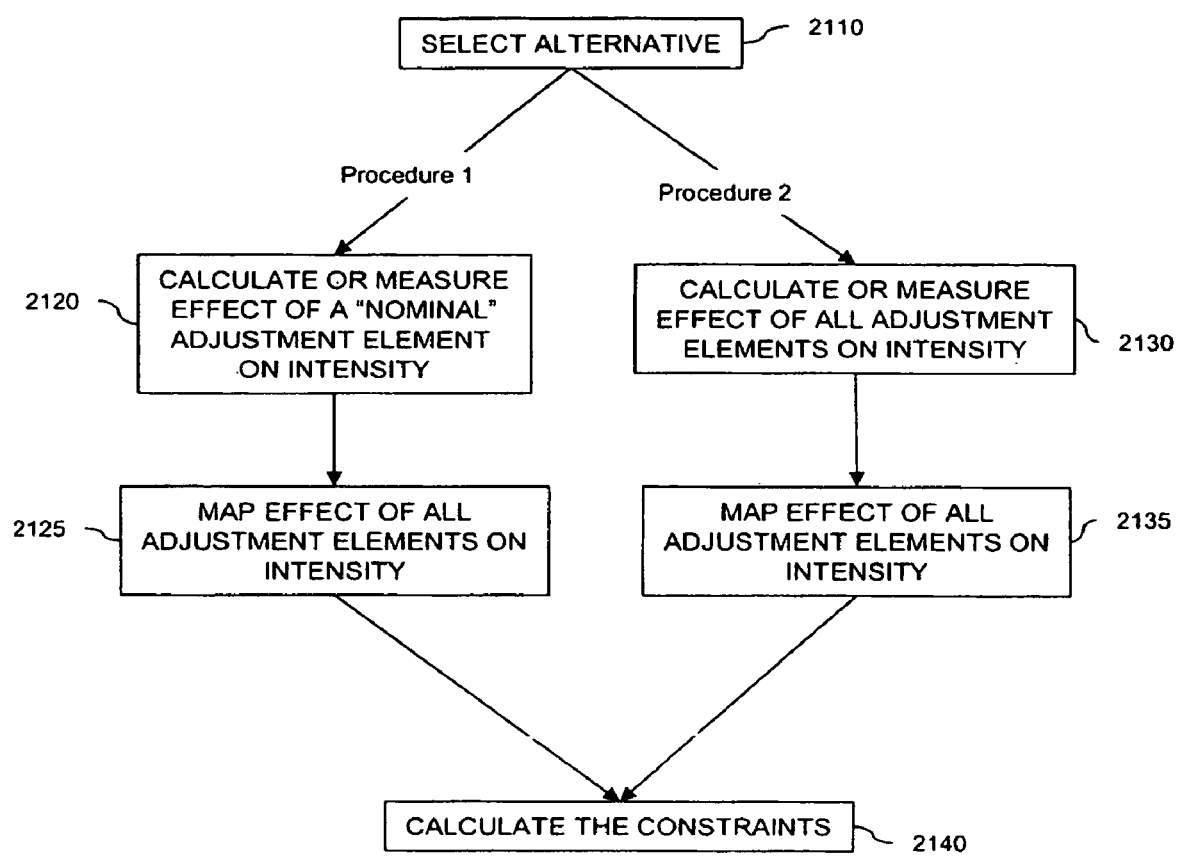

FIG. 21 depicts a flowchart of an exemplary method for adjustment of one or more adjustable components of a uniformity correction system, according to an embodiment of the present invention.

Figure 22:
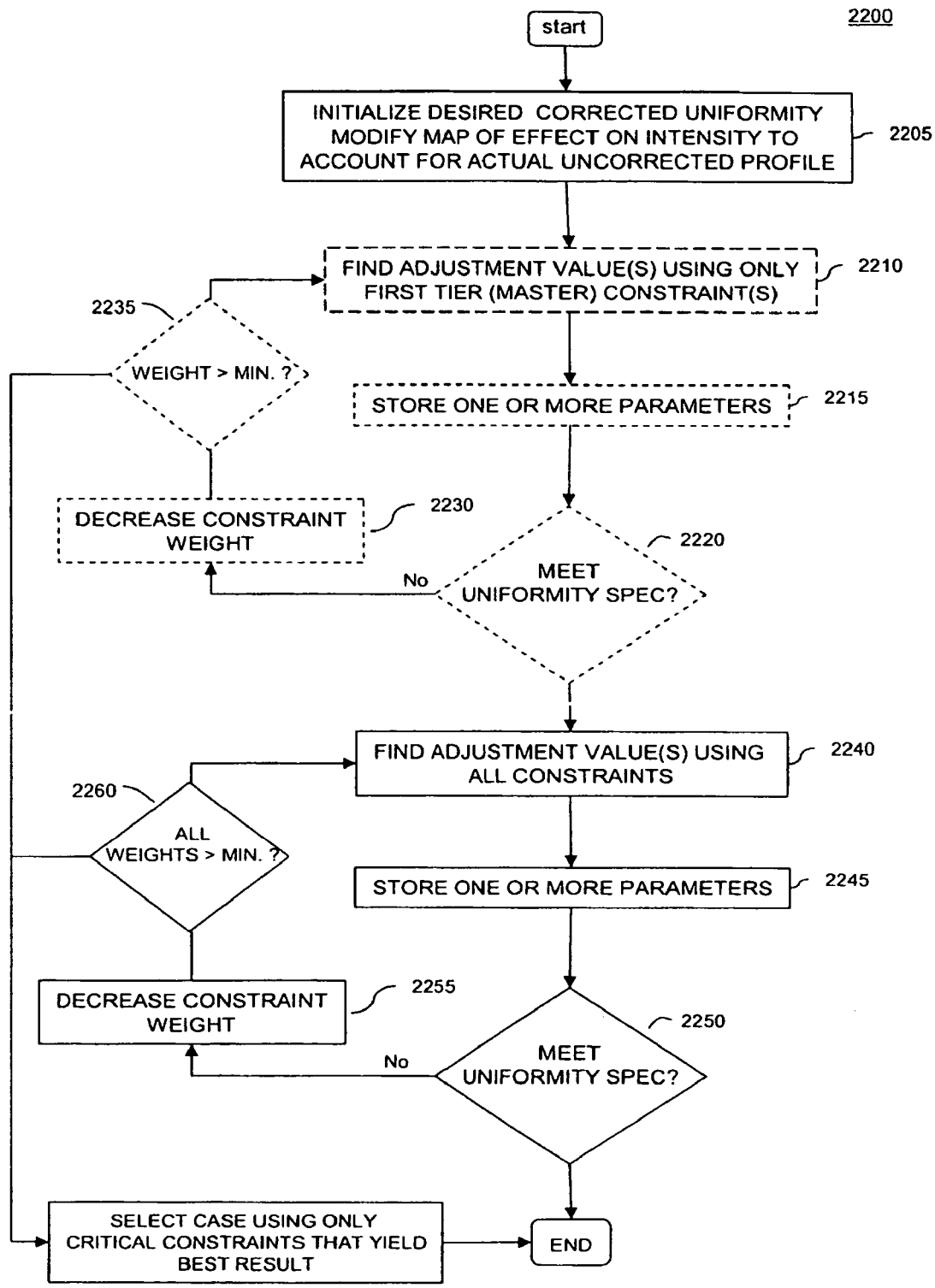

FIG. 22 depicts a flowchart of an exemplary method for optimizing the values of one or more adjustable components of a uniformity correction system, according to an embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1. Uniformity Correction System

Figure 1:
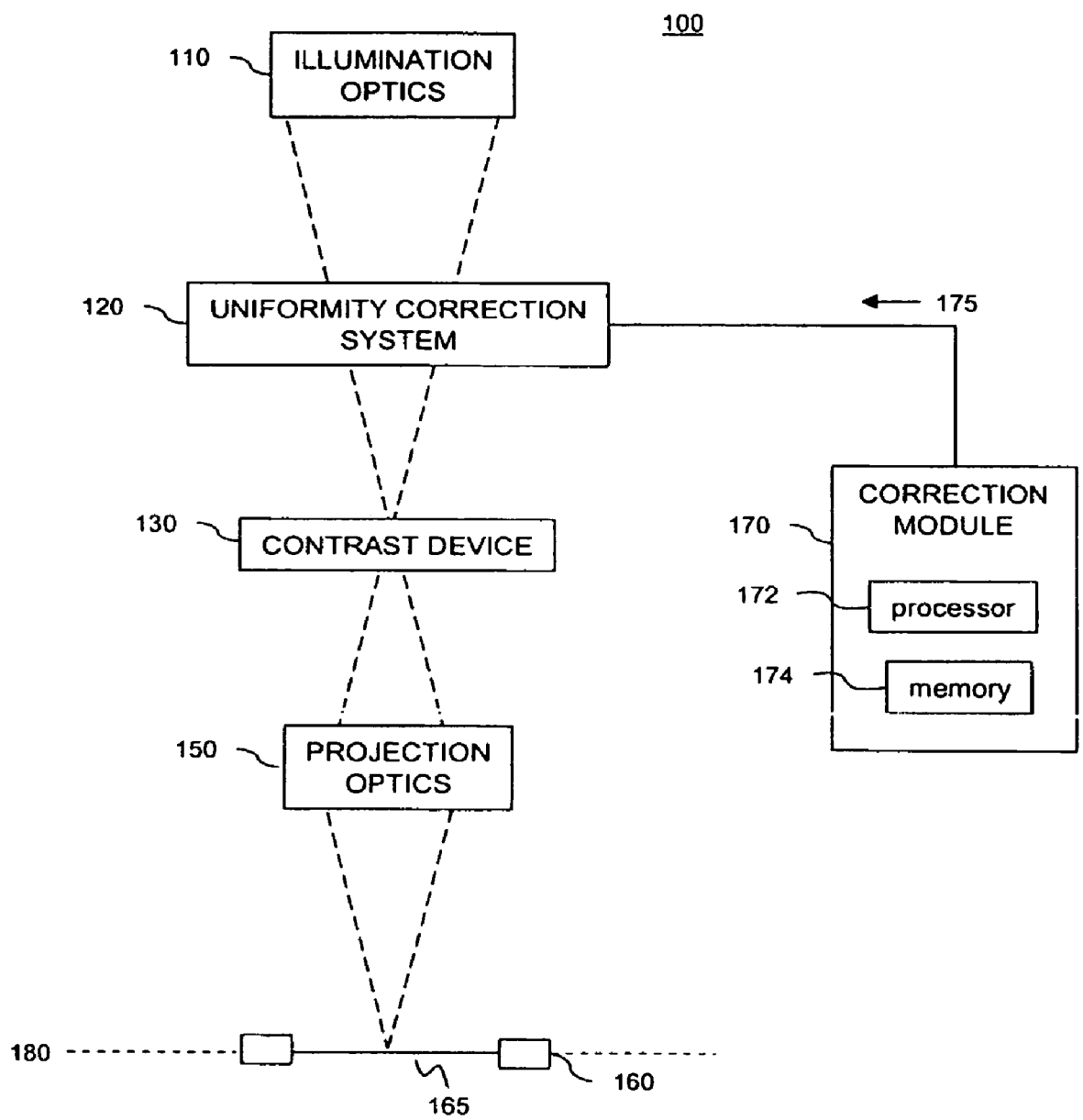
FIG. 1 illustrates an exemplary lithography system having de-focus uniformity correction, according to an embodiment of the present invention.

FIG. 1 is an illustration of an exemplary lithography system 100, according to an embodiment of the invention. In an embodiment, lithography system 100 is a system using a reticle or mask. In an alternate embodiment, system 100 is a maskless lighography system.

Lithography system 100 includes illumination optics 110, a uniformity correction system 120, a contrast device 130, projection optics 150, a substrate stage 160, and a correction module 170. Uniformity correction system 120 is a device that controls illumination levels within specific sections of illumination fields associated with system 100.

Uniformity correction system 120 is positioned between the illumination optics 110 and the contrast device stage 130 at the correction plane. In an embodiment, uniformity correction system 120 is located at a de-focus position. Thus, the correction system affects uniformity at the focus position. In an embodiment, the correction plane is located proximate to the contrast device (e.g., reticle). In alternative embodiments, the correction plane can be located at any position between illumination optics 110 and contrast device 130. Because correction system 120 is not necessarily located at the focus plane, the benefit of extended flexibility comes at the expense of unwanted effects such as telecentricity, ellipticity, and dose quantization effects. In addition, a higher light loss may be required in order to achieve the desired uniformity correction and minimize undesired effects.

Uniformity correction system 120 is a device that has one or more variables and/or degrees of freedom (also referred to as adjustable components) that can be adjusted to affect transmission.

In an embodiment, uniformity correction system 120 includes multiple correction elements having a defined configuration. These correction elements can be moved, tilted, and/or rotated. FIGS. 2A-2D and 3 show exemplary configurations of moveable correction elements for use in correction system 120, according to embodiments of the present invention. As would be appreciated by persons of skill in the art, other configurations can be used with the present invention.

FIGS. 2A-D depict correction systems having a double-sided configuration of correction elements. The double-sided configuration consists of a set of correction elements that are inserted into the illumination slot in order to change the intensity of light in the area that they cover. Several variations on the double-sided configuration are possible. For example, the correction elements can be staggered or rotated. In addition, the correction elements can have a pattern. In an embodiment, a correction element can have a transmission in the range from 100% to 0%. A correction element may also have a transmission that varies according to a function. In an embodiment, correction elements are plate "fingers" made of glass or similar transmissive material. In an alternative embodiment, correction elements are comprised of metal (e.g., metal brushes).

Figure 2A:
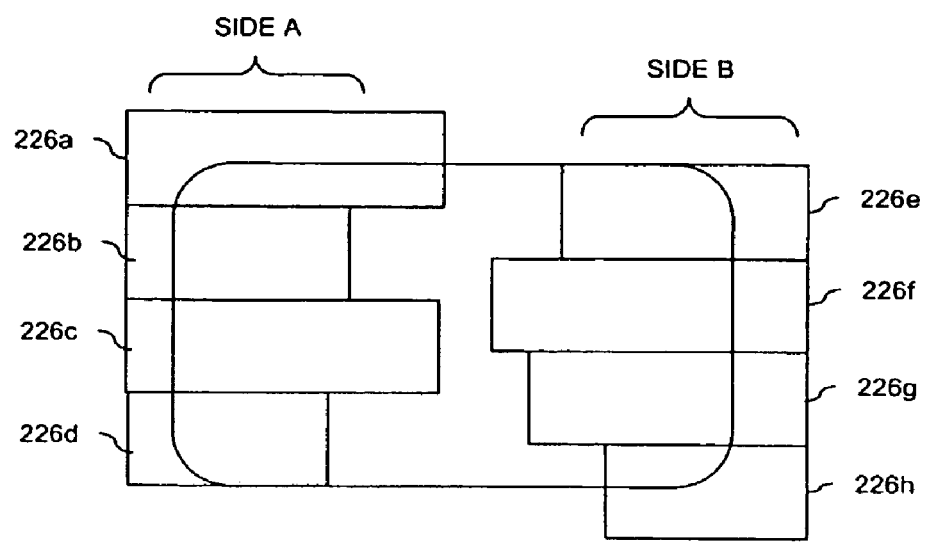
FIGS. 2A-2D depict exemplary double-sided configurations of a correction system, according to an embodiment of the present invention.

FIG. 2A depicts an exemplary double-sided staggered configuration. The double-sided staggered configuration includes a plurality of correction elements 226a-d on side A of the illumination slot and a plurality of correction elements 226e-h on side B of the illumination slot. Adjacent correction elements are located on the same side of the illumination slot. For example, correction elements 226a-d are adjacent and correction elements 226e-h are adjacent. Every correction element on each side of the illumination slot has two or more opposing correction elements. Opposing correction elements have overlapping x coordinates but are inserted into the illumination slot from opposite sides in the y direction.

Figure 2B:
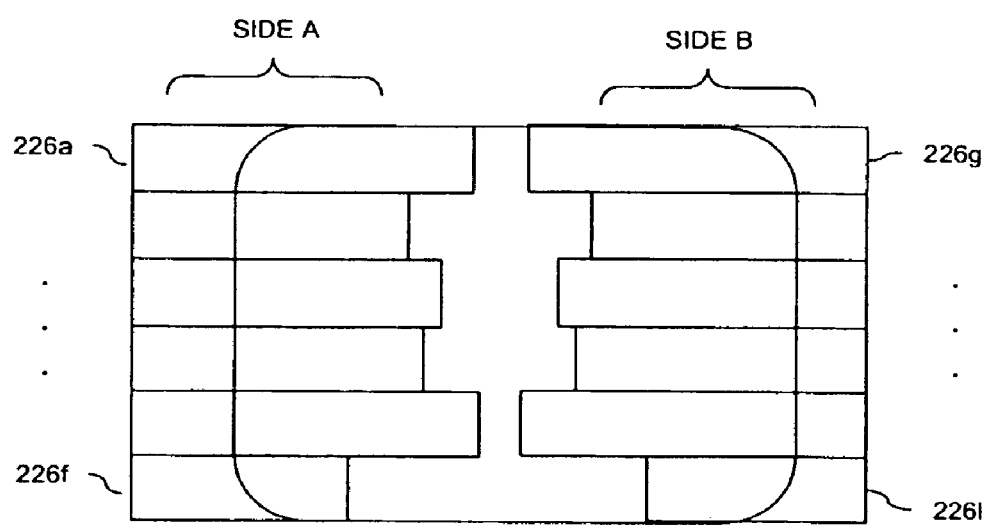

FIG. 2B depicts an exemplary double-sided non-staggered configuration. The non-staggered configuration also includes a plurality of correction elements 226a-f on side A of the illumination slot and a plurality of correction elements 226g-l on side B of the illumination slot. In the non-staggered configuration, correction elements on each side of the illumination slot are directly opposed to each other. In this configuration, opposing correction elements cover the same set of x coordinates but are inserted into the illumination slot from opposite sides in the y direction.

Figure 2C:
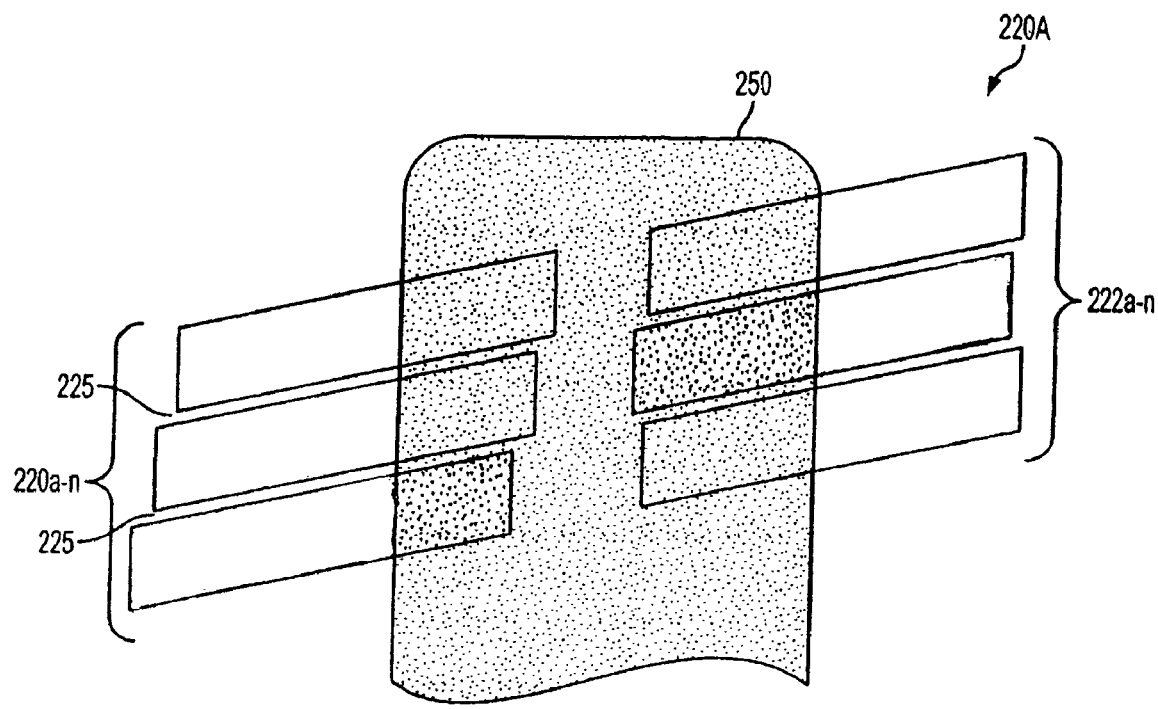

FIG. 2C depicts an exemplary titled configuration of correction elements. In this configuration, multiple correction elements 226a-n are inserted from side A of the illumination slot at an angle a with respect to the scan direction (or Y-axis). Multiple correction elements 226m-z are inserted from the opposite side (side B) of the illumination slot at an angle −α with respect to the scan direction (or Y-axis). In an embodiment, the maximum insertion of correction elements 226a-n and 226m-z is to a neutral point. That is, each correction element can be inserted any amount up to a point at which the tip of a correction element 226a-n is proximate to the tip of a correction element 226m-z. In this embodiment, correction elements 226a-n do not overlap correction elements 226m-z.

Figure 2D:
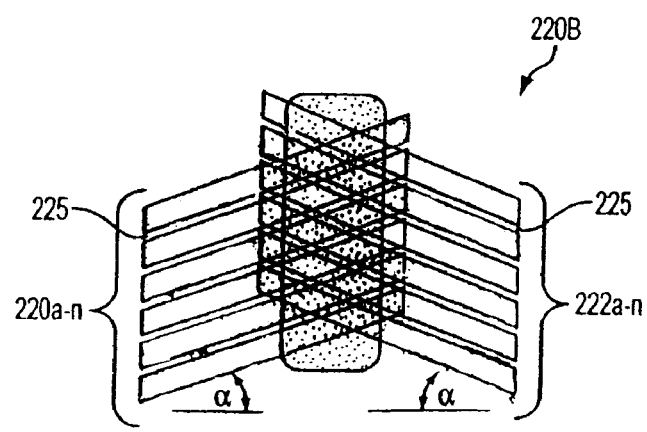

FIG. 2D depicts an exemplary chevron configuration of correction elements. In this configuration, multiple correction elements 226a-n are inserted from side A of the illumination slot at an angle a with respect to the scan direction (or Y-axis). Multiple correction elements 226m-z are inserted from the opposite side (side B) of the illumination slot at the same angle, α, with respect to the scan direction (or Y-axis). In this configuration, correction elements 226a-n and 226m-z can be inserted to a depth such that correction elements overlap. In this embodiment, each correction element can be inserted any amount up to a maximum insertion point.

Figure 3:
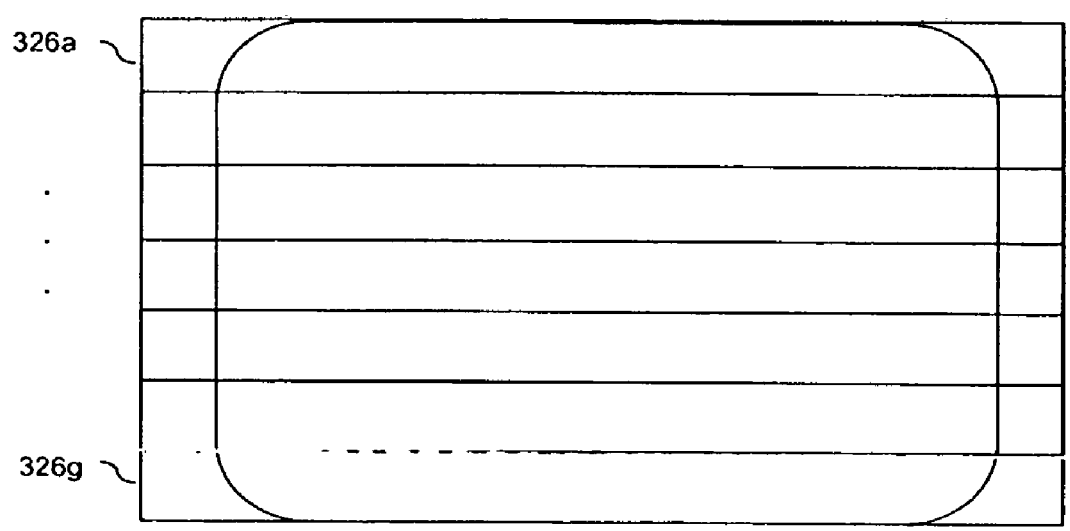
FIG. 3 depicts an exemplary segmented configuration of a correction system, according to an embodiment of the present invention.

FIG. 3 depicts an exemplary segmented configuration. The segmented configuration includes a plurality of correction elements 326a-g. In an embodiment of the segmented configuration, a correction element includes a plurality of overlapping plates (e.g., slid one on top of the other). The relative position of these plates determines the transmissibility of the correction element and thus, provides uniform attenuation over all points covered by the finger. In an embodiment, the plates can be glass or similar material. In an alternate embodiment, correction elements 326 can be rotated or louvered.

In an embodiment, a plate can have a transmission that varies from a first transmission at one end to a second transmission on the opposite end. For example, a plate can go from 100% transmission at one end to a 0% transmission on the opposite end according to a profile. Any profile could be used including linear or quadratic. The net transmission of a correction element having a plurality of overlapping plates is basically the average of the profiles of the plates. By sliding plates deeper into the slot or out of the slot, the transmission for the correction element is altered.

Although FIGS. 2A-D and 3 depict a correction system having a plurality of discrete correction elements, the invention is not limited to these embodiments. As would be appreciated by a person of skill in the art, any uniformity correction device having one or more adjustable variables or degrees of freedom could be used with the present invention.

Returning to FIG. 1, contrast device 130 is used to image a pattern onto a portion of a substrate 165 (e.g., wafer or glass plate) held by substrate stage 160. In a first embodiment, contrast device 135 is a static mask such as a reticle and substrate 165 is a wafer. In a second maskless embodiment, contrast device 135 is a programmable array. The programmable array may include a spatial light modulator (SLM) or some other suitable micro-mirror array. Alternatively, the SLM can comprise a reflective or transmissive liquid crystal display (LCD) or a grading light value (GLV). In the second embodiment, substrate 165 may be a piece of glass, flat panel display, or similar.

Projection optics 150 are configured to project an image of the pattern (defined by the contrast device) on the substrate. The details of projection optics 150 are dependent upon the type of lithography system. Specific functional details of projection optics are well known to those skilled in the art and need not be further explained herein.

Substrate stage 160 is located at the image plane 180. Substrate 160 supports a substrate 165. When a substrate is not present, a detection system is placed in the image plane 180. The detection system detects (or measures) the uniformity profile at the image plane and communicates the measured profile or profiles to the correction module 170.

Correction module 170 is configured to determine adjustments to the variables and/or degrees of freedom of correction system 120 such that the desired uniformity specification is met. Correction module 170 determines one or more correction parameters 175 based on the determined adjustments and communicates these parameters to correction system 120. The correction parameters control adjustable variables and/or degrees of freedom within correction system 120.

Through manipulation of the adjustable variables and/or degrees of freedom of correction system 120 in accordance with the correction parameters, characteristics of the illumination beam are changed. More specifically, the correction parameters provide details on how to adjust the variables and/or degrees of freedom of correction system 120 to achieve the desired uniformity profile (e.g., flattest uniformity or shape beneficial for the lithography process).

Correction module 170 includes one or more processors 172 and memory 174. One or more processors 172 execute software implementing the operations described in Section 2, below. Memory 174 includes a main memory (e.g., a random access memory (RAM)). In an embodiment, memory 174 also includes a secondary memory. Secondary memory can include, for example, a hard disk drive and/or a removable storage drive.

Computer programs are stored in memory 174. Such computer programs, when executed, enable processor 172 in correction module 170 to perform the features of the present invention, as discussed herein.

In an embodiment, where the invention is implemented using software, the software can be stored in a computer program product and loaded into correction module 170 using a removable storage drive, a hard drive, or a communications interface. Alternatively, the computer program product can be downloaded to correction module 170 via a communications path.

In addition, in an embodiment, the correction module 170 is coupled to one or more remote processors. The correction module 170 can then receive instructions and/or operating parameters remotely.

2. Method for Uniformity Correction

Figure 4:
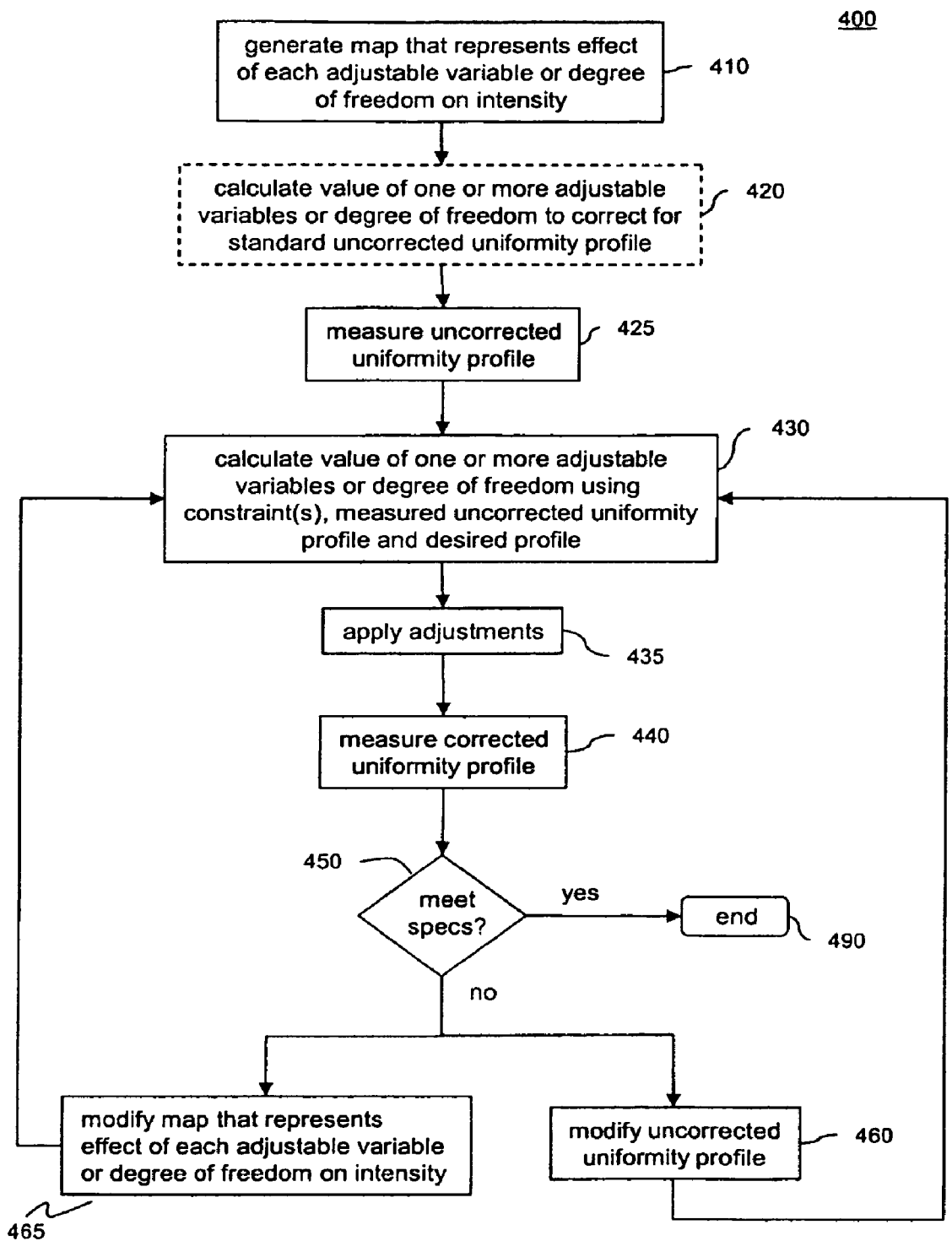
FIG. 4 depicts a flowchart of a method for determining the value for one or more adjustment component of a uniformity correction system, according to an embodiment of the present invention.

FIG. 4 depicts a flowchart of a method 400 for determining adjustments to one or more variables or degrees of freedom of correction system 120 such that the uniformity specification is met, according to an embodiment of the invention. Method 400 begins in step 410 when a map is generated that represents the effect of each adjustable variable and/or degree of freedom on the intensity. For example, if correction system includes a plurality of correction elements moveable within the illumination slot, correction element insertion versus intensity or attenuation over a range of cross scan coordinates could be mapped. Because step 410 is independent of the uncorrected uniformity profile, it can be performed off-line, even prior to the initialization of the lithography tool.

In step 420, the value of one or more adjustable variable or degree of freedom of the correction system is calculated in order to correct for the "standard uncorrected uniformity profile." This step is optional. When present, this step provides robust initial conditions for real-time operation. Adjustments in later steps are then calculated using the standard uncorrected uniformity profile as a base. For example, the uncorrected, open slot uniformity profile for a group of the same type of tools is measured and the average profile is determined. The average profile can then be used to calculate finger positions in real-time. The use of the average profiles can allow the system to make corrections faster.

In step 425, the uncorrected uniformity profile is measured. In an embodiment, the uncorrected uniformity profile is measured by placing a detector at the image plane 180.

In step 430, the value of one or more adjustable variable and/or degree of freedom of the uniformity correction system is calculated. To determine adjustment values, the system uses one or more constraints, the measured uncorrected uniformity profile, and the desired profile. Step 430 is described in more detail in section 2.1.2.

One or more constraints are designed to compensate for "pupil" effects. A "pupil" effect is anything that distorts the image distribution in a "pupil" such that imaging performance is affected. Typical "pupil" effects include telecentricity and ellipticity. Telecentricity is concerned with image motion while ellipticity is concerned with H-V bias. As would be appreciated by persons of skill in the art, the correction system of the present invention can address other "pupil" effects.

In step 435, the desired adjustments determined in step 430 are applied to the uniformity correction system. In an embodiment, correction module 170 communicates the adjustments to correction system 120 as one or more correction parameters. The uniformity correction system then makes adjustments to the variables and/or degrees of freedom, based on the received correction parameters.

In step 440, the corrected uniformity profile is measured. This step is optional. In an embodiment, the corrected uniformity profile is measured by placing a detector at the image plane 180.

In step 450, a determination is made whether the measured corrected uniformity profile meets the defined specifications. This step is optional. If the measured corrected uniformity profile meets the defined specifications, operation proceeds to step 490. If the measured uniformity profile does not meet the defined specifications, operation proceeds to step 460 if option 1 is indicated and to step 465 if option 2 is indicated.

In step 460, the uncorrected uniformity profile is modified. This step is optional. If present, operation then returns to step 430. A more detailed description of an exemplary modification of the uncorrected uniformity is provided in section 2.7.

In step 465, the map that represents the effect of each adjustable component on intensity is modified. This step is optional. If present, operation then returns to step 430.

In step 490, the process ends.

2.1 Map Generation

FIG. 21 depicts a flowchart of a method 2100 for generation of the map that represents the effect of each adjustable component on intensity (step 410), according to an embodiment of the present invention. Method 2100 begins at step 2110 when the procedure for map generation is selected. If procedure 1 is selected, operation proceeds to step 2120. If procedure 2 is selected, operation proceeds to step 2130. In an embodiment, correction module 170 supports both procedures and the selection is configurable. In an alternate embodiment, correction module 170 supports only one procedure.

In step 2120, the effect of a nominal adjustment element on intensity is calculated or measured.

In step 2125, a map of the effect of all adjustable elements on intensity based on the results of step 2120 and the actual element position is generated. In an embodiment, the map generated can be a set of polynomial coefficients, a table, or similar. Operation then proceeds to step 2140.

In step 2130, the effect of all adjustable elements on intensity is calculated or measured. A map is then generated based on this step. In an embodiment, the map generated can be a set of polynomial coefficients, a table, or similar. Operation then proceeds to step 2140.

In step 2140, one or more constraints are calculated. The constraints are described in further detail in Section 2.4.

2.1.1 Examples of Configuration/Map Generation

The following sections provide a more detailed description of step 410 for correction systems using correction elements moveable within an illumination slot. In these examples, in step 410, the correction module calculates how every correction element affects uniformity independent of the uncorrected uniformity profile. In order to perform calibration of the correction element, the system uses a mapping of a "pupil" onto a "pupil" grid, referred to as a "pupil" bit map, the coordinates of the illumination slot grid, and finger location in the slot. "Pupil", as used herein, refers to the footprint of a bundle of rays at the correction plane.

This bundle of rays converges to a point in the image plane. There are no optics between this point of convergence and the correction plane.

A more detailed description of correction element calibration for a double-sided configurations, without tilt, such as depicted in FIGS. 2A and 2B is provided in section 2.1.1.1. A more detailed description of correction element calibration for a segmented configuration such as depicted in FIG. 3 is provided in section 2.1.1.2.

2.1.1.1 Double-Sided Configurations

FIGS. 5A, 5B, and 5C depict a flowchart of a method 500 for calibrating fingers in correction system 120 having a double-sided configuration, without tilt, according to an embodiment of the invention. For ease of description, FIG. 5 is described with continued reference to the embodiment shown in FIGS. 2A and 2B.

For double-sided configurations, method 500 requires the calculation of the integral of the intensity at all cross scan coordinates influenced by the finger for several values of $\Delta F$ (finger displacement) and the fitting of a curve to the normalized calculated data. Method 500 begins at step 505 when counters and variables are initialized. In an embodiment, the system uses a finger counter and an optional finger side counter. The finger counter identifies the finger 226 involved in the calibration. The finger side counter identifies the side (e.g., side A or side B) where the finger is located. Note that other variables and/or counters or combination of variables and/or counters could be used.

In step 510, one of the fingers 226 is identified. In an embodiment, the finger is associated with the finger counter value. For example, finger 226a of FIG. 2A may correspond to finger 1. When finger counter value is equal or equivalent to 1, finger 226a is identified in step 510.

Figure 8A:
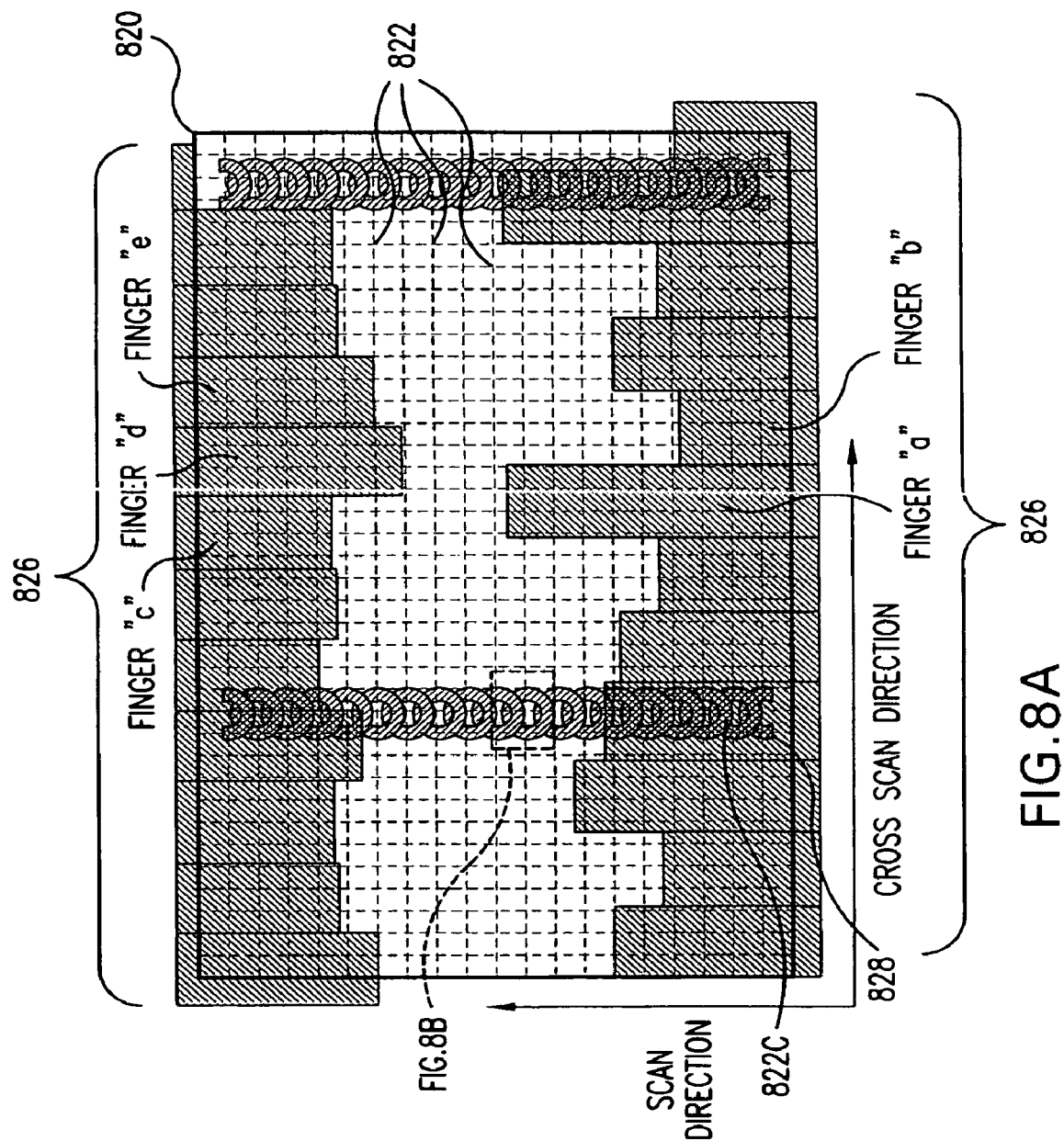

In step 515, a determination is made whether any pupils covered by the identified finger in the cross scan direction contain energy. FIG. 8A illustrates the cross scan direction of the illumination grid (e.g., the x-direction). If any pupils in the cross scan direction contain energy, operation proceeds to step 520. If pupils in area covered by the identified finger in the cross scan direction are empty (i.e., do not contain energy), operation proceeds to step 560.

In step 520, a determination is made whether any pupils in the area potentially covered by the finger in the scan direction contain energy. FIG. 5A illustrates the scan direction of the illumination grid (e.g., the y-direction). If pupils potentially covered by the finger in the scan direction contain energy, operation proceeds to step 525. If pupils potentially covered by the finger in the scan direction are empty, operation proceeds to step 560.

In step 525, the integral of the intensity for the area potentially covered by the finger when the finger is not present is calculated. This is equivalent to calculating the integral of intensity unmodified by a finger. A method for calculating the intensity integral unmodified by a set of fingers is described in more detail in section 2.2.

In step 530, the displacement of the finger is set to zero.

In step 535, the integral of the intensity at each cross scan coordinate covered by the finger when the finger is at the desired displacement is calculated. For example, as shown in FIG. 8C, finger "i" is at a displacement X. At displacement X, finger "i" 826 covers coordinates $A_{2,19}$ through $A_{4,19}$, $A_{2,18}$ through $A_{4,18}$, $A_{2,17}$ through $A_{4,17}$, and $A_{2,16}$ through $A_{4,16}$. A method for calculating the integral of the intensity is described in more detail in section 2.2.

In step 540, the displacement of the finger is increased. In an embodiment, the value for the increase is configurable by a user.

In step 545, a determination is made whether the finger is at its maximum position. If the finger is at its maximum position, operation proceeds to step 550. If the finger is not at its maximum position, operation returns to step 535. Steps 535-545 are repeated until the increase in displacement causes the finger to reach its maximum position. In an embodiment, the opposite curve is used.

In step 550, the integral of the intensity is normalized to 1 when the no pupils in the area covered by finger contain energy.

In step 555, a mapping of the normalized intensity versus finger displacement data is generated. In an embodiment, the mapping is to a polynomial of order "M." In an alternate embodiment, the mapping is to a table. As would be appreciated by persons of skill in the art, other mappings could be used with the present invention.

In step 560, the counters and/or variables are incremented (or decremented). In an embodiment, the finger counter value is incremented by a predetermined value to identify a different finger. (e.g., finger counter value incremented by 1). Alternatively, the finger counter value could have been initialized to a maximum value (e.g., 100). In this step, the finger counter value could be decremented by a predetermined value to identify a different finger.

In step 565, a determination is made whether all fingers in the configuration have been considered. If all fingers have not been considered, operation returns to step 510. If all fingers have been considered, operation proceeds to step 570. Note that one or more of steps 810 through 865 are repeated for each finger present in the double-sided configuration being analyzed.

In step 570, the difference in displacement (transmissibility) of adjacent fingers constraint is calculated. The calculation of the transmissibility of adjacent fingers constraint is described in more detail in section 2.4.1.1.2. In an embodiment, the constraint is represented as a matrix. Alternatively, the constraint is represented as a polynomial. As would be appreciated by persons of skill in the art, other forms for the constraint could be used with the present invention.

In step 575, the difference in travel of opposing fingers constraint is calculated. In an embodiment, the constraint is a matrix. The calculation of the difference in travel of opposing fingers constraint is described in more detail in section 2.4.1.1.4.

2.1.1.2 Segmented Configuration

FIG. 6 depicts a flowchart of a method 800 for calibrating the fingers in correction system 120 having a segmented configuration of correction elements, according to an embodiment of the invention. For ease of description, FIG. 6 is described with continued reference to the embodiment shown in FIG. 3. However, FIG. 6 is not limited to those embodiments.

For segmented configurations, method 600 involves the calculation of the integral of intensity assuming maximum finger transmissibility for each finger that covers a set of pupils. Method 600 begins at step 605 when counters and variables are initialized. In an embodiment, the system uses a finger counter. The finger counter identifies the finger 326 involved in the calibration. Note that other variables and/or counters or combination of variables and/or counters could be used.

In step 610, one of the fingers 326 is identified and defined. In an embodiment, the finger is associated with the finger counter value. For example, finger 326a of FIG. 3 may correspond to finger 1. When finger counter value is equal or equivalent to 1, finger 326a is identified in step 610.

In step 615, a determination is made whether any pupils covered by the identified finger in the cross scan direction contain energy. If any pupils covered by the finger in the cross scan direction contain energy, operation proceeds to step 620. If any pupils covered by the finger in the cross scan direction are empty, operation proceeds to step 640.

In step 625, a determination is made whether the any pupils potentially covered by the finger contains in the scan direction contain energy. If any pupils potentially covered by the finger in the scan direction contain energy, operation proceeds to step 630. If any pupils potentially covered by the finger in the scan direction do not contain energy, operation proceeds to step 640.

In step 630, the integral of the intensity for the area potentially covered by the finger when the finger is not present is calculated. A method for calculating the integral of the intensity is described in more detail in section 2.2.

In step 640, the counters and/or variables are incremented (or decremented). In an embodiment, the finger counter value is incremented by a predetermined value to identify a different finger. (e.g., finger counter value incremented by 1). Alternatively, the finger counter value could have been initialized to a maximum value (e.g., 100). In this step, the finger counter value could be decremented by a predetermined value to identify a different finger.

In step 650, a determination is made whether all fingers in the configuration have been considered. If all fingers have not been considered, operation returns to step 610. If all fingers have been considered, operation proceeds to step 660. Note that one or more of steps 610 through 650 are repeated for each finger present in the segmented configuration being analyzed.

In step 660, the difference in displacement (transmissibility) of adjacent fingers constraint is calculated. The calculation of the transmissibility of adjacent fingers constraint is described in more detail in section 2.4.1.1.2. In an embodiment, the constraint is a matrix. Alternatively, the constraint could be a polynomial. As would be appreciated by persons of skill in the art, other forms for the constraint could be used with the present invention.

2.2 Calculation of Integral of the Intensity

FIG. 7 depicts a flowchart of a method 700 for calculating the integral of intensity at a cross scan coordinate, according to an embodiment of the invention.

In step 710, the illumination slot is divided into a grid having a plurality of grid points. Each grid point is defined by a cross scan (e.g., x) and scan (e.g., y) direction coordinate.

FIG. 8A depicts an analytical representation of the illumination slot at correction plane. As shown in FIG. 8A, illumination slot is represented as a rectangular grid 820 having a plurality of grid points 822.

In step 720, a plurality of pupils 828 are superimposed onto the illumination slot grid. The center of each "pupil" 828 is represented by an illumination slot grid point 822. In an embodiment, pupils are truncated in order to compensate for the trapezoidal illumination profile across the scan direction (y direction) of the slot. Pupils are also truncated at the edges of the slot.

In step 725, the adjustable components are superimposed onto the illumination slot grid. This step is optional. Step 725 will only be present when calculating the intensity integral modified by the adjustable components. FIG. 8D depicts exemplary adjustable components 820 and zones 825 effected by the adjustable components.

In step 730, a plurality of "pupil" grids are defined. Each "pupil" grid maps to one of the plurality of pupils superimposed onto the illumination slot. The center of each "pupil" grid is coincident with the center of the "pupil" mapped to that grid. Each "pupil" grid has a plurality of "pupil" grid points. Each "pupil" grid point is defined by a first coordinate (e.g., u) and a second coordinate (e.g., v).

Figure 8B:
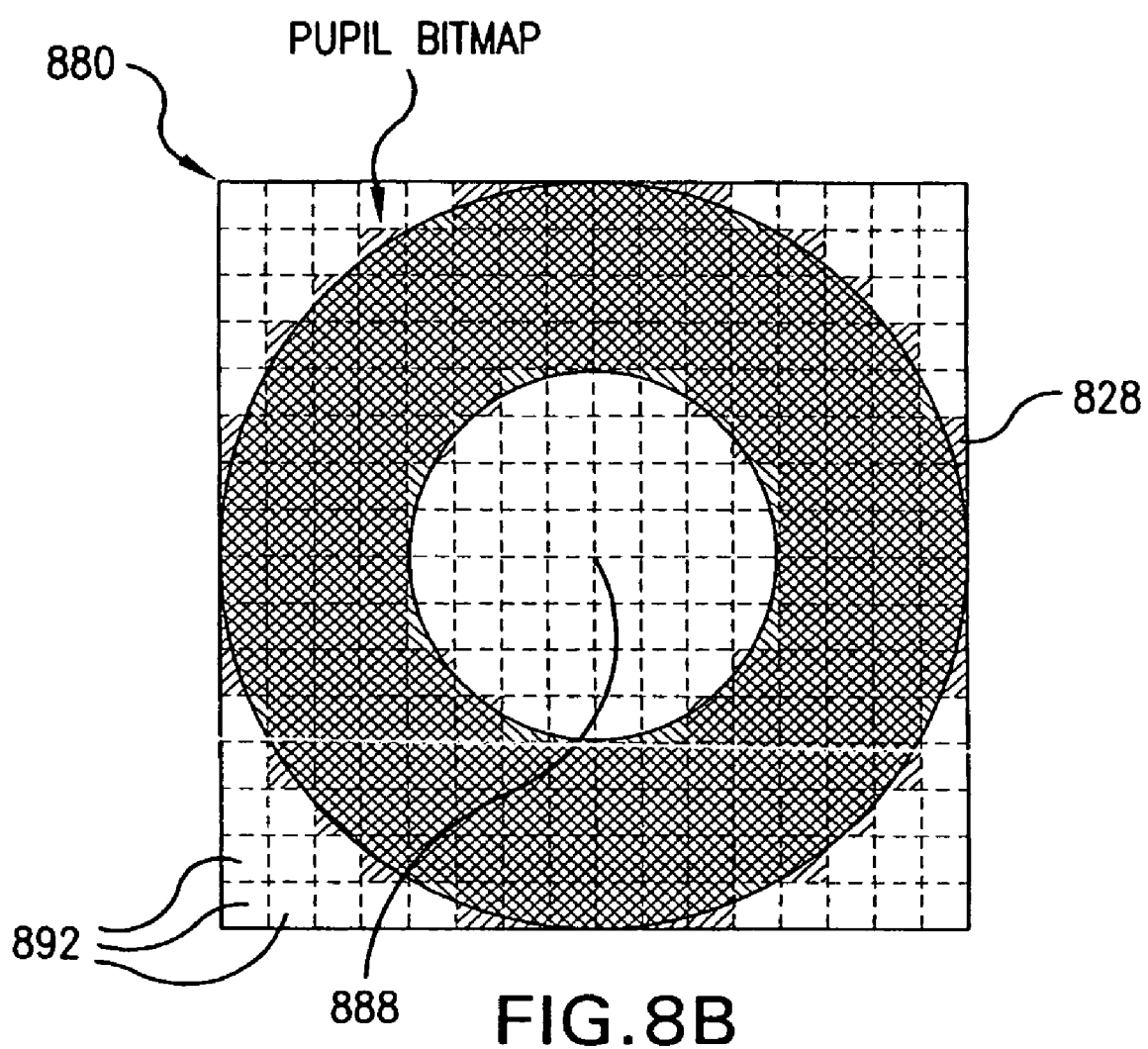
Figure 8C:
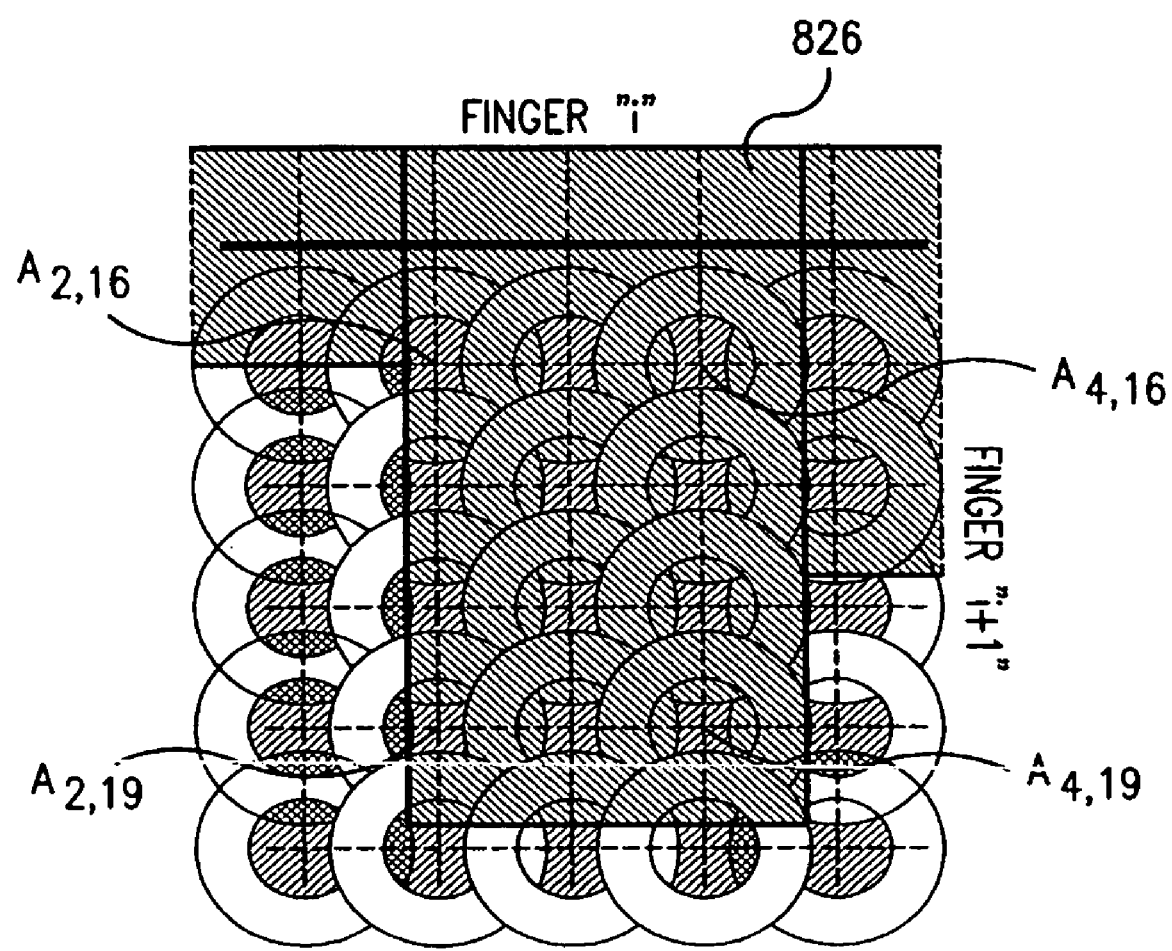
Figure 8D:
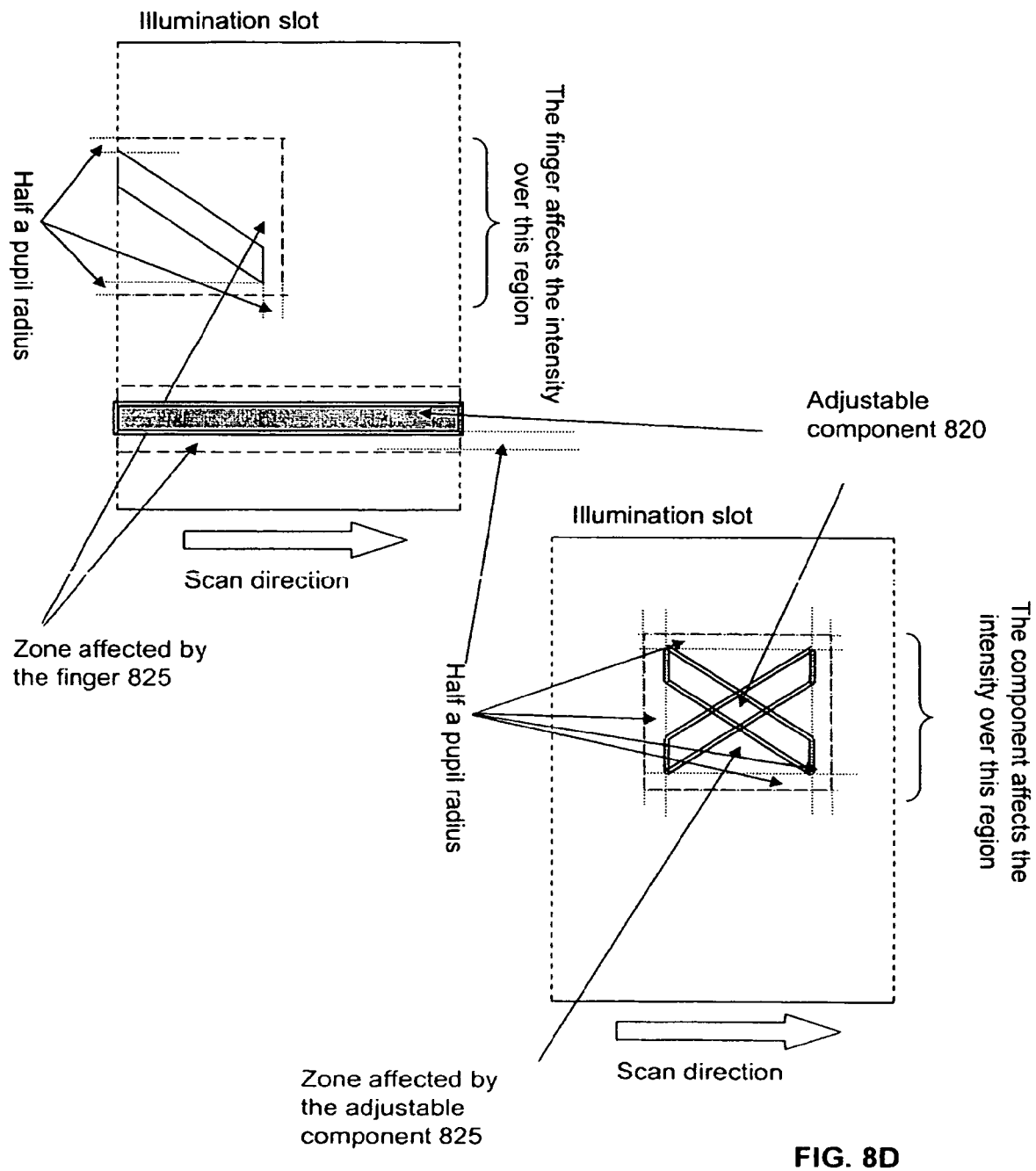

FIG. 8B depicts an exemplary "pupil" grid 880, according to the present invention. "pupil" 828 has a center "pupil" grid point 888. When a "pupil" is overlaid onto the illumination grid, the center "pupil" grid point 888 is mapped to an illumination slot grid point 822c in the illumination grid. The shape of the "pupil" mapped in each "pupil" grid is defined by the selected illumination mode (e.g., conventional, Quazar, annular, NA, sigma settings, etc.). Although FIG. 8B depicts a "pupil" as having an annular shape, persons of skill in the art will recognize that any "pupil" shape can be used.

In step 740, the intensity integral is discretized using the results of steps 710, 720, and 730. The discretization of the intensity integral is described in further detail in Section 2.1.1.4.

In step 750, a value of the intensity integral for a cross scan coordinate (e.g., x coordinate) is calculated. This step is repeated for each cross scan coordinate of interest.

2.2.1 Discretization of Integral of Intensity

For ease of description, the integral of the intensity is described in reference to the illumination grid depicted in FIG. 8A. For the illumination slot grid 820 shown in FIG. 8A, let x and y define grid 820 in the Cross Scan and Scan directions respectively. Further, let u and v be the coordinates of "pupil" grid. The intensity at each (x,y) coordinate in grid 820 is given by equation (1):

$$I(x,y) = \iint P_y(u,v) * T(u,v) \partial u \partial v \qquad (1)$$

The integral of the intensity at each cross scan coordinate is given by equation (2).

$$u(x) = \int I(x,y) \partial y = \iint \int P_y(u,v) * T(u,v) \partial u \, \partial v \partial y \qquad (2)$$

Finding a comprehensive way to express the product $T(u,v)*P_y(u,v)$ as a function of finger positions adds complications to equations (1) and (2). In addition, any algorithm that requires real-time computation of three integrals over every coordinate of interest is the illumination slot is not practical. Therefore, it is desirable to discretize equation (2).

As described in step 710 and depicted in FIG. 8A, each grid point (coordinate) in the illumination slot is defined by a pair $(a_k, b_j)$ such that $a_k$ (k=1, 2, 3, ..., K) is the Cross Scan (e.g., x) coordinate of the grid point, and $b_j$ (j=1, 2, 3, ..., J) is the Scan direction (e.g., y) coordinate of the grid point. The discretized integral of the uncorrected intensity at $a_k$ is defined in equation (3) using the summation of the normalized intensity, $I_{k,j}$, of a "pupil" centered at $(a_k, b_j)$:

$$\xi 0_k = \frac{1}{J} \sum_{j=1}^{J} I_{k,j} \; \forall k \qquad (3)$$

In order to determine the normalized integral of intensity of a "pupil" centered at $(a_k, b_j)$, a light function for the "pupil" must be calculated. A method for calculating the light function is depicted in FIG. 9. In step 910, a plurality of pixels is defined for the "pupil" grid mapped to the "pupil". The center of each pixel maps to one "pupil" grid point. As shown in FIG. 8B, the "pupil" grid includes 5 plurality of pixels 892.

In step 920, for each pixel in the "pupil" grid, a determination is made whether a portion of the "pupil" is contained within the pixel. This is also referred to as a determination of the presence or absence of light at each pixel. This determination can be based on how much of the actual "pupil" is located in the pixel. For example, in an embodiment, a certain percentage of the pixel may need to be covered by the "pupil" in order for the pixel to be considered as having light. Alternatively, in an embodiment, if any of the "pupil" is in the pixel, the pixel is considered as having light. As would be appreciated by persons of skill in the art, various methods for determining the presence or absence of light at a pixel could be used.

If it is determined in step 920, that a portion of the "pupil" is contained within the pixel (i.e., presence of light in pixel), operation proceeds to step 930. If it is determined in step 920, that a portion of the "pupil" is not contained within the pixel (i.e., absence of light in pixel), operation proceeds to step 940.

In step 930, the light function for that pixel is set to a first value (e.g., 1). As can be seen in FIG. 8B, in an embodiment, when a portion of a "pupil" is located in a pixel, the entire pixel is given a value of 1. This "turning on" of a pixel generates a bitmap of the "pupil" in "pupil" grid 880.

In step 940, the light function for that pixel is set to a second value (e.g., 0).

Note that steps 920-940 are repeated for each pixel in the "pupil" grid.

Steps 920-940 can be summarized by equation (4). For the "pupil" centered at illumination grid point $(a_k, b_j)$ (i.e., the "pupil" mapped to the "pupil" grid), the coordinates for the center of each pixel are defined by the "pupil" grid coordinate pair $(c^{j,k}_o, d^{j,k}_p)$ (o=1, 2, 3, ..., O and p=1, 2, 3, ..., P).

The presence or absence of light at each pixel is defined as:

$$\gamma_{o,p}^{j,k} = \begin{cases} 1 & \text{Light} \\ 0 & \text{No Light} \end{cases} \quad (4)$$

where the value of $\gamma_{o,p}^{j,k}$ depends on both the "pupil" shape as well as the location of the "pupil" over the slot and the illumination profile.

Then, normalized intensity integral, $I_{k,j}$ is calculated as:

$$I_{k,j} = \frac{\delta_k}{\Gamma_k} \sum_{o=1}^{O} \sum_{p=1}^{P} \gamma_{o,p}^{j,k} \quad (5)$$

$$\Gamma_k = \sum_{j=1}^{J} \sum_{o=1}^{O} \sum_{p=1}^{P} \gamma_{o,p}^{j,k}$$

where $\delta_k$ is a scaling factor designed to match the actual illumination profile and $\Gamma_k$ is the total number of pixels with light ($\gamma_{o,p}^{j,k}=1$) for all the "pupils" centered at the x coordinate $a_k$.

From equations (3) to (5):

$$\xi 0_k = \frac{\delta_k}{J * \Gamma_k} \sum_{j=1}^{J} \sum_{o=1}^{O} \sum_{p=1}^{P} \gamma_{o,p}^{j,k} \quad \forall k \quad (6)$$

$$\xi 0_k = v_k \sum_{j=1}^{J} \sum_{o=1}^{O} \sum_{p=1}^{P} \gamma_{o,p}^{j,k} \quad \forall k$$

$$v_k = \frac{\delta_k}{J * \Gamma_k}$$

Partial contributions to the uncorrected intensity integral $\xi 0_k$ can be calculated by simply summing over a partial set of "pupil" centers, i.e., as shown in equation (6a).

$$\xi 0_k = v_k \sum_{j=1}^{J} \sum_{o=1}^{O} \sum_{p=1}^{P} \gamma_{o,p}^{j,k} \quad (6a)$$

$$\xi 0_k = v_k \left[ \left( \sum_{j=1}^{J1} \sum_{o=1}^{O} \sum_{p=1}^{P} \gamma_{o,p}^{j,k} \right) + \left( \sum_{j=J1+1}^{J2} \sum_{o=1}^{O} \sum_{p=1}^{P} \gamma_{o,p}^{j,k} \right) + \ldots + \left( \sum_{j=Jn+1}^{J} \sum_{o=1}^{O} \sum_{p=1}^{P} \gamma_{o,p}^{j,k} \right) \right]$$

$$\xi 0_k = v_k (\xi 0_k^1 + \xi 0_k^2 + \ldots \xi 0_k^n)$$

where $\xi 0_k^1$ is the contribution of the "pupils" centered at $(a_k, b_1), (a_k, b_2), \ldots, (a_k, b_{J1})$ to the integral of the intensity at $a_k$, $\xi 0_k$. In general, $\xi 0_k^1$ is the contribution to $\xi 0_k$ of the "pupils" centered at $(a_k, b_h)$, where h=f, f+1, ..., g−1, g (with f and g such that 1<f<g<J).

As described above, the intensity integral may also be calculated as modified by the adjustable components of the correction system. The integral of the intensity at a cross scan coordinate modified by one or more adjustable components is given by equation (7). The integral of the intensity at $a_k$ modified by the adjustable elements is:

$$\xi_k = v_k * \left[ \left( A_1 * \sum_{J1k} \sum_{O1k} \sum_{P1k} \gamma_{o,p}^{j,k} \right) + \left( A_2 * \sum_{J2k} \sum_{O2k} \sum_{P2k} \gamma_{o,p}^{j,k} \right) + \ldots + \left( A_n * \sum_{j=Jnk} \sum_{Onk} \sum_{Pnk} \gamma_{o,p}^{j,k} \right) + \left( \sum_{J*1k} \sum_{O*1k} \sum_{P*1k} \gamma_{o,p}^{j,k} \right) + \left( \sum_{J*2k} \sum_{O*2k} \sum_{P*2k} \gamma_{o,p}^{j,k} \right) + \ldots + \left( \sum_{J*nk} \sum_{O*nk} \sum_{P*nk} \gamma_{o,p}^{j,k} \right) \right] \quad (7)$$

where:
Jik: the index of all "pupils" at $a_k$ affected by the $i^{th}$ adjustable component (i.e., adjustable component "i" covers at least one pixel of the "pupil" centered at $(a_k, b_{ji})$ such that $j_i \in$Jik). For simplicity of notation, this set of "pupils" is noted as the "pupils" is noted as the "pupils" centered at $(a_k, b_{jik})$.

J*ik: the index of all "pupils" at $a_k$ NOT affected by the $i^{th}$ adjustable component (i.e., adjustable component "i" DOES NOT COVER any pixels of the "pupil" centered at $(a_k, b_{ji})$ such that $j_i \in$J*ik).

For simplicity of notation, this set of "pupils" is noted as the "pupils" is noted as the "pupils" centered at $(a_k, b_{J*ik})$.

Notice that the union of the sets Jik and J*ik is equal to all possible indexes of "pupils" centered at $(a_k, b_j)(j=1, 2, 3, \ldots, J)$. Further, the indexes contained in Jik and J*ik are not necessarily sequential.

Oik, Pik: index for all the pixels of the "pupils" centered at $(c^{Jik,k}_o, d^{Jik,k}_p)$ covered by adjustable component "i".

O*ik, P*ik: index for all the pixels of the "pupils" centered at $(C^{J*ik,k}_o, d^{J*ik,k}_p)$ NOT covered by adjustable component "i".

For simplicity, the notation in summations of equation (7) has been simplified.

When the adjustable components are a set of fingers, $A_n = T_n(F_n)$. In this example, $T_n$ (where $n=1, 2, 3, \ldots, N$ for "N" fingers) is the transmissibility of the $n^{th}$ finger. In the case of double-sided opposing fingers, $T_n$ can be a function of the finger position, $F_n$, if a gradient is included in the finger's transmissibility. In this example, given the finger size, finger tilt, "pupil" size ($\sigma$) and the grid size, a single finger can modify the integral of the intensity at several Cross Scan grid coordinates.

2.2.2 Examples

FIG. 10 is an illustration depicting components of equation (7a) below for a correction system using a plurality of fingers as adjustable components. FIG. 10 depicts a section 1000 of the uniformity correction system having a double-sided configuration of fingers. The shaded areas determine the set of indexes to be used in equation (7a) below. Area 1010 corresponds to the set of pixels of a particular "pupil" bitmap covered by finger "i". Area 1020 corresponds to a set of pixels of the "pupil" bitmap covered by finger "i+1". Area 1030 corresponds to a set of pixels of the "pupil" bitmap potentially covered by finger "i+1".

$$\xi_k = v_k * \left[ \left( T_i(F_i) * \sum_{Jik} \sum_{Oik} \sum_{Pik} \gamma^{j,k}_{o,p} \right) + \ldots + \right. \quad \text{(7a)}$$
$$\left( T_{i+1}(F_{i+1}) * \sum_{J(i+1)k} \sum_{O(i+1)k} \sum_{P(i+1)k} \gamma^{j,k}_{o,p} \right) +$$
$$\left. \left( \sum_{J*(i+1)k} \sum_{O*(i+1)k} \sum_{P*(i+1)k} \gamma^{j,k}_{o,p} \right) + \ldots \right]$$

Contribution of all pixels covered by finger "i"
Contribution of all pixels covered by finger "i+1"
Contribution of all pixels POTENTIALLY covered by finger "i+1"

Moreover, equation (7) can be re-written as:

$$\xi_k = v_k * \left\{ \left[ \left( T_1(F_1) * \sum_{J1k} \sum_{O1k} \sum_{P1k} \gamma^{j,k}_{o,p} \right) + \left( \sum_{J1k} \sum_{O*1k} \sum_{P*1k} \gamma^{j,k}_{o,p} \right) \right] + \right. \quad \text{(7b)}$$
$$\left[ \left( T_2(F_2) * \sum_{J2k} \sum_{O2k} \sum_{P2k} \gamma^{j,k}_{o,p} \right) + \left( \sum_{J*2k} \sum_{O*2k} \sum_{P*2k} \gamma^{j,k}_{o,p} \right) \right] + \ldots$$
$$\left. \left[ \left( T_n(F_n) * \sum_{Jnk} \sum_{Onk} \sum_{Pnk} \gamma^{j,k}_{o,p} \right) + \left( \sum_{J*nk} \sum_{O*nk} \sum_{P*nk} \gamma^{j,k}_{o,p} \right) \right] \right\}$$

It is expected that equation (7b) can be fitted to a polynomial of different orders as the fingers are rotated.

2.2.2.1 Non-Tilted, Segmented Configuration

Equation (7) can be simplified for an exemplary non-tilted, segmented configuration. In this configuration, the inserted fingers cover the entire illumination slot and cannot move. Thus, all sets J*ik, O*ik, and P*ik are empty and Jik=J$\forall$i, k. Because the fingers do not move in this configuration, $T_i(F_i) \equiv T_i$. Then, equation (7) can be written as:

$$\xi_k = v_k * \left[ \left( T_1 * \sum_J \sum_{O1k} \sum_{P1k} \gamma^{j,k}_{o,p} \right) + \right. \quad \text{(8a)}$$
$$\left. \left( T_2 * \sum_J \sum_{O2k} \sum_{P2k} \gamma^{j,k}_{o,p} \right) + \ldots + \left( T_N * \sum_J \sum_{ONk} \sum_{PNk} \gamma^{j,k}_{o,p} \right) \right]$$

$$\xi_k = v_k * \left[ \sum_J \sum_{O1k} \sum_{P1k} \gamma^{j,k}_{o,p} \sum_J \sum_{O2k} \sum_{P2k} \gamma^{j,k}_{o,p} \ldots \right.$$
$$\left. \sum_J \sum_{ONk} \sum_{PNk} \gamma^{j,k}_{o,p} \right] * \begin{bmatrix} T_1 \\ T_2 \\ \ldots \\ T_N \end{bmatrix}$$

Further, the integral of the intensity at every cross axis coordinate can be calculated as:

$$\Xi = Y * M * T \quad \text{(8b)}$$

where:

$\Xi$: corrected uniformity profile defined in equation (8b)

Y: scaling matrix defined in equation (8b)

M: matrix where each element is equivalent to the sum of pixels of each "pupil" potentially covered by each finger. The sum of each row is the (scaled) integral of the intensity at a given coordinate.

T: vector of finger transmissibilities

In the segmented configuration, the transmissibility "T" can be calculated using linear methods. Notice that in equation (8b) Y*M =$\Xi$0, the Uncorrected Uniformity Profile.

Notice that, $$\Xi = \begin{bmatrix} \xi_1 \\ \xi_2 \\ \ldots \\ \xi_K \end{bmatrix}; \mapsto \Xi 0 = \begin{bmatrix} \xi 0_1 \\ \xi 0_2 \\ \ldots \\ \xi 0_K \end{bmatrix} \quad \text{(8b)}$$

$$Y = \begin{bmatrix} v_1 & 0 & 0 & 0 \\ 0 & v_2 & 0 & 0 \\ \ldots & \ldots & \ldots & \ldots \\ 0 & 0 & 0 & v_K \end{bmatrix}$$

$$M = \begin{bmatrix} \sum_J \sum_{O11} \sum_{P11} \gamma^{j,1}_{o,p} & \sum_J \sum_{O21} \sum_{P21} \gamma^{j,1}_{o,p} & \ldots & \sum_J \sum_{ON1} \sum_{PN1} \gamma^{j,1}_{o,p} \\ \sum_J \sum_{O21} \sum_{P21} \gamma^{j,2}_{o,p} & \sum_J \sum_{O22} \sum_{P22} \gamma^{j,2}_{o,p} & \ldots & \sum_J \sum_{ON2} \sum_{PN2} \gamma^{j,2}_{o,p} \\ \ldots & \ldots & \ldots & \ldots \\ \sum_J \sum_{ONK} \sum_{PNK} \gamma^{j,K}_{o,p} & \sum_J \sum_{ONK} \sum_{PNK} \gamma^{j,K}_{o,p} & \ldots & \sum_J \sum_{ONK} \sum_{PNK} \gamma^{j,K}_{o,p} \end{bmatrix}$$

-continued $$T = \begin{bmatrix} T_1 \\ T_2 \\ \ldots \\ T_N \end{bmatrix}$$

2.2.2.2 Double-Sided, Non-Rotated, Opposing Fingers Configuration

In step 555 of method 500, a mapping of the normalized intensity versus finger displacement data is generated. In an example, for the Double-Sided opposing fingers case with the fingers not rotated, it was determined experimentally that all expressions in brackets in equation (7b) can be fit using a $7^{th}$ order polynomial as a function of the finger displacement from "home". Let $\delta F_i$ be the displacement of finger "i" from its home position. Then, equation (7b) can be re-written, for all Cross-Scan sampled coordinates as:

$$\xi_k = \upsilon_k * [\psi_{k1}(\delta F_1) + \psi_{k2}(\delta F_2) + \ldots + \psi_{kN}(\delta F_N)] \quad (9a)$$

$$\Xi = Y * \Psi(\Delta F)$$

with:

$$\Xi = \begin{bmatrix} \xi_1 \\ \xi_2 \\ \ldots \\ \xi_K \end{bmatrix}; \mapsto \Xi 0 = \begin{bmatrix} \xi 0_1 \\ \xi 0_2 \\ \ldots \\ \xi 0_K \end{bmatrix} \quad (9b)$$

$$Y = \begin{bmatrix} \upsilon_1 & 0 & 0 & 0 \\ 0 & \upsilon_2 & 0 & 0 \\ \ldots & \ldots & \ldots & \ldots \\ 0 & 0 & 0 & \upsilon_K \end{bmatrix}$$

$$\hat{\Psi} = \begin{bmatrix} \psi_{11}(\delta F_1) + \psi_{12}(\delta F_2) + \ldots + \psi_{1N}(\delta F_N) \\ \psi_{21}(\delta F_1) + \psi_{22}(\delta F_2) + \ldots + \psi_{2N}(\delta F_N) \\ \ldots \\ \psi_{K1}(\delta F_1) + \psi_{K2}(\delta F_2) + \ldots + \psi_{KN}(\delta F_N) \end{bmatrix} = \begin{bmatrix} \sum_{n=1}^{N} \psi_{1n}(\delta F_n) \\ \sum_{n=1}^{N} \psi_{2n}(\delta F_n) \\ \ldots \\ \sum_{n=1}^{N} \psi_{Kn}(\delta F_n) \end{bmatrix}$$

$$\hat{\Psi} = \Psi * \Omega = \begin{bmatrix} \psi_{11}(\delta F_1) & \psi_{21}(\delta F_2) & \ldots & \psi_{N1}(\delta F_N) \\ \psi_{12}(\delta F_1) & \psi_{22}(\delta F_2) & \ldots & \psi_{N2}(\delta F_N) \\ \ldots & \ldots & \ldots & \ldots \\ \psi_{1K}(\delta F_1) & \psi_{2K}(\delta F_2) & \ldots & \psi_{NK}(\delta F_N) \end{bmatrix} * \begin{bmatrix} 1 \\ 1 \\ \ldots \\ 1 \end{bmatrix}$$

$$\psi_{ki}(\delta F_i) = \varphi_0^{ki} + (\varphi_1^{ki} * \delta F_i) + (\varphi_2^{ki} * \delta F_i^2) + \ldots + (\varphi_7^{ki} * \delta F_i^7)$$

$$\Xi 0 = Y * \hat{\Psi}(0) = \begin{bmatrix} \upsilon_1 & 0 & 0 & 0 \\ 0 & \upsilon_2 & 0 & 0 \\ \ldots & \ldots & \ldots & \ldots \\ 0 & 0 & 0 & \upsilon_K \end{bmatrix} * \begin{bmatrix} \sum_{n=1}^{N} \varphi_0^{1n}(\delta F_n) \\ \sum_{n=1}^{N} \varphi_0^{2n}(\delta F_n) \\ \ldots \\ \sum_{n=1}^{N} \varphi_0^{Kn}(\delta F_n) \end{bmatrix}$$

Notice that in equations (9a) and (9b), the contribution of a particular finger to the integral of the intensity at a particular X coordinate varies. As shown in FIG. 10, a finger might cover more or less area of a particular "pupil" depending on the "pupil" center relative to the finger edge. For example, FIG. 10 illustrates a particular illumination slot grid point (q,r) and a particular "pupil" centered at that grid point. As can be seen in the illustration of FIG. 10, finger "i" potentially covers ⅓ of the area of the "pupil" and finger "i+1" covers the rest. Therefore, finger "i+1" has a greater influence on the integral of the intensity than finger "i", at the particular illumination slot grid point shown.

Given that a polynomial of the same order is being fit to all polynomials $\psi_{ki}(\delta F_i)$, for robustness it is advisable to normalize all polynomials such that $\psi_{ki}(0)=1$. Then, equation (7a) can be re-written as:

$$\Xi = Y * (\tilde{\Psi}(\Delta F) \cdot K) * \Omega = (Y \cdot K) * \tilde{\Psi}(\Delta F) * \Omega \mapsto \Xi 0 = Y \cdot K * \Omega \quad (9c)$$

$$\tilde{\Psi}(\Delta F) = \begin{bmatrix} \tilde{\Psi}_{11}(\delta F_1) & \tilde{\Psi}_{21}(\delta F_2) & \ldots & \tilde{\Psi}_{1N}(\delta F_N) \\ \tilde{\Psi}_{12}(\delta F_1) & \tilde{\Psi}_{22}(\delta F_2) & \ldots & \tilde{\Psi}_{2N}(\delta F_N) \\ \ldots & \ldots & \ldots & \ldots \\ \tilde{\Psi}_{K1}(\delta F_1) & \tilde{\Psi}_{K2}(\delta F_2) & \ldots & \tilde{\Psi}_{KN}(\delta F_N) \end{bmatrix}$$

$$K = \begin{bmatrix} \varphi_0^{11} & \varphi_0^{12} & \ldots & \varphi_0^{1N} \\ \varphi_0^{21} & \varphi_0^{22} & \ldots & \varphi_0^{2N} \\ \ldots & \ldots & \ldots & \ldots \\ \varphi_0^{K1} & \varphi_0^{K2} & \ldots & \varphi_0^{KN} \end{bmatrix} \mapsto K * \Omega = \hat{\Psi}(0)$$

$$\tilde{\psi}_{ki}(\delta F_i) =$$

$$1 + \left(\frac{\varphi_1^{ki}}{\varphi_0^{ki}} * \delta F_i\right) + \left(\frac{\varphi_2^{ki}}{\varphi_0^{ki}} * \delta F_i^2\right) + \ldots + \left(\frac{\varphi_7^{ki}}{\varphi_0^{ki}} * \delta F_i^7\right) \forall \varphi_0^{ki} \neq 0$$

$$\tilde{\psi}_{ki}(\delta F_i) = \begin{cases} 1 + (\tilde{\varphi}_1^{ki} * \delta F_i) + (\tilde{\varphi}_2^{ki} * \delta F_i^2) + \ldots + (\tilde{\varphi}_7^{ki} * \delta F_i^7) & \varphi_0^{ki} \neq 0 \\ 0 & \text{else} \end{cases}$$

where the "∘" operation is defined as an element by element matrix multiplication.

FIGS. 18A-H, 19A-I, and 20A-H present 3 different "pupil" shapes and illumination profiles for a double-sided staggered finger case. FIGS. 18A-H present profiles for a 0.26 sigma conventional illumination "pupil". FIGS. 19A-I present profiles for a 0.68/0.85 sigma, Quazar illumination "pupil". FIGS. 20A-H present profiles for a 0.80/0.97 sigma, Quazar illumination "pupil".

In each of these figures, the Uncorrected Uniformity Profile corresponds to the information to be stored in the matrix K. The plots in the middle of each figure show how, as a function of the "pupil" shape and finger locations, the matrices K and ψ are zero. For the case shown in FIG. 2.6, notice how due to the relative size of the Quazar with respect to the fingers, there is a set of X coordinates in the middle of every finger where it has no influence in the intensity integral. The plots at the bottom of the figures depict, for a couple of representative fingers, the normalized intensity integral change as a function of finger displacement from the home position.

In equations (8) and (9), the matrix Y and the product Y*K contain all the information of the Uncorrected Uniformity Profile Ξ0. Further, the matrices M and Ψ (or its normalized version) can be calculated as a function of the "pupil" shape and finger positions independently of Ξ0. Changes in the uncorrected illumination profile or pole imbalances in "pupils" can be corrected by modifying either Y (Y*K) or M(Ψ).

2.3 Adjustment Calculation

FIG. 22 depicts a flowchart of method 2200 for optimizing the value of adjustments to one or more variables or degrees of freedom, according to an embodiment of the present invention. Method 2200 begins at step 2205 when the desired correction uniformity is initialized. In step 2205, the map of the effect of the adjustable components on intensity is modified to account for the actual uncorrected intensity profile.

In an embodiment of the invention, one or more constraints are first tier (or master) constraints. In step 2210, adjustment values are determined using one or more of the master constraints. In an embodiment, the adjustment values are determined using the least squares algorithm described in Section 2.4.

In step 2215, one or more parameters are stored. For example, in an embodiment, the achieved correction and light loss parameters are stored. As would be appreciated by persons of skill in the art, other parameters could be stored in this step as needed by the correction module.

In step 2220, a determination is made whether the desired corrected uniformity is equal to the minimum value of the uncorrected uniformity profile. The minimum value of the uncorrected uniformity profile represents the maximum value for the profile. If the desired corrected uniformity is not equal to the minimum value of the uncorrected uniformity profile, operation proceeds to step 2230. If the desired corrected is equal to the minimum value of the uncorrected uniformity profile, operation proceeds to step 2240.

In step 2230, the weights for the constraints are decreased.

In step 2235, a determination is made whether the constraint weight is greater than a minimum value. If the weight is greater than a minimum value, operation returns to step 2210. If the weight is less than a minimum value, operation proceeds to step 2270.

Steps 2210-2235 are optional. In an embodiment, operation proceeds to step 2240 after step 2205.

In step 2240, adjustment values are determined using one or more of the entire set of constraints, including the first tier constraints. In an embodiment, the adjustment values are determined using the least squares algorithm described in Section 2.4.

In step 2245, one or more parameters are stored. For example, in an embodiment, the achieved correction and light loss are stored. As would be appreciated by persons of skill in the art, other parameters could be stored in this step as needed by the correction module.

In step 2250, a determination is made whether the desired corrected uniformity is equal to the minimum value of the uncorrected uniformity profile. The minimum value of the uncorrected uniformity profile represents the maximum value for the profile. If the desired corrected uniformity is not equal to the minimum value of the uncorrected uniformity profile, operation proceeds to step 2255. If the desired corrected is equal to the minimum value of the uncorrected uniformity profile, operation proceeds to step 2290.

In step 2255, the weights for the constraints are decreased.

In step 2260, a determination is made whether the constraint weight is greater than a minimum value. If the weight is greater than a minimum value, operation returns to step 2240. If the weight is less than a minimum value, operation proceeds to step 2270.

In step 2270, a case is selected using only the first tier constraints that yield the best results. Operation proceeds to step 2290.

2.3.1 EXAMPLES

The following sections describe exemplary methods of determining the values of adjustments for correction systems using a plurality of fingers as correction elements. Section 2.3.1.1 describes a method of finger position calculation for use with double-sided configuration. Section 2.3.1.2 describes a method of finger transmissibility calculation for use with segmented configurations.

2.3.1.1 Double-Sided Configurations

Figure 11B:
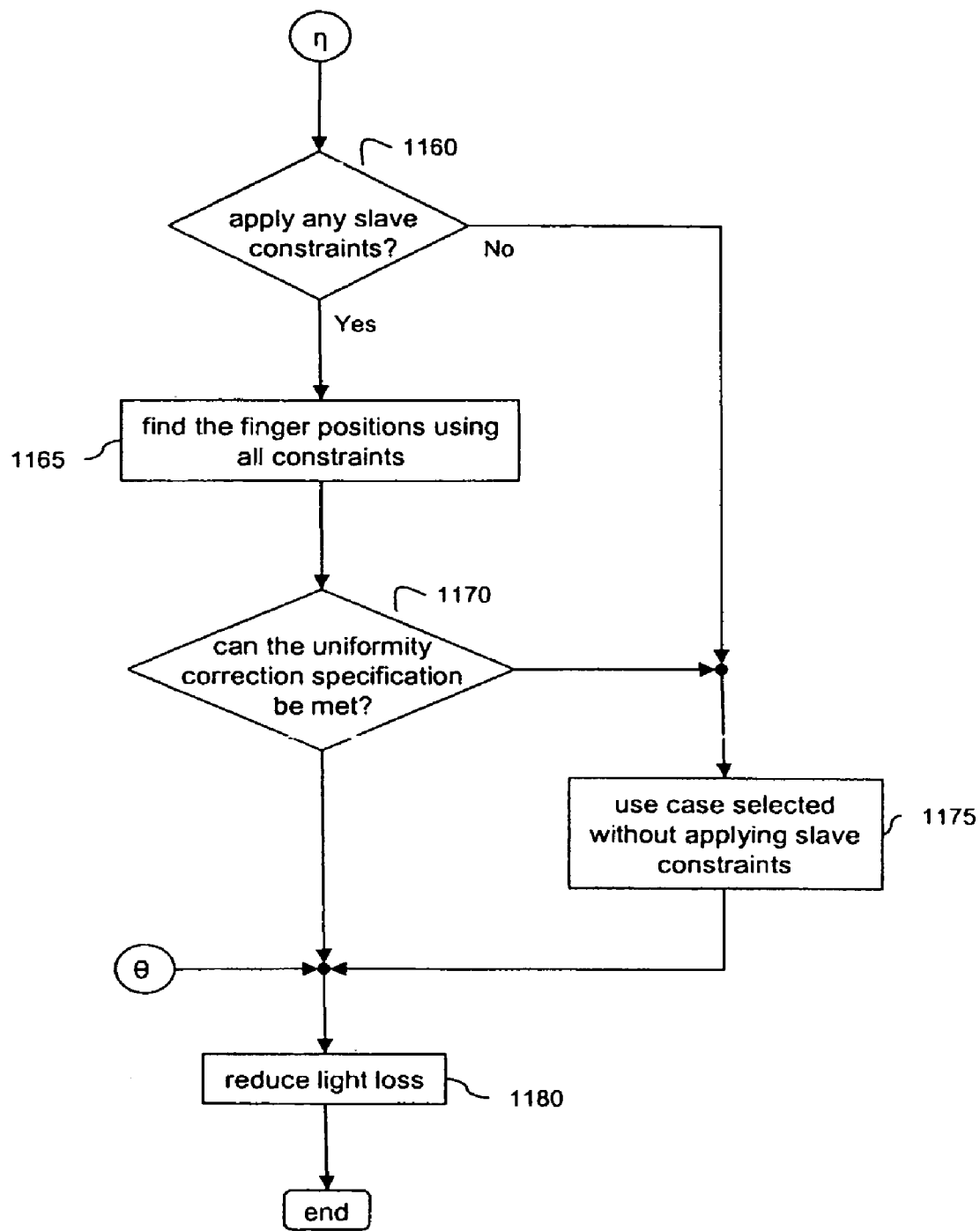

FIGS. 11A and 11B depict a flowchart of a method 1100 for calculating finger positions in correction system 120 having a double-sided configuration, according to an embodiment of the invention. For ease of description, FIG. 11 is described with continued reference to the embodiments shown in FIGS. 2A and 2B. However, FIG. 11 is not limited to those embodiments.

Method 1100 begins in step 1105 when the desired corrected uniformity is initialized. In an embodiment, the desired corrected uniformity is set to equal the maximum value of the uncorrected uniformity profile fully attenuated by the fingers in this step. This value represents the minimum value for the profile.

In step 1110, the finger positions are determined using the scan (y-axis) ellipticity and telecentricity constraints. Example constraints are described in more detail in Section 2.4.1.1. Step 1110 is described in greater detail in Section 2.4.2.1.

In step 1115, one or more parameters are stored. For example, in an embodiment, the achieved correction, light loss, and norm of constraints multiplied by the finger positions are stored. As would be appreciated by persons of skill in the art, other parameters could be stored in this step as needed by the correction module.

In step 1120, a determination is made whether the desired corrected uniformity is equal to the minimum value of the uncorrected uniformity profile. The minimum value of the uncorrected uniformity profile represents the maximum value for the profile. If the desired corrected uniformity is not equal to the minimum value of the uncorrected uniformity profile, operation proceeds to step 1125. If the desired corrected is equal to the minimum value of the uncorrected uniformity profile, operation proceeds to step 1130.

In step 1125, the value of the desired corrected uniformity is increased. For example, the value is increased by the desired corrected uniformity step. In an embodiment, the desired corrected uniformity step is configurable. Operation then returns to step 1110.

The repetition of steps 1110, 1120, and 1125 generates one or more cases, one per each time steps 1110 and 1120 are performed. The generated cases are used subsequently by method 1100.

Note that although steps 1105-1125 describe starting with the minimum value of the uncorrected uniformity profile and increasing the value until the maximum is reached, these steps could be performed by starting with the maximum value of the uncorrected uniformity profile and decreasing the value until the minimum is reached.

In step 1130, a determination is made whether any constraints are to be applied or whether any of the cases meets the uniformity specification. If it is determined that no constraints are to be applied or that no case meets the uniformity specification, operation proceeds to step 1135. If constraints are to be applied or if one or more cases meets the uniformity specification, operations proceeds to step 1140.

In step 1135, the case with the best uniformity correction is selected. Operation then proceeds to step 1180.

In step 1140, a determination is made whether any case meets the uniformity specification and the master constraint requirement. The system includes a master constraint requirement and one or more slave constraint requirements. The master constraint requirement must be met before any of the slave constraint requirements is considered. In an embodiment, the master constraint requirement is configurable and can be set to one of a plurality of possible constraints. In an alternate embodiment, the master constraint requirement is light loss. In this embodiment, the determination is whether one or more cases meet both the light loss requirement and the uniformity specification. If one or more cases meet both the uniformity specification and the master constraint requirement, operation proceeds to step 1150. In no case meets both the uniformity specification and the master restraint requirement, operation proceeds to step 1145.

In step 1145, all cases that meet the uniformity specification are selected and operation proceeds to step 1155.

In step 1150, all cases that meet both the uniformity specification and the master constraint requirement are selected.

In step 1155, from the set of selected cases, the case with the lowest norm for the ellipticity and telecentricity constraints is selected.

In step 1160, a determination is made whether any of the slave constraints are to be applied. In an embodiment, the slave constraints are configurable. In an embodiment where the master constraint is light loss, the slave constraints include one or more cross scan constraints. In an alternate embodiment where one of the cross scan constraints is the master constraint, light loss is included as one of the slave constraints. If one or more slave constraints are to be applied, operation proceeds to step 1165. If no slave constraints are to be applied, operation proceeds to step 1175.

In step 1165, the finger positions using all constraints are determined. Step 1165 is described in greater detail in Section 2.4.2.1.

In step 1170, a determination is made whether the uniformity specification can be meet when all the constraints are applied. If the uniformity specification can be met, operation proceeds to step 1180. If the uniformity specification cannot be met, operation proceeds to step 1175.

In step 1175, the case selected before the slave constraints were applied (i.e., the case selected in step 1155) is used.

In step 1180, light loss is reduced. Step 1180 is described in further detail in Section 2.6.

In an embodiment, steps 1105-1155 are performed when the system is off-line. In this embodiment, only steps 1160-1180 are preformed during real-time operation. As would be appreciated by persons of skill in the art, additional or fewer steps can be performed during real-time operation based on requirements and/or capabilities of the system.

2.3.1.2 Segmented Configurations

Figure 12B:
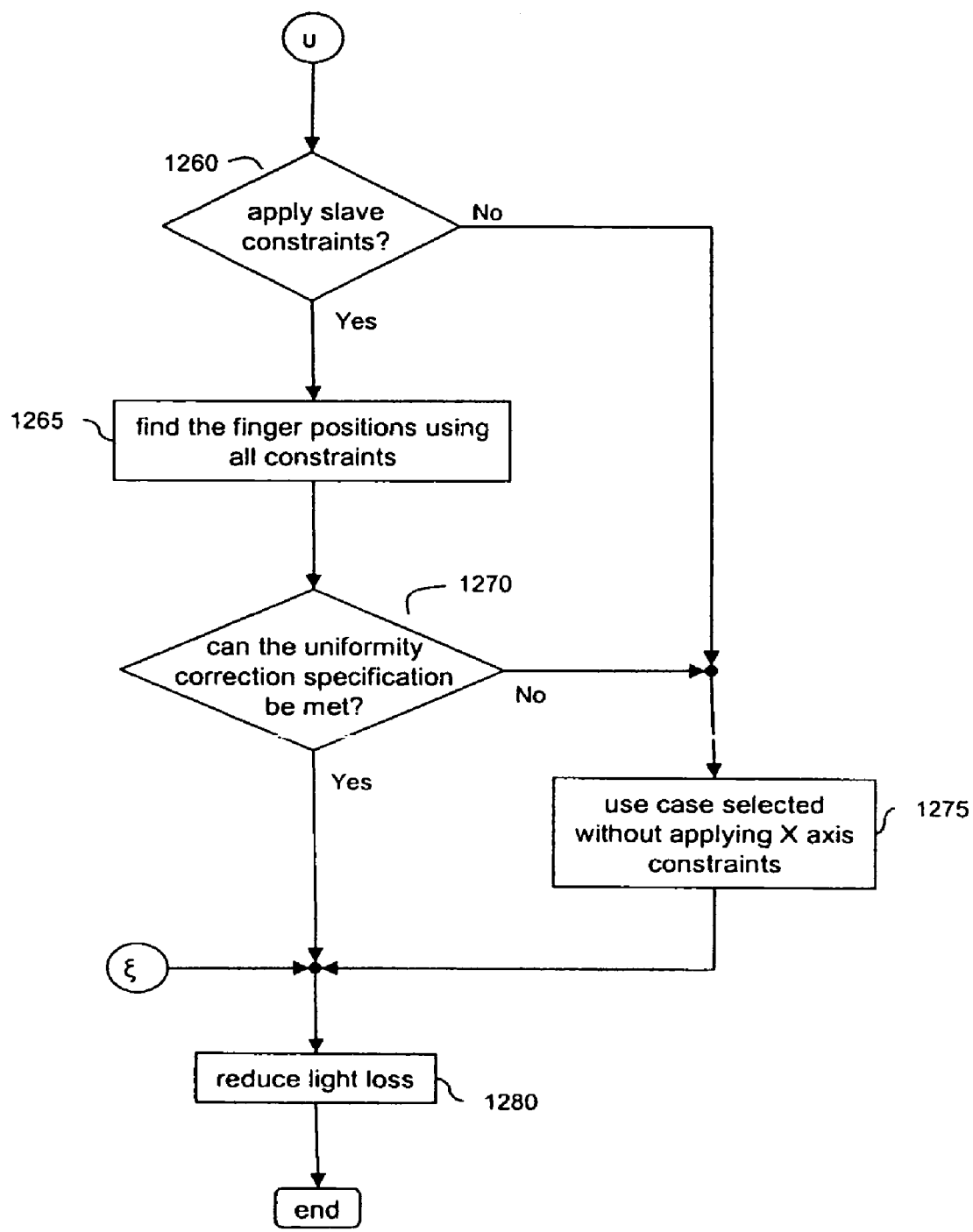

FIGS. 12A and 12B depict a flowchart of a method 1200 for calculating finger positions in the correction system 120 having a segmented configuration, according to an embodiment of the invention. For ease of description, FIG. 12 is described with continued reference to the embodiment shown in FIG. 3. However, FIG. 12 is not limited to those embodiments. A portion of the flowchart of FIG. 12 is identical for both the segmented and double-sided configuration. For ease of description, the method for the segmented configuration is described separately. As would be appreciated by persons of skill in the art, method 1200 can be combined with method 1100.

Method 1200 begins in step 1205 when the desired corrected uniformity is initialized. In an embodiment, the desired corrected uniformity is set to equal the maximum value of the uncorrected uniformity profile fully attenuated by the fingers in this step. This value represents the minimum value for the profile.

In step 1210, the finger positions are determined using no constraints. Step 1210 is described in greater detail in Section 2.4.2.2.

In step 1215, one or more parameters are stored. For example, in an embodiment, the achieved correction, light loss, and norm of constraints multiplied by the finger positions are stored. As would be appreciated by persons of skill in the art, other parameters could be stored in this step as needed by the correction module.

In step 1220, a determination is made whether the desired corrected uniformity is equal to the minimum value of the uncorrected uniformity profile. The minimum value of the uncorrected uniformity profile represents the maximum value for the profile. If the desired corrected uniformity is not equal to the minimum value of the uncorrected uniformity profile, operation proceeds to step 1225. If the desired corrected is equal to the minimum value of the uncorrected uniformity profile, operation proceeds to step 1230.

In step 1225, the value of the desired corrected uniformity is increased. For example, the value is increased by the desired corrected uniformity step. In an embodiment, the desired corrected uniformity step is configurable. Operation then returns to step 1210.

The repetition of steps 1210, 1220, and 1225 generates one or more cases, one per each time steps 1210 and 1220 are performed. The generated cases are used subsequently by method 1200.

Note that although steps 1205-1225 describe starting with the minimum value of the uncorrected uniformity profile and increasing the value until the maximum is reached, these steps could be performed by starting with the maximum value of the uncorrected uniformity profile and decreasing the value until the minimum is reached.

In step 1230, a determination is made whether any constraints are to be applied or whether any of the cases meets the uniformity specification. If it is determined that no constraints are to be applied or that no case meets the uniformity specification, operation proceeds to step 1235. If constraints are to be applied or if one or more cases meets the uniformity specification, operations proceeds to step 1240.

In step 1235, the case with the best uniformity correction is selected. Operation then proceeds to step 1280.

In step 1240, a determination is made whether any case meets the uniformity specification and the master constraint requirement. The system includes a master constraint requirement and one or more slave constraint requirements. The master constraint requirement must be met before any of the slave constraint requirements is considered. In an embodiment, the master constraint requirement is configurable and can be set to one of a plurality of possible constraints. In an alternate embodiment, the master constraint requirement is light loss. In this embodiment, the determination is whether one or more cases meet both the light loss requirement and the uniformity specification. If one or more cases meet both the uniformity specification and the master constraint requirement, operation proceeds to step 1250. In no case meets both the uniformity specification and the master restraint requirement, operation proceeds to step 1245.

In step 1245, all cases that meet the uniformity specification are selected and operation proceeds to step 1255.

In step 1250, all cases that meet both the uniformity specification and the master constraint requirement are selected.

In step 1255, from the set of selected cases, the case with the lowest norm for the ellipticity and telecentricity constraints is selected.

In step 1260, a determination is made whether any of the slave constraints are to be applied. In an embodiment, the slave constraints are configurable. In an embodiment where the master constraint is light loss, the slave constraints include one or more cross scan constraints. In an alternate embodiment where one of the cross scan constraints is the master constraint, light loss is included as one of the slave constraints. If one or more slave constraints are to be applied, operation proceeds to step 1265. If no slave constraints are to be applied, operation proceeds to step 1275.

In step 1265, the finger positions using all constraints are determined. Step 1265 is described in greater detail in Section 2.1.2.3.2.

In step 1270, a determination is made whether the uniformity specification can be meet when all the constraints are applied. If the uniformity specification can be met, operation proceeds to step 1280. If the uniformity specification cannot be met, operation proceeds to step 1275.

In step 1275, the case selected before the slave constraints were applied (i.e., the case selected in step 1255) is used.

In step 1280, light loss is reduced. Step 1280 is described in further detail in Section 2.1.2.4.

In an embodiment, steps 1205-1255 are performed when the system is off-line. In this embodiment, only steps 1260-1280 are preformed during real-time operation. As would be appreciated by persons of skill in the art, additional or fewer steps can be performed during real-time operation based on requirements and/or capabilities of the system.

2.4 Least Squares Algorithm

Values for the adjustable variables and/or degrees of freedom of the correction system are determined using the least squares fit algorithm. The method used for all types of uniformity correction systems.

In general, the method calculates the constraint weighted least squares solution. If the resulting adjustable variables and/or degrees of freedom yield a corrected uniformity profile that does not meet the desired specification, the constraint weights are reduced by an amount proportional to the error between the corrected and desired uniformity profiles.

For example, in a correction system using a plurality of adjacent correction elements, if the matrix form of the adjacent finger travel (transmissibility) constraint is being used and the value of the constraint weight is below a threshold, the number of adjacent fingers considered is reduced. The constraint weights are re-calculated and the process is repeated.

The method is repeated until either the corrected uniformity profile meets specifications or the weight of the constraints are so small that it is determined that the specification cannot be met with constraints and a solution is calculated setting all constraint weights to zero.

2.4.1 Constraint Weighted Least Squares Algorithm

In an embodiment, a Constraint Weighted Least Squares (CWLS) algorithm is used to calculate the adjustment values. Equations 10, 10a, and 10b are exemplary CWLS equations that can be used in an embodiment of the invention. In an embodiment, any number of constraints and any number of weights can be used, as required.

$$L(X) = \frac{1}{2}(f_0(X)^2 + W_1 * f_1(X)^2 + W_2 * f_2(X)^2 + W_3 * f_3(X)^2 + \ldots + W_n * f_n(X)^2) \quad (10)$$

$$L(X) = \frac{1}{2} \left\| \begin{bmatrix} f_0(X) \\ W_1 * f_1(X) \\ W_2 * f_2(X) \\ \vdots \\ W_n * f_n(X) \end{bmatrix} \right\|_2^2 \quad (10a)$$

$\min(X) \leq X \leq \max(X)$
$W_1, W_2, W_3, \ldots W_N$ are calculated so that:

$$\max(W_1 * \|f_1(X)\|_2, W_2 * \|f2_1(X)\|_2, W_3 * \|3_1(X)\|_2, \ldots, W_N * \|f_N(X)\|_2) \leq \|f_0(X)\|_2 \forall X \quad (10b)$$

2.4.1.1 Example Constraints

The following section describes exemplary constraints that can be used with the present invention. As would be appreciated by persons of skill in the art, other constraints can be used.

In an embodiment, the function $f_0(X)$ is the corrected uniformity profile minus the desired uniformity profile. The function is defined by equations (8) and (9).

For the example of a uniformity correction system having a plurality of fingers, let D be the desired Corrected Uniformity Profile defined for all cross scan coordinates $a_k$, k=1, 2, ..., K. Then, by equations (8) and (9):

$$f_0(X) = \begin{cases} (Y * M) * T - D & \text{segmented} \\ (Y \cdot K) * \Psi(\Delta F) * \Omega - D & \text{doublesided} \end{cases} \quad (11)$$

Notice that for the segmented configuration, $f_0(X)$ is linear with respect to the vector of finger transmissibilities, T. In contrast, for the double-sided configuration, equation (9) is non-linear with respect to the finger displacement vector $\Delta F$ as described by equations (7).

2.4.1.1.1 Light Loss Constraint

In an embodiment, function $f_1(X)$ is the light loss constraint. When fingers are used as the adjustable components, by maximizing the transmissibility of the fingers in the segmented case and minimizing the travel in the double-sided case, light loss is minimized. Then, $$f_1(X) = \begin{cases} T - \text{Max}(T) & \text{segmented} \\ \Delta F & \text{doublesided} \end{cases} \quad (12)$$

where Max(T) is the maximum allowable transmissibility of the fingers. Note that in this case, Max(T) is a vector where all elements have the same value.

2.4.1.1.2. Displacement (or Transmissibility)

When the components are a plurality of fingers, the function $f_2(X)$ is the constraint that penalizes the difference in displacement (or transmissibility) of adjacent fingers.

The difference in travel or transmissibility between adjacent fingers has a direct affect on the telelecentricity and ellipticity induced by the correction system in the scan direction. The difference in displacement of adjacent fingers is the difference between the tips of the two adjacent fingers. In step 570 of FIG. 5 and step 660 of FIG.6, the adjacent finger travel is minimized.

In an embodiment, the difference in travel (transmissibility) is calculated by first determining the average number of fingers that contribute to a single cross scan position intensity integral. This is equivalent to calculating how many fingers (on average) affect each set of "pupils" in the cross scan direction. Next, a matrix is constructed such that each row is the difference of the transmissibility or travel between kk consecutive fingers.

For example, for a double-sided configuration having 4 fingers per side (8 total) where the average number of fingers that contribute to a single cross scan position is equal to 3, the matrix is:

|  Side 1  |  Side 2  |

```
1 -1  0  0  0  0  0  0
0  1 -1  0  0  0  0  0
0  0  1 -1  0  0  0  0
0  0  0  0  1 -1  0  0
0  0  0  0  0  1 -1  0
0  0  0  0  0  0  1 -1
1  0 -1  0  0  0  0  0
0  1  0 -1  0  0  0  0
0  0  0  0  1  0 -1  0
0  0  0  0  0  1  0 -1
```

The constraint is then calculated by multiplying the matrix by the finger displacement (or transmissibility, for the segmented configuration). This places a constraint on the variation on the fingers affect on a "pupil" in the cross scan direction, thus reducing X axis telecentricity and ellipticity. Thus, in this embodiment, the constraint is defined by:

$$f_2(X) = \begin{cases} L*T & \text{segmented} \\ L*\Delta F & \text{double sided} \end{cases} \quad (13a)$$

where L is the constructed matrix.

Under some circumstances the constraint defined in the first embodiment might still cause unacceptable finger variations due to the compromise in finger positions (or transmissibility) required to accommodate the effect of one finger on multiple "pupils" (or cross scan coordinates). Further, the size of the matrix, L, is changed in order to obtain a set of finger locations that meet the desired uniformity specification. Therefore, in a second embodiment, the adjacent finger travel constraint is calculated using one or more polynomials fit to the finger transmissibility or finger displacements.

In the second embodiment, one or more polynomials are fit to either the finger transmissibilities or finger displacements. For the segmented configuration, P(T) be a smooth polynomial fit to the finger transmissibilities. For the double-sided configuration, $P_1(\Delta F)$ and $P_2(\Delta F)$ are polynomials fit to the finger displacements of the first and second side, respectively. If the polynomials, P, are constraint to a class of polynomials such that the telecentricity and ellipticity effects are minimized (e.g., $4^{th}$ order with only even terms). Then:

$$f_2(X) = \begin{cases} T - P(T) & \text{segmented} \\ \Delta F - \begin{bmatrix} P_1(\Delta F) \\ P_2(\Delta F) \end{bmatrix} & \text{double sided} \end{cases} \quad (13b)$$

For simplicity of notation let:

$$P(\Delta F) = \begin{bmatrix} P_1(\Delta F) \\ P_2(\Delta F) \end{bmatrix} \quad (13c)$$

Then:

$$f_2(X) = \begin{cases} T - P(T) & \text{segmented} \\ \Delta F - P(\Delta f) & \text{doublesided} \end{cases} \quad (13d)$$

For example, $$P(X) \mapsto x_n = p_4 * \phi_n^4 + p_2 * \phi_n^2 + p_0 \quad (13e)$$

n=1, 2, 3, . . . ,N

With:
$X_n$: transmissibility or displacement of the $n^{th}$ finger
$\phi_n$: middle position of the $n^{th}$ finger in the Cross Scan direction
$p_y$: coefficients of a polynomial fit of finger displacement (or transmissibility) vs. finger location in the Cross Scan direction.

Several variations of the second embodiment are possible. In one variation, the fit P(X) is calculated every time a new vector X is generated. In a second variation, one ideal fit is calculated based, for example, on the Uncorrected Uniformity Profile, and changing $p_0$ in equation (13e) as a function of the mean value of all finger variations.

2.4.1.1.3 Finger Displacement Penalty

In an embodiment, function $f_3(X)$ is a constraint that penalizes the finger displacement in order to minimize ellipticity effects in the cross scan direction. This constraint is only applicable to double-sided configurations. In an embodiment, this constraint is determined by accessing stored values for the constraint. For example, these values may be stored in a memory in the correction module. In an alternate embodiment, the constraint is determined based on functions dependent on the illumination mode and finger positions.

2.4.1.1.4 Difference in Travel of Opposing Fingers Constraint

In an embodiment, function $f_4(X)$ is the constraint that penalizes the difference in travel of opposing fingers. This constraint is only applicable to double-sided configurations.

The difference in travel of opposing fingers has a direct effect on ellipticity and telecentricity effects in the Scan direction. This constraint only applies to double-sided configurations. For example, the goal of this constraint is to make the distance that a finger on one side of the illumination slot is introduced almost the same as the distance that the opposing finger or fingers are introduced (e.g., make the insertion distances almost symmetric). In order to minimize these effects, the difference in travel of opposing fingers must be minimized in the non-staggered configuration. In the staggered configuration, the difference in travel of the average of the set of fingers opposing each finger must be minimized.

In an embodiment, for the staggered configuration, a matrix is constructed such that each row calculates the difference between the travel of opposing fingers in the first and second side. For example, if there are 4 fingers per side (8 total), the matrix is:

```
|   Side 1   |    Side 2    |
  1  0  0  0  -1   0   0   0
  0  1  0  0   0  -1   0   0
  0  0  1  0   0   0  -1   0
  0  0  0  1   0   0   0  -1
```

Similarly, in an embodiment for non-staggered configuration, a matrix is constructed such that each row calculates the difference between the distance that a finger in the first side moves and the distance that the two corresponding fingers in the second side move in average. For example, if there are 4 fingers per side (8 total), the matrix is:

```
|    Side 1     |      Side 2      |
 0.5  0.5   0    0   -0.5  -0.5   0     0
  0   0.5  0.5   0     0   -0.5  -0.5   0
  0    0   0.5  0.5    0     0   -0.5  -0.5
```

The constructed matrix is then multiplied by the finger displacements. The constraint is given by the equation:

$$f_4(\Delta F) = G * \Delta F \quad (14)$$

2.4.1.2 Weight Calculation

A constraint least squares algorithm applied to equations (10), (10a), and (10b) with the wrong choice of gains, will tend to minimize the Uniformity Profile as well as all the constraints evenly. The "correct" values for weights $W_1$, $W_2$, $W_3$, ... $W_N$, such that the Corrected Uniformity Profile meets the specifications while minimizing unwanted effects is not unique and can not be determined a priori. The algorithm described in section 2.4 uses initial values and iteratively reduces the weight values as a function of the deviation of the achieved Corrected Uniformity from the Desired Profile.

2.4.1.2.1 Example Weights

The following section describes exemplary weights that can be used with the present invention. As would be appreciated by persons of skill in the art, other weights can be used.

For example, if the correction system has adjacent fingers and if $f_2$, the constraint on adjacent finger travel (transmissibility) is defined as a matrix multiplied by the fingers travel or transmissibility, then $W_2$ can be redefined, not only as a function of the Corrected Uniformity error, but also by reducing the number of constraint adjacent fingers.

The initial values for the constraint weights with the constraints and Uniformity function are:

Note: in the following, $\|Z\|$ denotes the 2-norm of the matrix or vector Z.

$$W_1 = \begin{cases} \dfrac{\|(Y*M)\|}{\|\mathrm{Max}(T) - \mathrm{Min}(T)\|} & \text{segmented unicom} \\ \dfrac{\|Y \cdot K\|}{\|\mathrm{Max}(\Delta F)\|} & \text{doublesided} \end{cases} \quad (15a)$$

where:
min(T) minimum finger transmissibility and $\|\mathrm{Max}(T) - \mathrm{Min}(T)\|$ is the norm of the vector of the maximum transmissibility gradient for each finger max($\Delta F$) vector of the maximum distance that each finger can move $$W_2 = \begin{cases} \dfrac{\|(Y*M)\|}{\|L\|} & \text{segmented unicom} \\ \dfrac{\|(Y \cdot K)\|}{\|L\|} & \text{double sided} \end{cases} \quad (15b)$$

If the matrix approach defined by equation (10a) is considered. Notice how adding or removing rows to the matrix, L, modifies the weight's value.

$$W_3 = \begin{cases} \dfrac{\|(Y*M)\|}{TBD} & \text{segmented unicom} \\ \dfrac{\|(Y \cdot K)\|}{TBD} & \text{doublesided} \end{cases} \quad (15c)$$

And finally, $$W_4 = \begin{cases} \dfrac{\|(Y*M)\|}{\|G\|} & \text{segmented unicom} \\ \dfrac{\|(Y \cdot K)\|}{G} & \text{doublesided} \end{cases} \quad (15d)$$

Applying equations (10), (11), (13) and (14), equation (12) for the Segmented Unicom configuration can be rewritten as:

$$L(T) = \frac{1}{2} \left\| \begin{bmatrix} (Y*M) \\ W_1 * I \\ W_2 * L \\ W_3 * TBD \\ W_4 * G \end{bmatrix} T - \begin{bmatrix} D \\ 0 \\ 0 \\ TBD \\ 0 \end{bmatrix} \right\|_2^2 \quad (16a)$$

$$\mathrm{Min}(T) \leq T \leq \mathrm{Max}(T)$$

With I and 0 identity and zero vectors of the appropriate dimensions. Notice that the Matrix form of f has been chosen. In contrast, if the polynomial for described in equation (10d) is chosen:

$$L(T) = \frac{1}{2} \left\| \begin{bmatrix} (Y*M) \\ W_1*I \\ W_2*I \\ W_3*TBD \\ W_4*G \end{bmatrix} *T - \begin{bmatrix} D \\ 0 \\ P(T) \\ TBD \\ 0 \end{bmatrix} \right\|_2^2 \quad (16b)$$

Min(T)≦T≦Max(T)

For the double sided configuration:

$$L(\Delta F) = \frac{1}{2} \left\| \begin{bmatrix} (Y \cdot K)*\Psi(\Delta F)*\Omega \\ \begin{bmatrix} W_1*I \\ W_2*I \\ W_3*TBD \\ W_4*G \end{bmatrix} \end{bmatrix} *\Delta F - \begin{bmatrix} D \\ 0 \\ 0 \\ TBD \\ 0 \end{bmatrix} \right\|_2^2 \quad (16c)$$

Min(ΔF)≦ΔF≦Max(ΔF)

Using the Matrix from of $f_2$. Similarly, if the polynomial for $f_2$ is chosen:

$$L(\Delta F) = \frac{1}{2} \left\| \begin{bmatrix} (Y \cdot K)*\Psi(\Delta F)*\Omega \\ \begin{bmatrix} W_1*I \\ W_2*I \\ W_3*TBD \\ W_4*G \end{bmatrix} \end{bmatrix} *\Delta F - \begin{bmatrix} D \\ 0 \\ P(\Delta F) \\ TBD \\ 0 \end{bmatrix} \right\|_2^2 \quad (16d)$$

Min(ΔF)≦ΔF≦Max(ΔF)

Equations 15a and 15b are linear whether 15c and 15d are not, due to the polynomial fit in $f_0$.

2.4.2 EXAMPLES

2.4.2.1 Double-Sided Configurations

FIGS. 13A and 13B depict a flowchart of a method 1300 for calculating finger positions in correction system 120 having a double-sided configuration using a constraint weighted least squares (CWLS) algorithm, according to an embodiment of the invention. For ease of description, FIG. 13 is described with continued reference to the embodiment shown in FIGS. 2A and 2B. However, FIG. 13 is not limited to those embodiments.

For the double-sided configuration, multiple constraints are used in the CWLS algorithm. For example, the constraints may include a light loss constraint, difference in displacement (transmissibility) of adjacent fingers constraint, difference in travel of opposing fingers constraint, and cross scan ellipticity constraint. Each of the constraints used in the CWLS algorithm has an associated weight.

Method 1300 begins in step 1310 when the intensity versus finger position curve fit and normalization are modified to reflect the uncorrected uniformity profile In step 1315, the weight values for the constraints are calculated. The calculation of the constraint weights is described in more detail in Section 2.4.1.2.

In step 1320, a determination is made whether initial conditions are available. If initial conditions are available, operation proceeds to step 1340. If no initial conditions are available, operation proceeds to step 1325.

In step 1325, finger positions are calculated using the CWLS algorithm with the finger's minimum travel as initial conditions and no constraints. The calculation of finger positions using the CWLS algorithm is described in further detail in section 2.4.1.

In step 1330, finger positions are calculated using CWLS algorithm with the finger's maximum travel as initial conditions and no constraints. The calculation of finger positions using the CWLS algorithm is described in further detail in section 2.4.1.

In step 1335, initial conditions are selected. In an embodiment, the finger displacement from the displacements calculated in steps 1325 and 1330 that yields the best uniformity correction is selected as initial condition for the CWLS algorithm.

In step 1340, the finger positions are calculated using CWLS algorithm. The calculation of finger positions using the CWLS algorithm is described in further detail in section 2.4.1.

In step 1345, a determination is made whether the uniformity specification is met. In an embodiment, the uniformity specification used in this step is the measured uniformity. In an alternate embodiment, the uniformity specification used is the calculated uniformity. If the uniformity specification is met, method 1300 ends. If the uniformity specification is not met, operation proceeds to step 1350.

In step 1350, the weight of the constraints are reduced in proportion to the magnitude of the corrected uniformity error from the specification.

In step 1355, a determination is made whether any of the constraints is below a minimum value. If the constraints are not below a minimum value, operation returns to step 1340. If the constraints are below a minimum value, operation proceeds to step 1360.

In step 1360, the number of consecutive fingers in the cross scan direction whose difference in travel is penalized is decreased.

In step 1365, a determination is made whether the constraints are removed completely. If the constraints are removed completely operation proceeds to step 1370. If the constraints are not removed completely, operation returns to step 1340.

In step 1370, the constraint weights are set to zero. Operation returns to step 1340.

2.4.2.2 Segmented Configuration

FIG. 14 depicts a flowchart of a method 1400 for calculating finger positions in correction system 120 having a segmented configuration using a constraint weighted least squares (CWLS) algorithm, according to an embodiment of the invention. For ease of description, FIG. 14 is described with continued reference to the embodiment shown in FIGS. 3. However, FIG. 14 is not limited to those embodiments.

For the segmented configuration, one or more constraints are used in the CWLS algorithm. For example, the constraints may include a light loss constraint, difference in displacement (transmissibility) of adjacent fingers constraint, and a cross scan ellipticity constraint. Each of the constraints used in the CWLS algorithm has an associated weight.

Method 1400 begins in step 1410 when the intensity of the area potentially covered by each finger when the finger is not present is modified to reflect the uncorrected uniformity profile.

In step 1420, the weight values for the constraints are calculated. The calculation of the constraint weights is described in more detail in Section 2.4.1.

In step 1430, the finger positions are calculated using CWLS algorithm. The calculation of finger positions using the CWLS algorithm is described in further detail in section 2.4.1.

In step 1440, a determination is made whether the uniformity specification is met. In an embodiment, the uniformity specification used in this step is the measured uniformity. In an alternate embodiment, the uniformity specification used is the calculated uniformity. If the uniformity specification is met, method 1400 ends. If the uniformity specification is not met, operation proceeds to step 1450.

In step 1450, the weight of the constraints are reduced in proportion to the magnitude of the corrected uniformity error from the specification.

In step 1460, a determination is made whether any of the constraints is below a minimum value. If the constraints are not below a minimum value, operation returns to step 1430. If the constraints are below a minimum value, operation proceeds to step 1470.

In step 1470, the number of consecutive fingers in the cross scan direction whose difference in travel is penalized is decreased.

In step 1480, a determination is made whether the constraints are removed completely. If the constraints are removed completely, operation proceeds to step 1490. If the constraints are not removed completely, operation returns to step 1430.

In step 1490, the constraint weights are set to zero. Operation returns to step 1430.

2.5 Oscillations in Finger Positions or Transmissibilities

Under certain circumstances, the average value of the Desired Corrected Uniformity Profile might cause undesired oscillations in the finger positions or transmissibilities including higher telecentricity and ellipticity. For ease of description, the reason for these oscillations is described through an example.

For the case of a quadruple "pupil" where the intensity integral at each cross scan coordinate is a function of the transmissibility of two adjacent fingers, assume that the desired corrected uniformity profile is flat and equal to the minimum value of the uncorrected uniformity profile. Then the fingers that affect the corrected profile at the coordinate of the desired value must have 100% transmission. However, at least one of these fingers also influences the integral of the intensity at neighboring cross scan coordinates that need to be attenuated. Therefore, the transmissibility of at least one other finger must be lowered in order to compensate for the finger with 100% transmissibility. Further, another finger (or set of fingers) must have a higher transmission in order to compensate for the greater attenuation of the finger(s) neighboring the 100% transmission ones. In this case, the oscillation continues. Alternatively, if the desired uniformity profile is such that no finger or set of fingers is forced to have 100% transmission, this effect is eliminated.

Figure 17B:
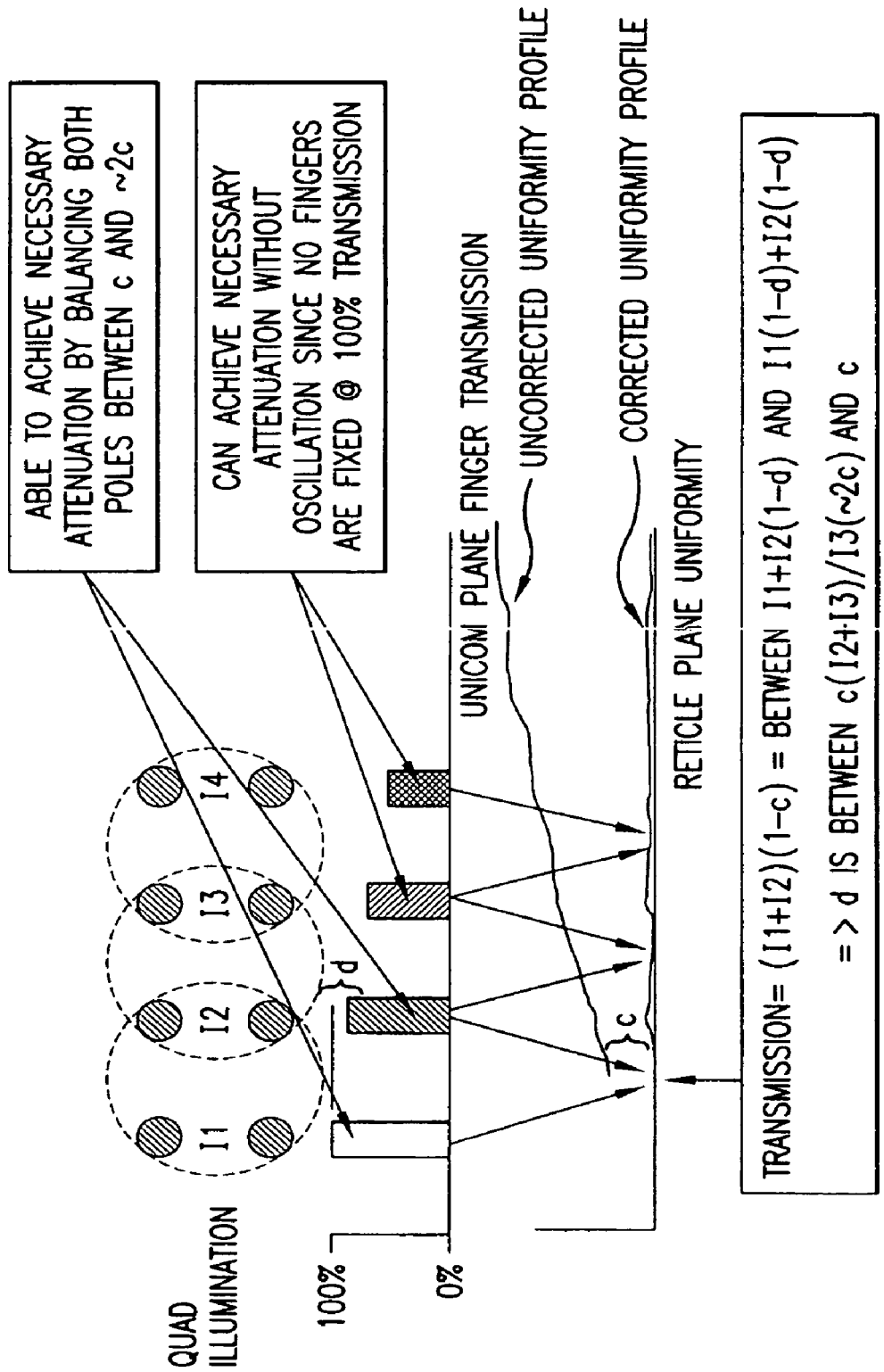
Figure 18A:
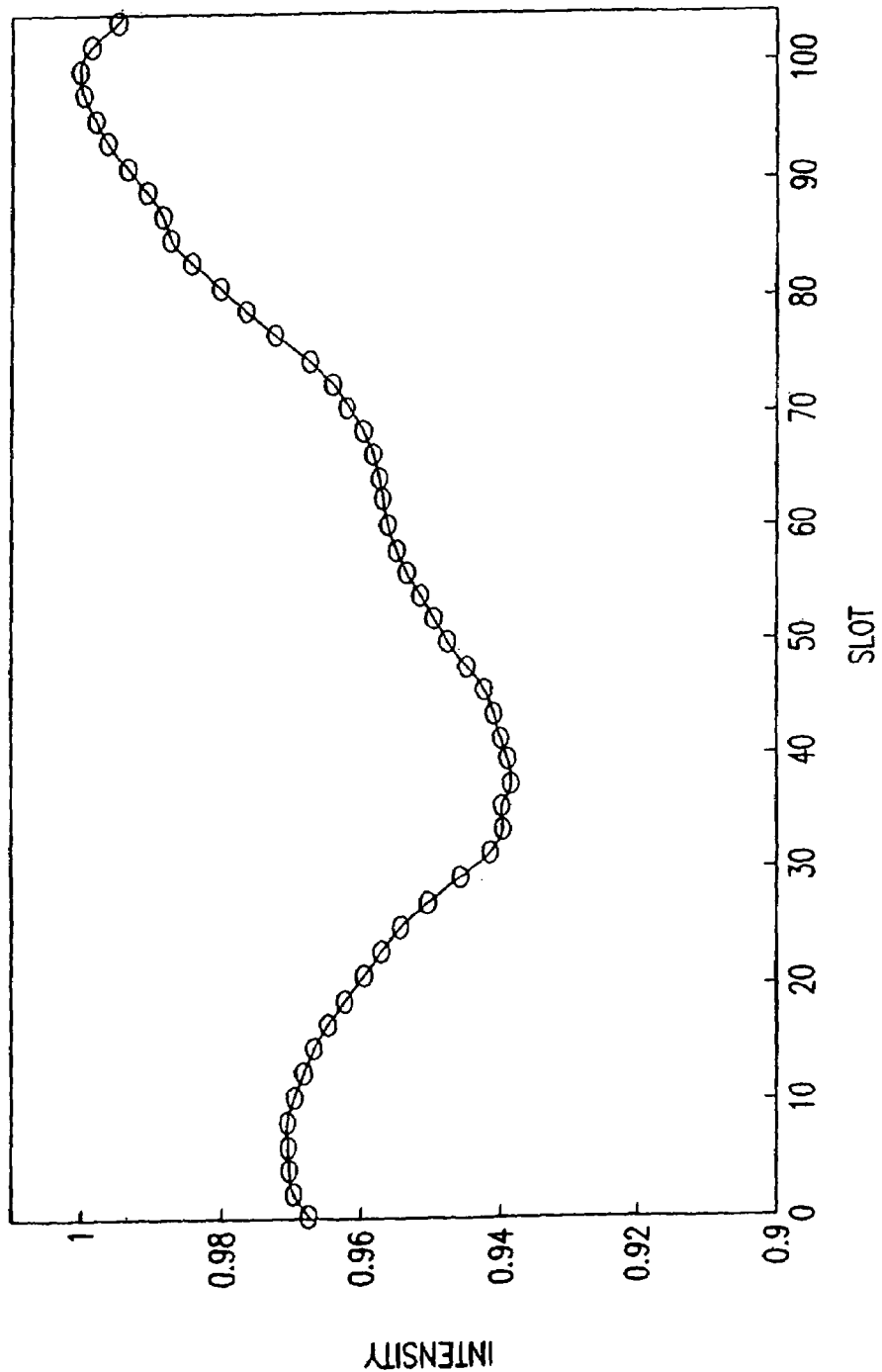
Figure 18B:
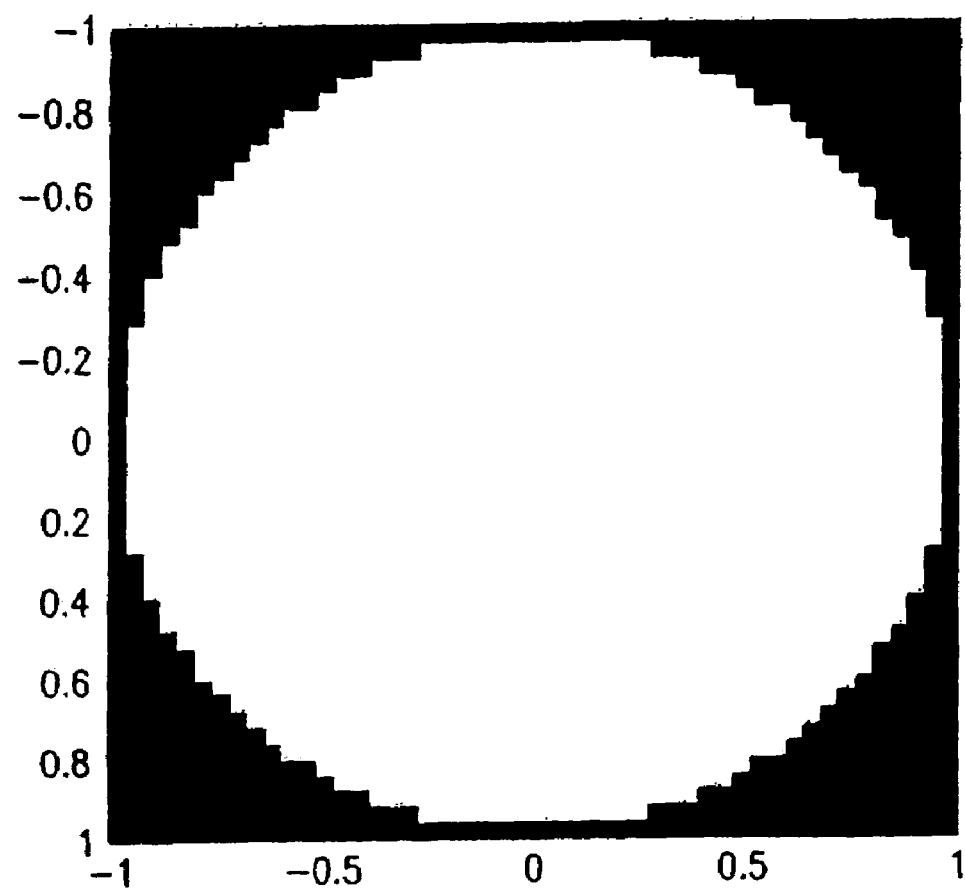
Figures 18C, 18D:
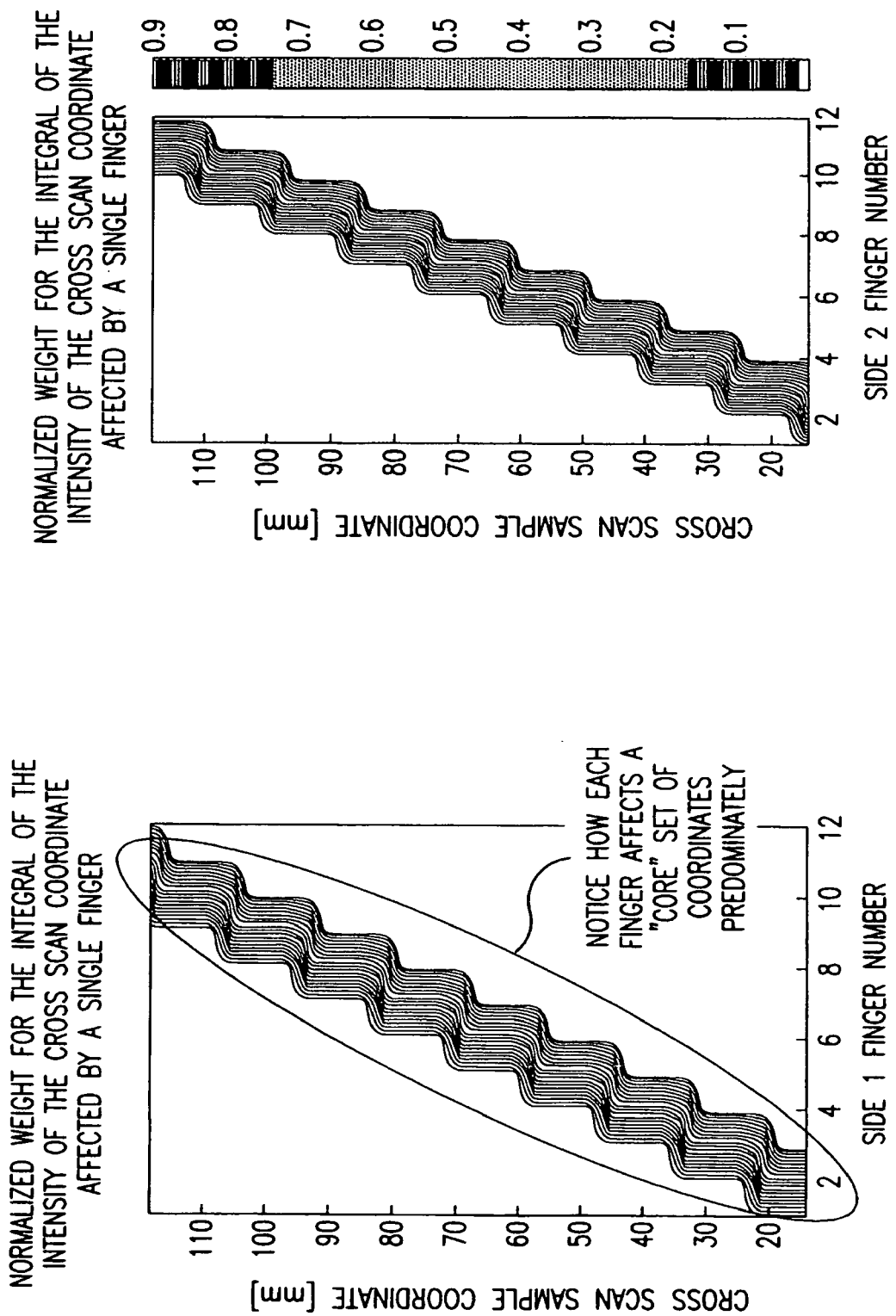
Figure 18F:
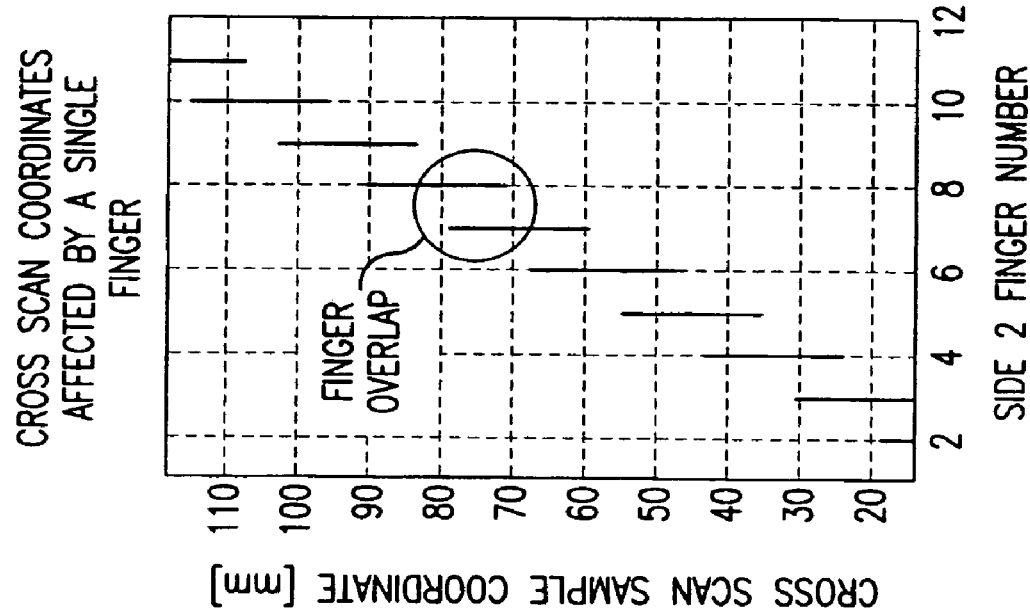
Figure 18E:
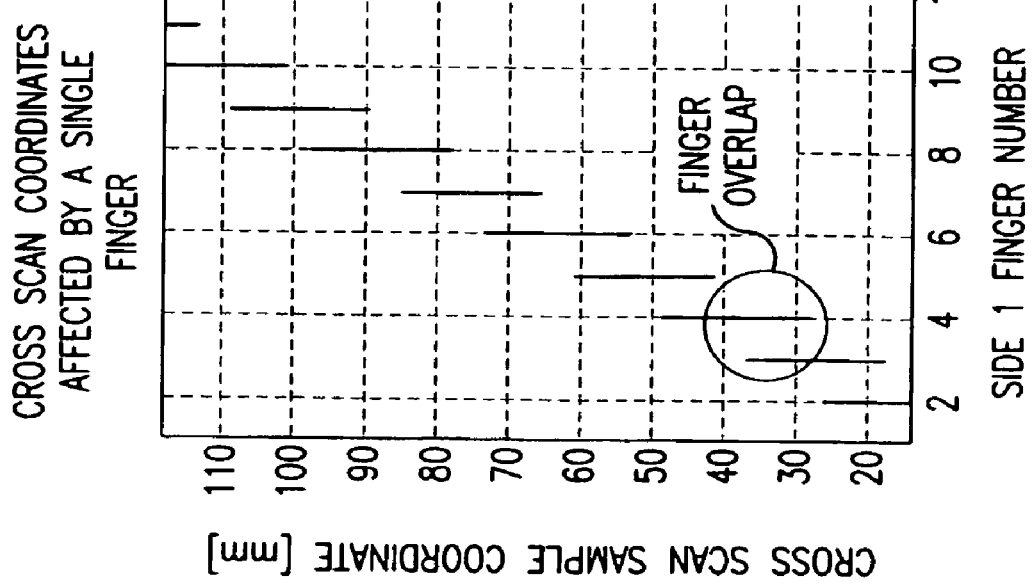
Figure 18H:
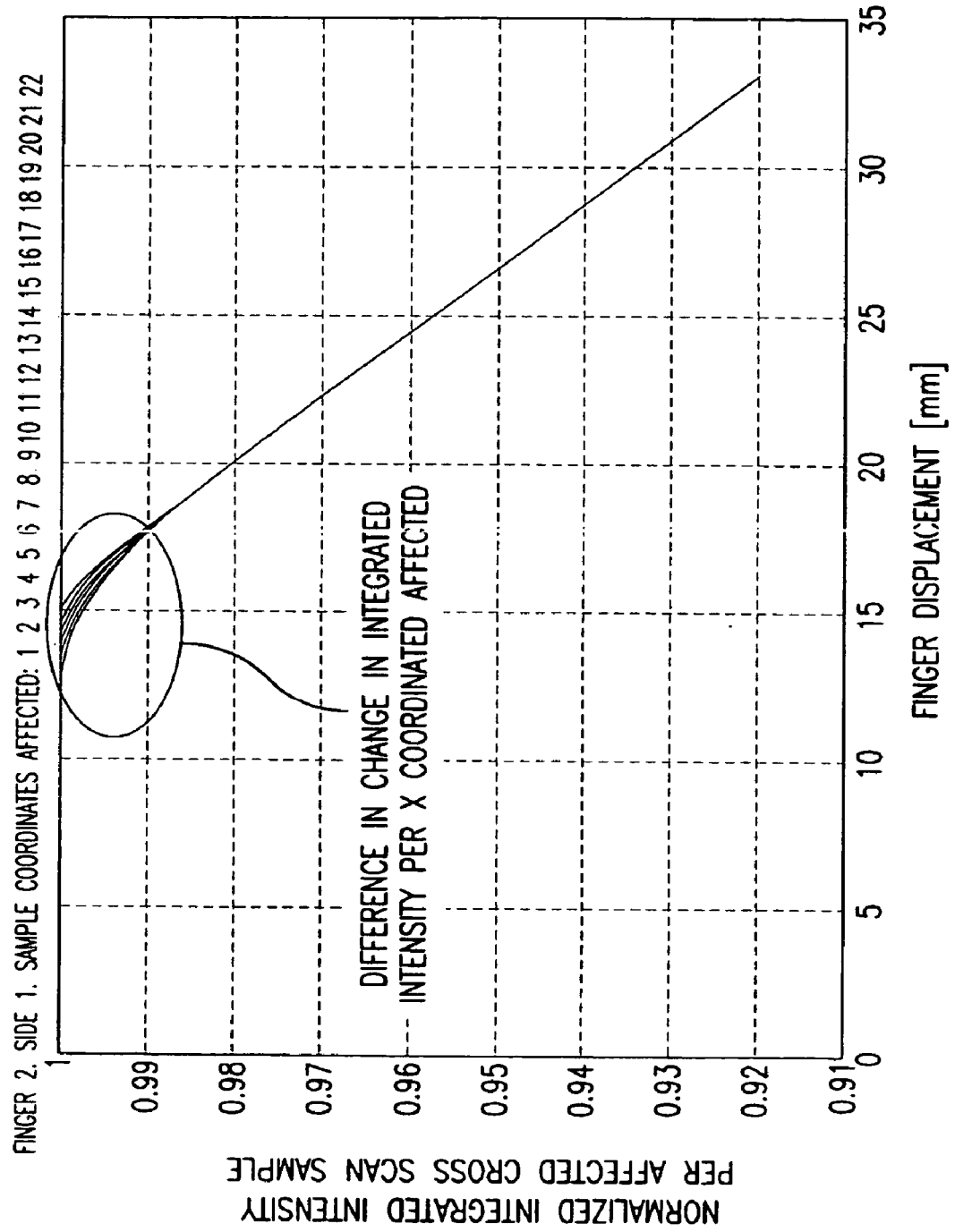
Figure 19A:
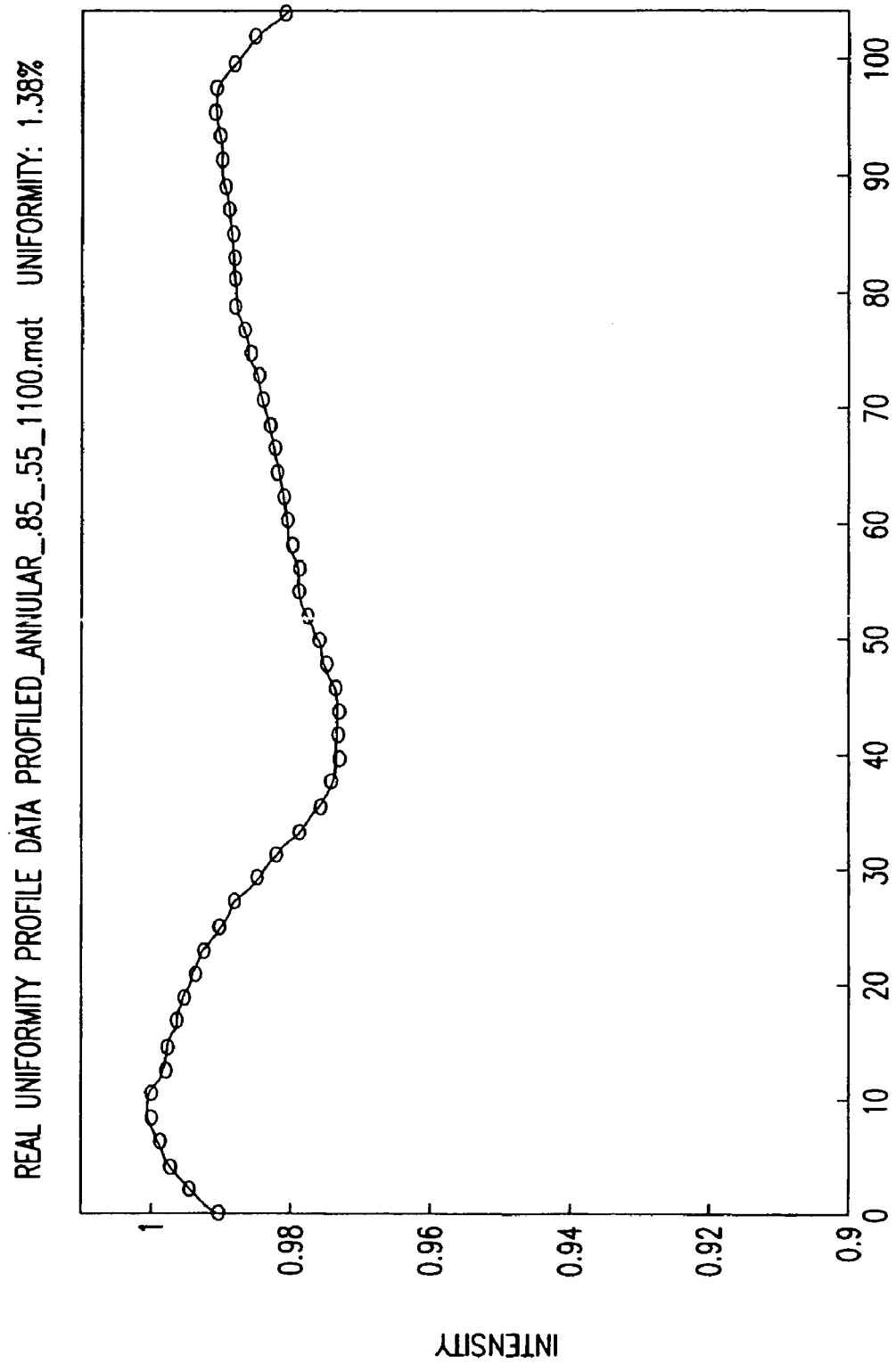
Figure 19B:
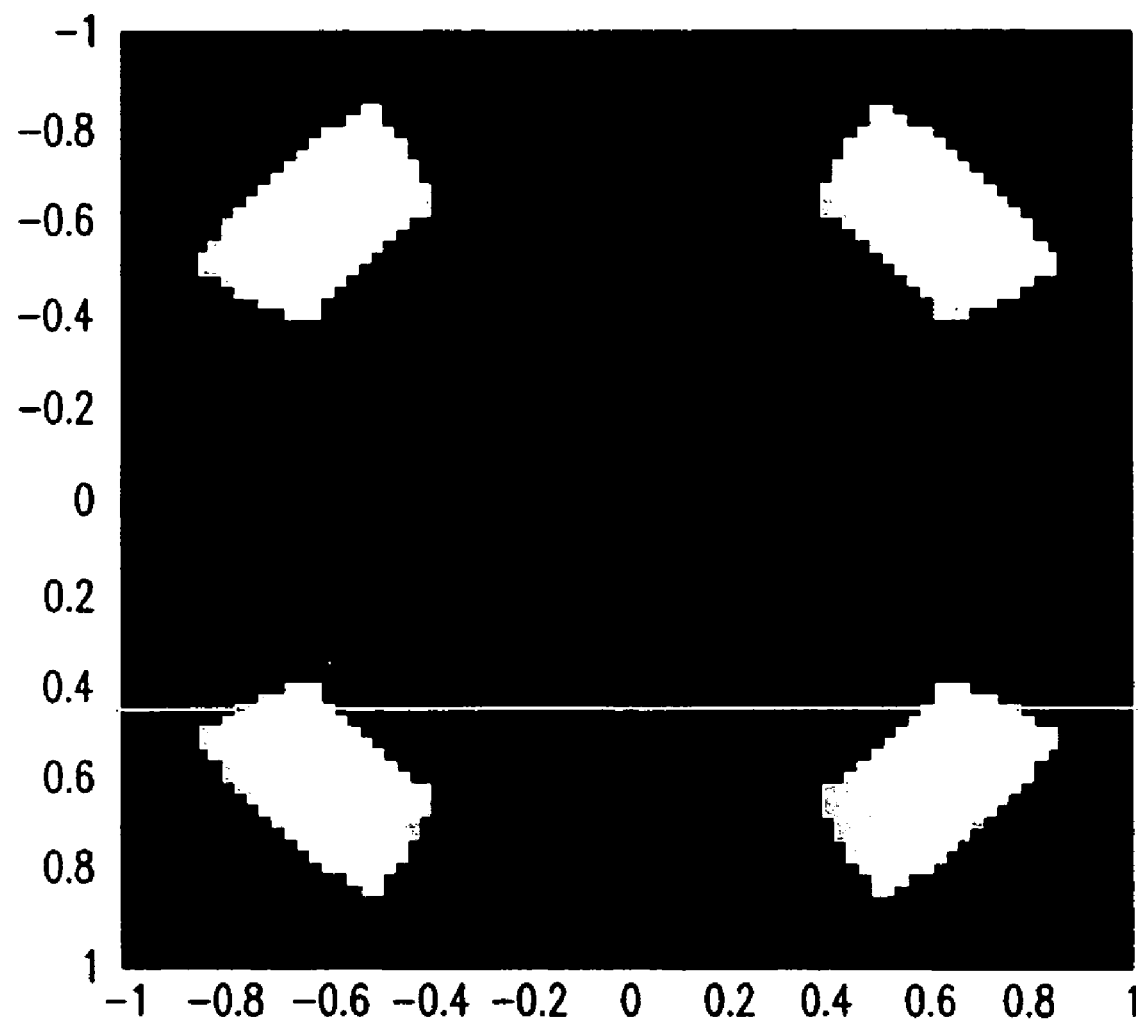
Figure 19D:
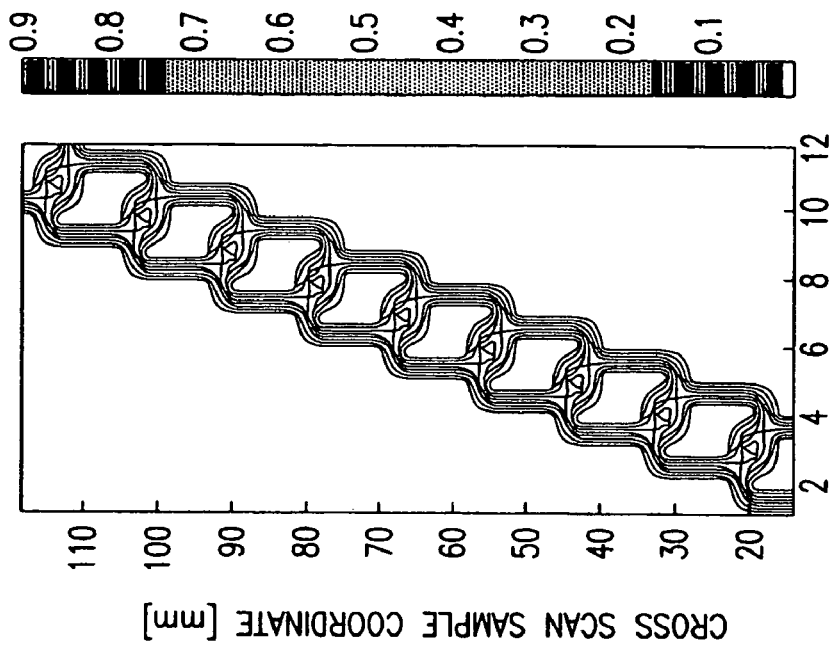
Figure 19C:
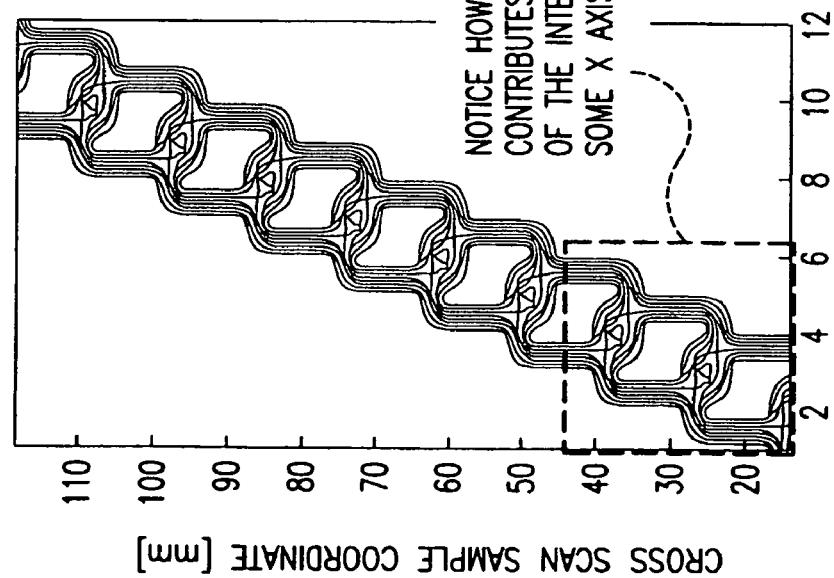
Figure 19E:
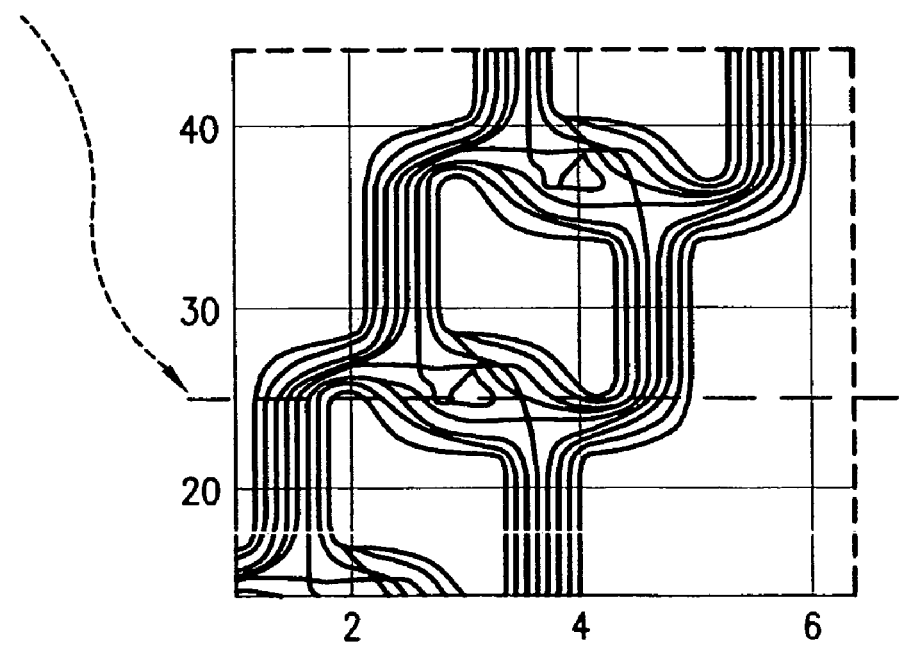
Figure 19G:
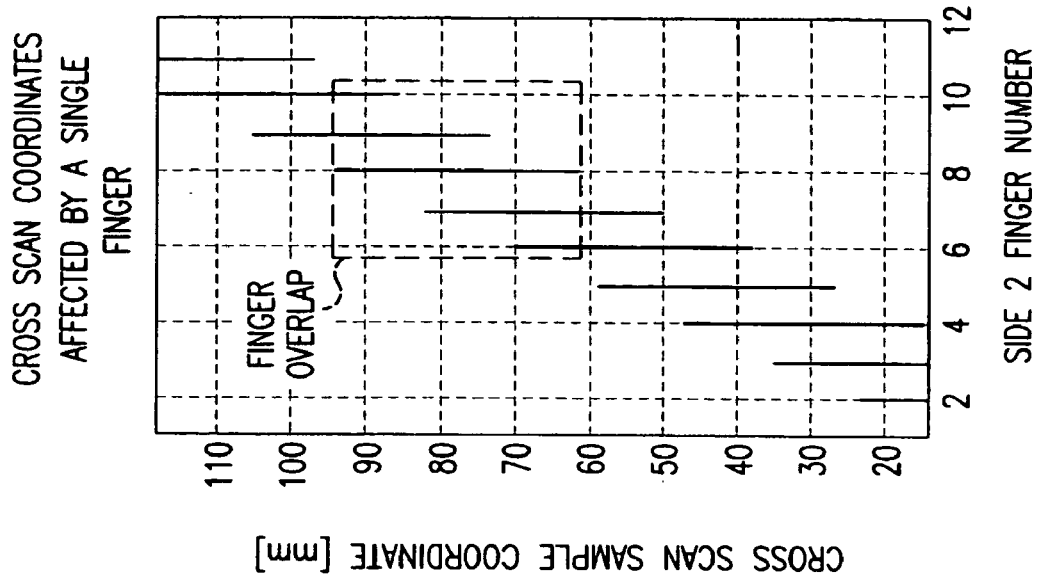
Figure 19F:
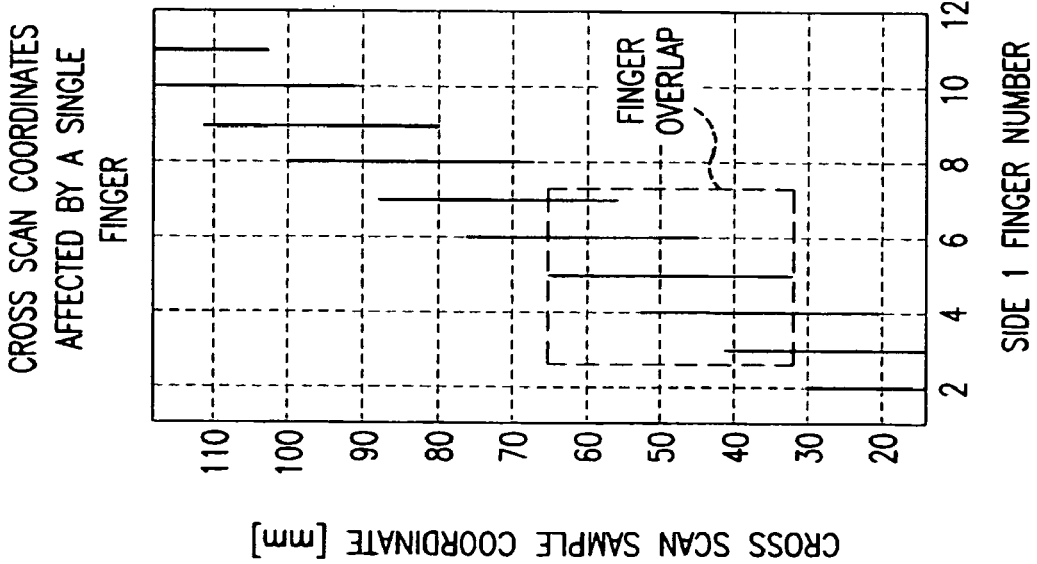
Figure 19H:
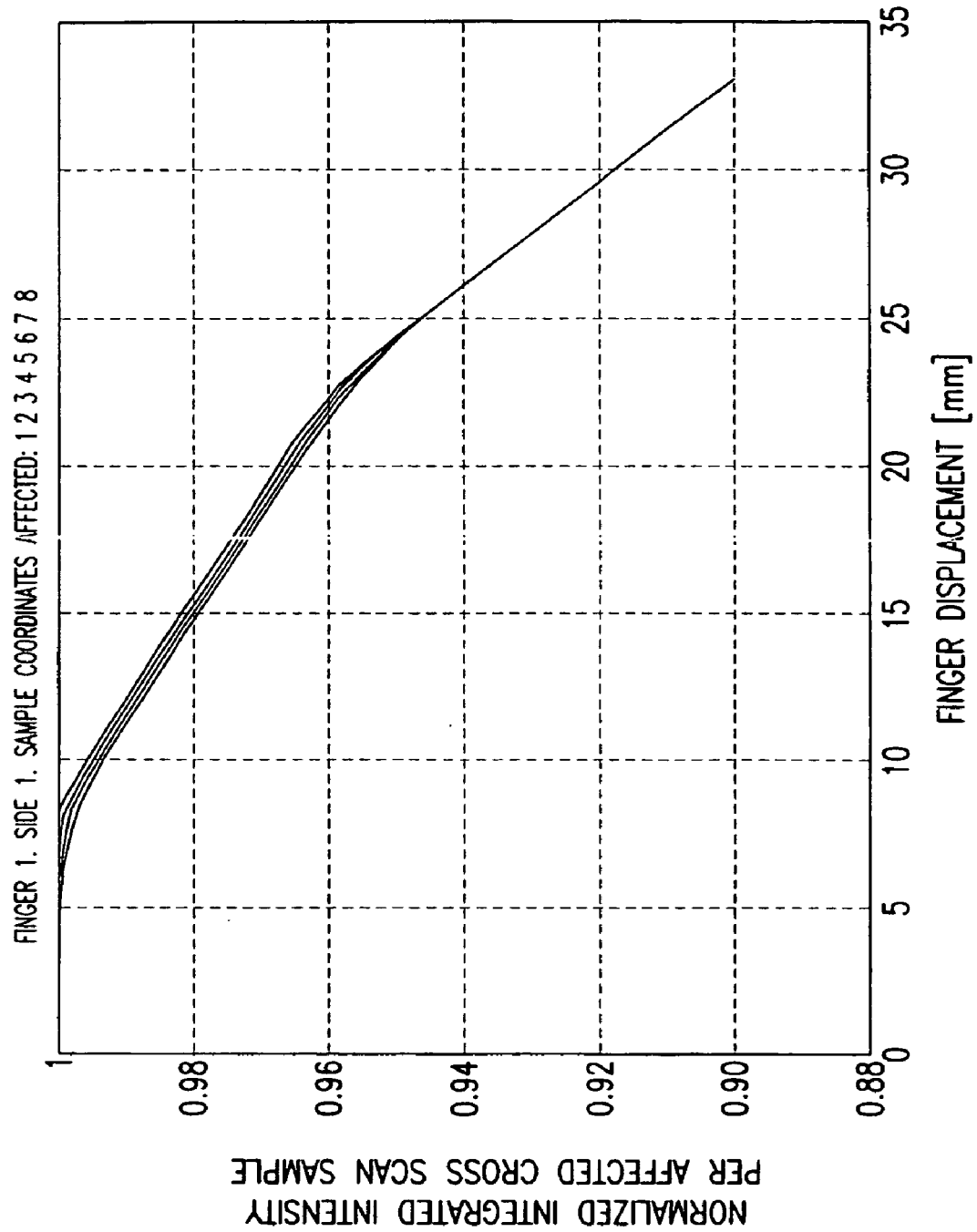
Figure 191:
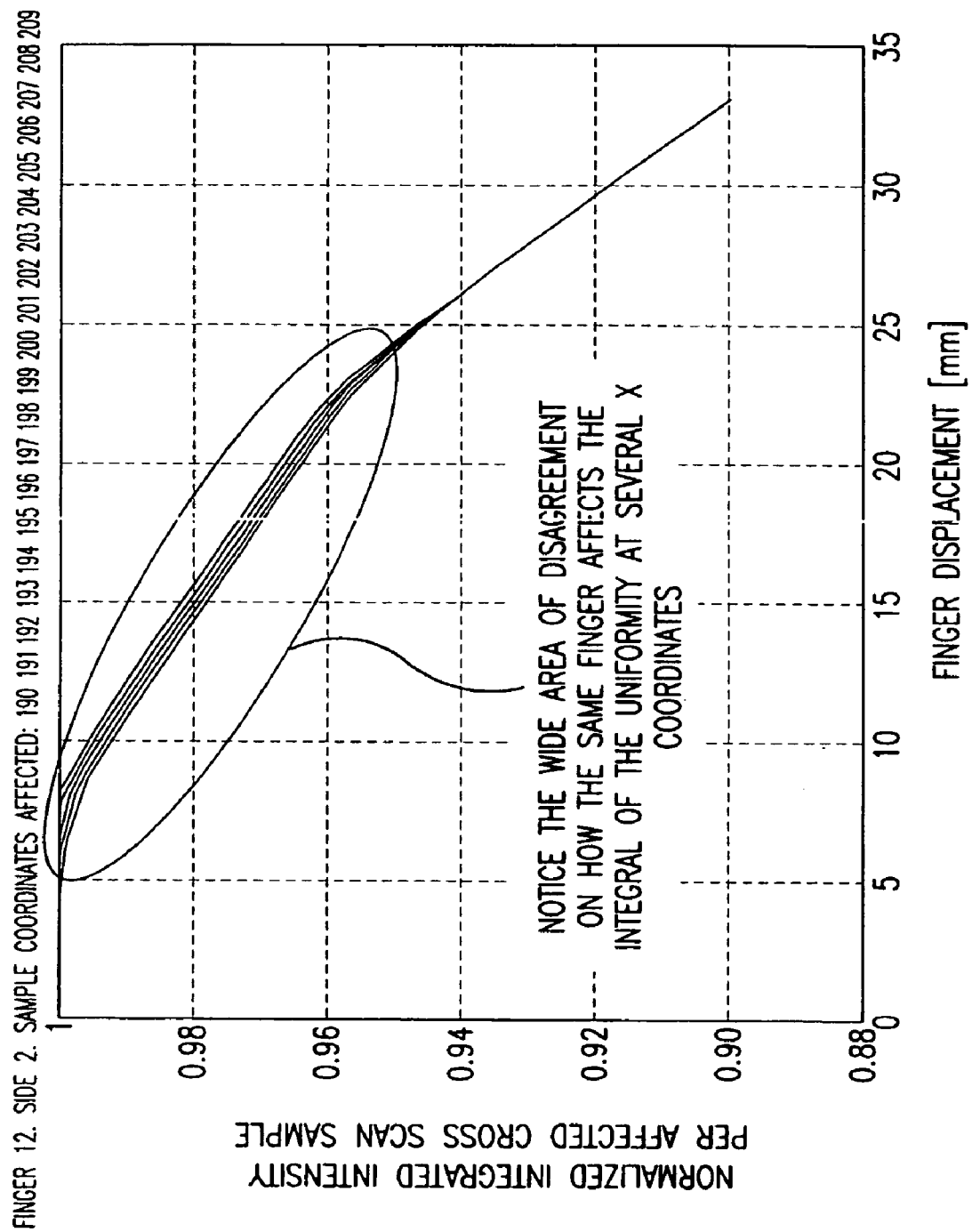
Figure 20A:
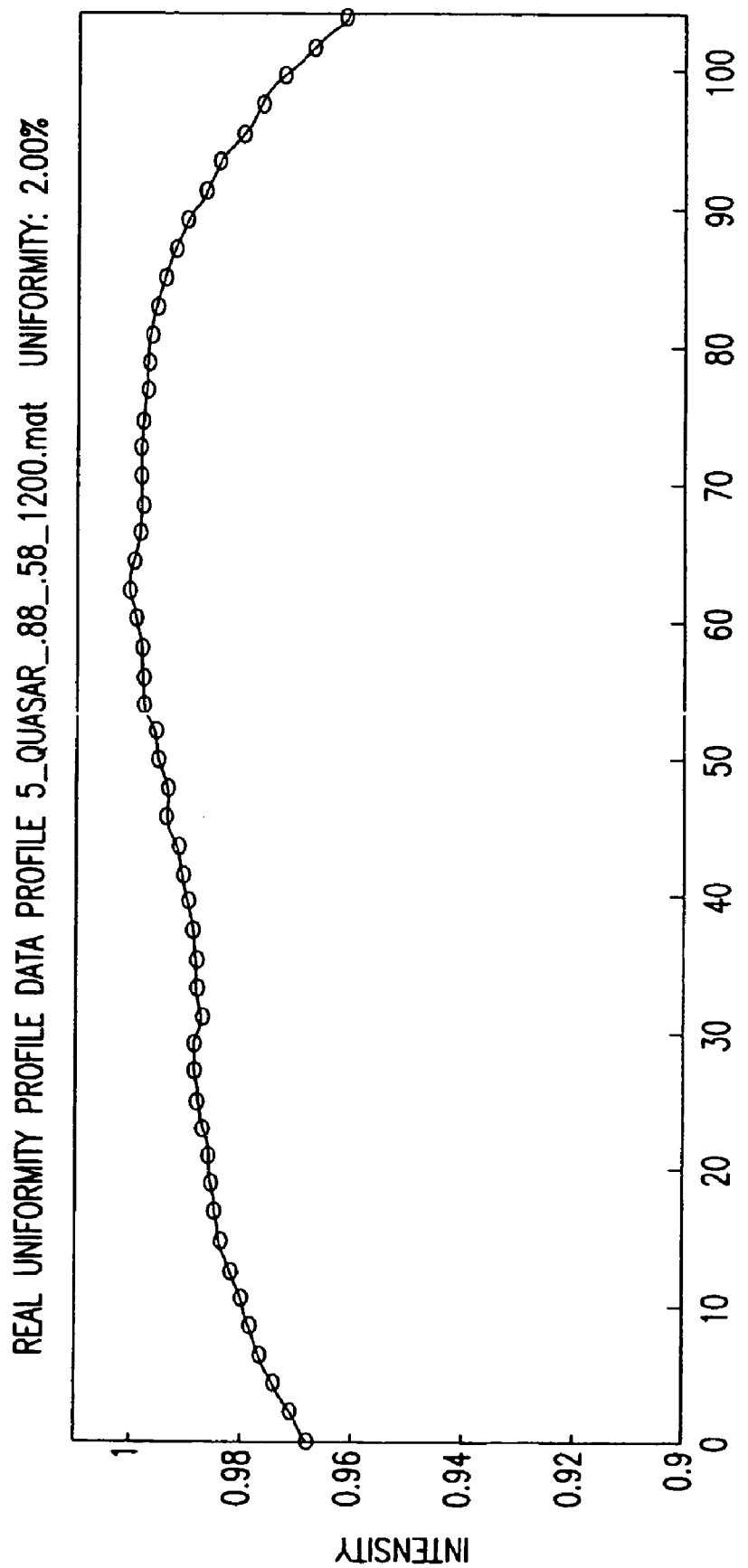
Figure 20B:
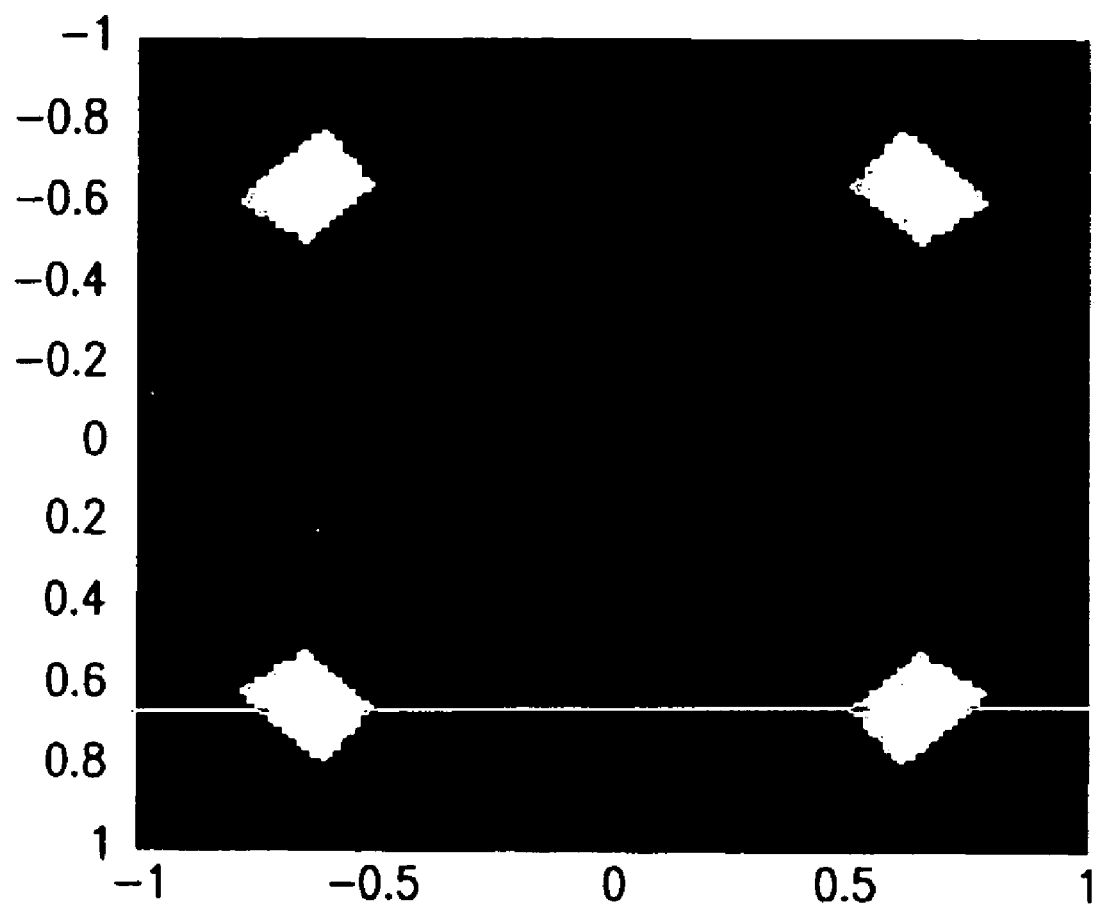
Figure 20D:
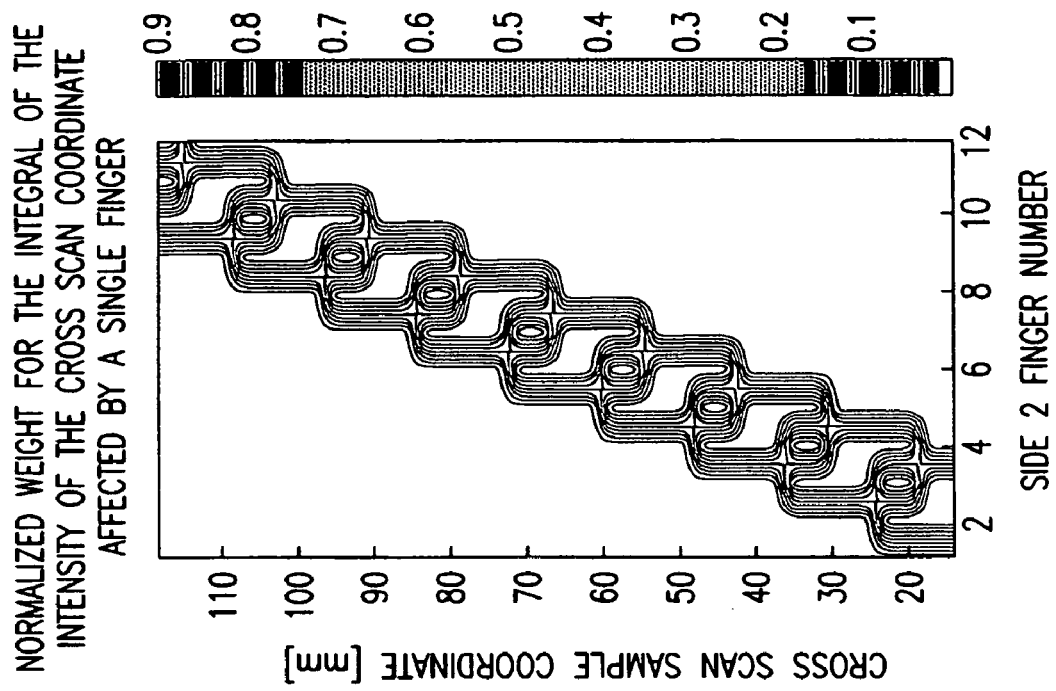
Figure 20C:
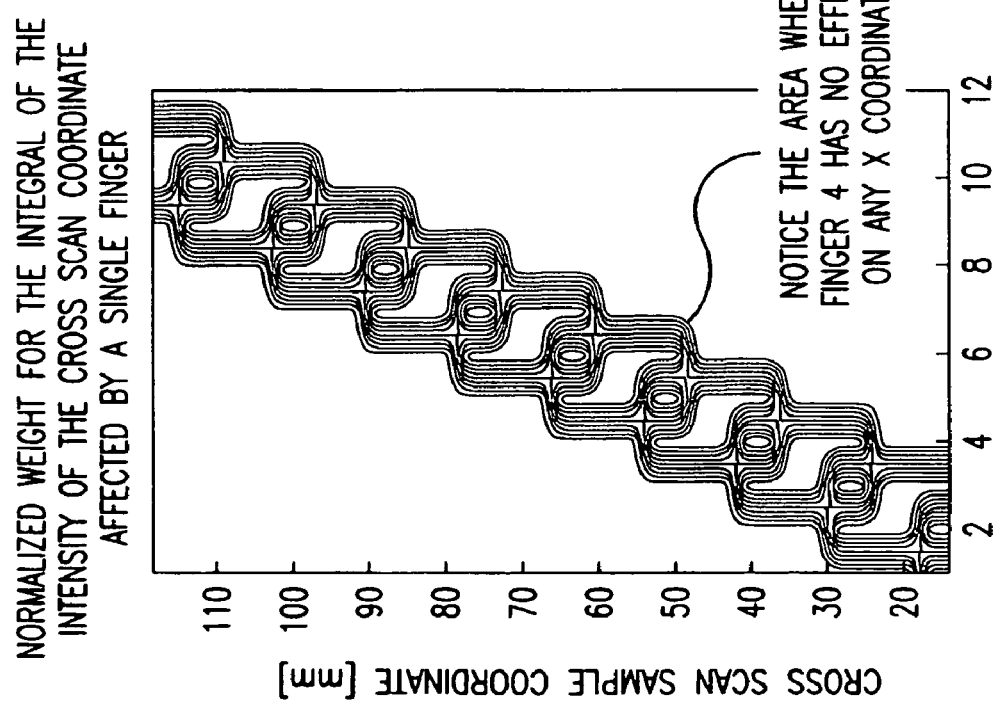
Figure 20F:
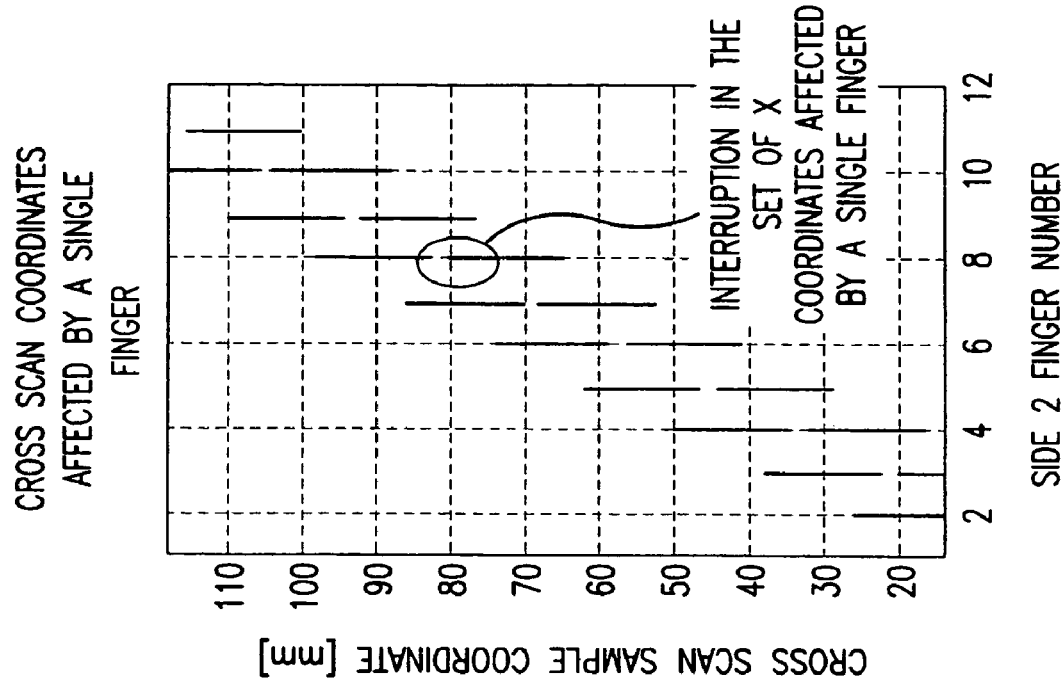
Figure 20E:
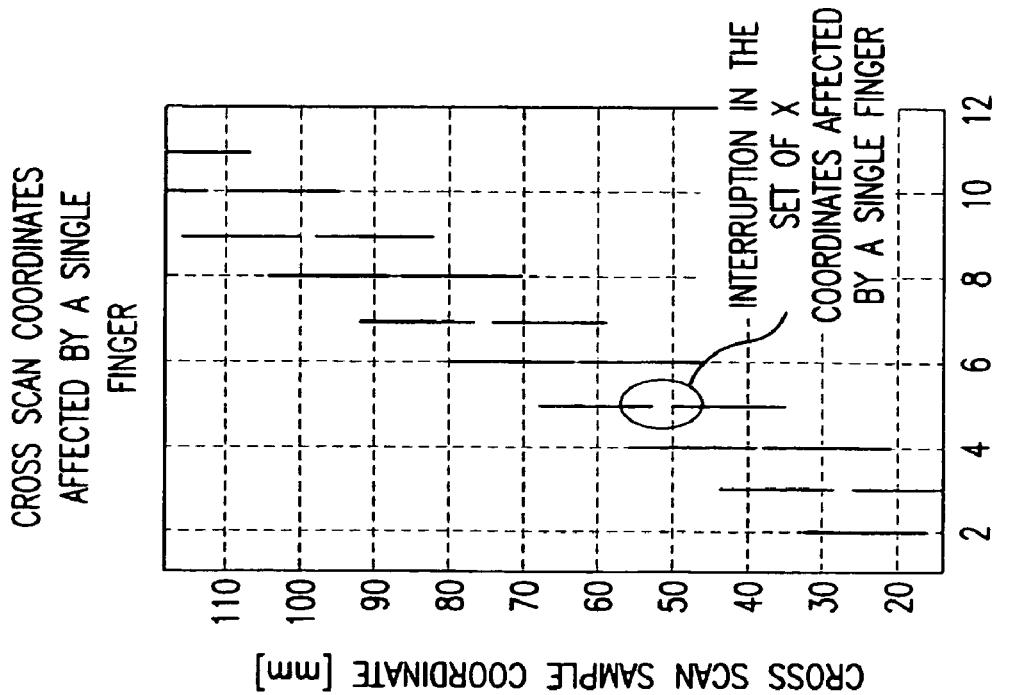
Figure 20H:
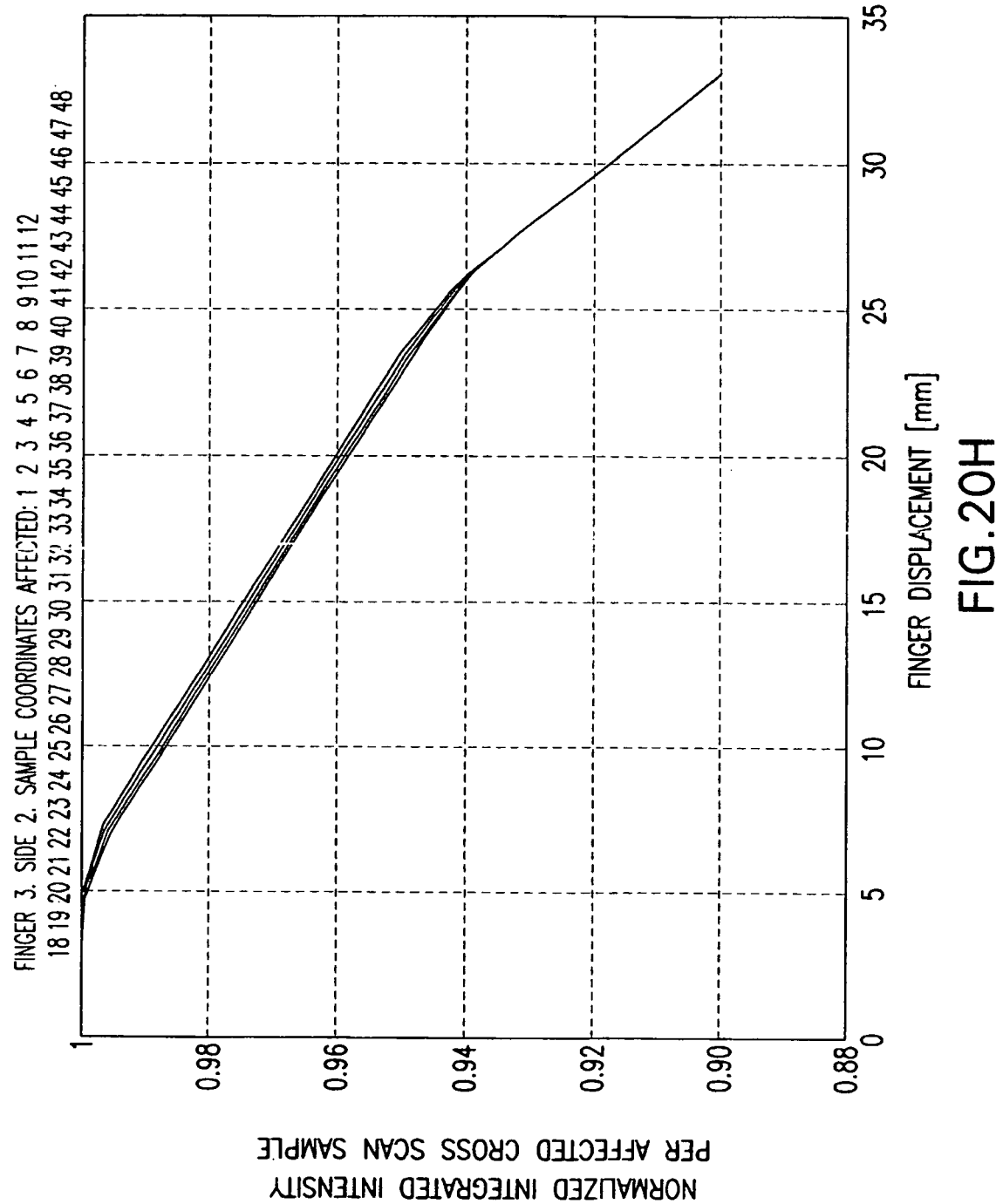

FIGS. 17A and B illustrate this example. FIG. 17A depicts how finger transmissibility oscillation is generated. FIG. 17B depicts a case where, at the cost of greater light loss, this unwanted effect is avoided. In FIG. 17, 1710*a-d* are the integral of the intensity as seen by four fingers. Three "pupils" 1720*a-c* are shown. The first "pupil" 1720*a* has poles that contribute to 1710*a* and 1710*b*. The second "pupil" 1720*b* has poles that contribute to 1710*b* and 1710*c*. The third "pupil" 1720*c* has poles that contribute to 1710*c* and 1710*d*. The value of the corrected profile is computed at the center of these "pupils".

Similar effects occur for a variety of "pupil" shapes. In general, finger positioning or transmission oscillations are present when more than one finger contributes considerably to the integral of the intensity at every cross scan coordinate and the desired uniformity profile forces a set of fingers to have 100% transmissibility. In the case of double-sided configuration of fingers, this means that the fingers need to be at their home position.

2.6 Light Loss

Even though the least squares fit described in Section 2.4 penalizes light loss in an embodiment by reducing the weight on the constraint, additional light can be gained after the final adjustment values have been calculated. The exemplary methods shown in FIGS. 15 and 16 are used to reduce the amount of light loss by increasing the average transmissibility of the module while the uniformity specification is still met.

FIG. 15 depicts a flowchart of an exemplary method 1500 for light loss reduction for a double sided configuration, according to an embodiment of the present invention.

In step 1510, the intensity versus finger position curve fit and normalization is modified to reflect the uncorrected uniformity profile.

In step 1520, the delta finger displacement is initialized. In an embodiment, the delta finger displacement is set to the minimum finger displacement.

In step 1530, the displacement of each finger is decreased by the delta finger displacement.

In step 1540, the corrected uniformity is calculated.

In step 1550, a determination is made whether the corrected uniformity meets the uniformity specification. If the corrected uniformity does meet the uniformity specification, method 1500 ends. If the corrected uniformity does not meet the uniformity specification, operation proceeds to step 1560.

In step 1560, the value of the delta displacement is decreased. Operation then returns to step 1530.

Steps 1530, 1540, 1550, and 1560 are repeated until the uniformity specification is met.

FIG. 16 depicts a flowchart of an exemplary method 1600 for light loss reduction for a segmented configuration, according to an embodiment of the present invention.

In step 1610, the intensity of the area potentially covered by each finger when the finger is not present is modifies to reflect the uncorrected uniformity profile.

In step 1620, the delta finger transmissibility is initialized. In an embodiment, the delta finger transmissibility is set to the maximum finger transmissibility minus the maximum allowed transmissibility.

In step 1630, the transmissibility of each finger is increased by the delta finger transmissibility.

In step 1640, the corrected uniformity is calculated.

In step 1650, a determination is made whether the corrected uniformity meets the uniformity specification. If the corrected uniformity does meet the uniformity specification, method 1600 ends. If the corrected uniformity does not meet the uniformity specification, operation proceeds to step 1560.

In step 1660, the value of the delta transmissibility is increased. Operation then returns to step 1630.

Steps 1630, 1640, 1650, and 1660 are repeated until the uniformity specification is met.

2.7 Modification to the Uncorrected Uniformity Profile

The following equations describe a method for modifying the uncorrected uniformity profile based on measurements (step 460 of FIG. 4). This method is initiated when measurements show that the desired uniformity correction has not be achieved.

From equation (7), the measured intensity integral at the $k^{th}$ coordinate $\xi_k^m$ is:

$$\xi_k^m = \hat{v}_k * \left[ \left( T_1(F_1) * \sum_{J1k} \sum_{O1k} \sum_{P1k} \gamma_{o,p}^{j,k} \right) + \left( T_1(F_1) * \sum_{J2k} \sum_{O2k} \sum_{P2k} \gamma_{o,p}^{j,k} \right) + \ldots + \left( T_n(F_n) * \sum_{j=Jnk} \sum_{Onk} \sum_{Pnk} \gamma_{o,p}^{j,k} \right) + \left( \sum_{J^*1k} \sum_{O^*1k} \sum_{P^*1k} \gamma_{o,p}^{j,k} \right) + \left( \sum_{J^*2k} \sum_{O^*2k} \sum_{P^*2k} \gamma_{o,p}^{j,k} \right) + \ldots + \left( \sum_{J^*nk} \sum_{O^*nk} \sum_{P^*nk} \gamma_{o,p}^{j,k} \right) \right] \quad (17a)$$

And the uncorrected intensity integral at the same coordinate is:

$$\xi_k^0 = v_k * \left[ \left( \sum_{J^*1k} \sum_{O^*1k} \sum_{P^*1k} \gamma_{o,p}^{j,k} \right) + \left( \sum_{J^*2k} \sum_{O^*2k} \sum_{P^*2k} \gamma_{o,p}^{j,k} \right) + \ldots + \left( \sum_{J^*nk} \sum_{O^*nk} \sum_{P^*nk} \gamma_{o,p}^{j,k} \right) \right] \quad (17b)$$

Where:
- Jik index of all "pupils" at $a_k$ affected by the $i^{th}$ finger (i.e., finger "i" covers at least one pixel of the "pupil" centered at $(a_k, b_{ji})$ such that $j_i \in Jik$). For simplicity of notation, this set of "pupils" is noted as the "pupils" centered at $(a_k, b_{Jik})$.
- J*ik index of all "pupils" at $a_k$ not affected by the $i^{th}$ finger (i.e., finger "i" does not cover any pixels of the "pupil" centered at $(a_k, b_{ji})$ such that $j_i \in J^*ik$). For simplicity of notation, this set of "pupils" is noted as the "pupils" centered at $(a_k, b_{Jik})$.

Notice that the union of the sets Jik and J*ik is equal to all possible indexes of "pupils" centered at $(a_k, b_j)(j=1, 2, 3, \ldots, J)$. Further, the indexes contained in Jik and J*ik are not necessarily sequential.

Oik and Pik are the index for all the pixels of the "pupils" centered at $(c^{jik,k}_o, d^{jik,k}_p)$ covered by finger "i".

O*ik and P*ik are the index for all the pixels of the "pupils" centered at $(c^{jik,k}_o, d^{jik,k}_p)$ not covered by finger "i".

Then, the uncorrected uniformity profile can be recalculated at every k coordinate as:

$$\hat{\xi}_k^0 = \frac{\xi_k^m * \left[ \left( \sum_{J^*1k} \sum_{O^*1k} \sum_{P^*1k} \gamma_{o,p}^{j,k} \right) + \left( \sum_{J^*2k} \sum_{O^*2k} \sum_{P^*2k} \gamma_{o,p}^{j,k} \right) + \ldots + \left( \sum_{J^*nk} \sum_{O^*nk} \sum_{P^*nk} \gamma_{o,p}^{j,k} \right) \right]}{\left[ \left( T_1(F_1) * \sum_{J1k} \sum_{O1k} \sum_{P1k} \gamma_{o,p}^{j,k} \right) + \left( T_2(F_2) * \sum_{J2k} \sum_{O2k} \sum_{P2k} \gamma_{o,p}^{j,k} \right) + \ldots + \left( T_n(F_n) * \sum_{j=Jnk} \sum_{Onk} \sum_{Pnk} \gamma_{o,p}^{j,k} \right) + \left( \sum_{J^*1k} \sum_{O^*1k} \sum_{P^*1k} \gamma_{o,p}^{j,k} \right) + \left( \sum_{J^*2k} \sum_{O^*2k} \sum_{P^*2k} \gamma_{o,p}^{j,k} \right) + \ldots + \left( \sum_{J^*nk} \sum_{O^*nk} \sum_{P^*nk} \gamma_{o,p}^{j,k} \right) \right]} \quad (17c)$$

Where both, the numerator and denominator of (above equation) are available and defined in equations (6) and (7). In the segmented configuration, the denominator is equal to the elements of the vector M*T and the numerator is equal to the row by row product of measured corrected uniformity vector and M*max(T). Where max(T) is the maximum transmissibility of the every finger.

For the double sided configuration, the numerator is equal to the row by row product of measured corrected uniformity vector times $K*\Omega$. The denominator is equal to $\Psi(\Delta F)$.

Or:

$$\hat{\Xi}_0(X) = \begin{cases} \Xi_m \cdot (M * \text{Max}(T)) \div (M * T) & \text{segmented unicom} \\ \Xi_m \cdot (K * \Omega) \div [\Psi(\Delta F) \cdot K] * \Omega] & \text{doublesided} \end{cases} \quad (17d)$$

Where "∘" indicates an element multiplication and "÷" an element by element division. Then, a new set of finger positions (transmissibilities) can be calculated using the new weighting matrix Y defined as:

$$\hat{v}_k = \frac{\xi_k^m}{\left[ \left( T_1(F_1) * \sum_{J1k} \sum_{O1k} \sum_{P1k} \gamma_{o,p}^{j,k} \right) + \left( T_2(F_2) * \sum_{J2k} \sum_{O2k} \sum_{P2k} \gamma_{o,p}^{j,k} \right) + \ldots + \left( T_n(F_n) * \sum_{j=Jnk} \sum_{Onk} \sum_{Pnk} \gamma_{o,p}^{j,k} \right) + \left( \sum_{J^*1k} \sum_{O^*1k} \sum_{P^*1k} \gamma_{o,p}^{j,k} \right) + \left( \sum_{J^*2k} \sum_{O^*2k} \sum_{P^*2k} \gamma_{o,p}^{j,k} \right) + \ldots + \left( \sum_{J^*nk} \sum_{O^*nk} \sum_{P^*nk} \gamma_{o,p}^{j,k} \right) \right]} \quad (18a)$$

Or:

$$\hat{Y} = \begin{cases} \Xi_m \div (M * T) & \text{segmented unicom} \\ \Xi_m \div [\Psi(\Delta F) \cdot K] * \Omega] & \text{doublesided} \end{cases} \quad (18b)$$

As would be appreciated by persons of skill in the art, other methods for modifying the uncorrected uniformity profile based on measurements can be used with the present invention.

3. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for uniformity correction for use in an optics system having a uniformity correction sub-system and a correction module which is located in a defocused plane, wherein the correction module has a plurality of adjustable components, wherein the plurality of adjustable components comprises a set of adjustable fingers configured to extend into an aperture, comprising:
   (a) generating a map that represents the effect of the plurality of adjustable components on intensity;
   (b) measuring an uncorrected uniformity profile;
   (c) calculating a plurality of values for the plurality of adjustable components using the uncorrected uniformity profile;
   (d) communicating the plurality of values for the plurality of adjustable components to the correction module; and
   (e) adjusting the plurality of adjustable components using the plurality of values received at the correction module.

2. The method of claim 1, further comprising the steps of:
   (f) measuring a corrected uniformity profile;
   (g) comparing the measured corrected uniformity profile to a predetermined value; and
   (h) modifying the uncorrected uniformity profile and repeating steps (c) through (g) if the measured corrected uniformity profile does not meet the predetermined value.

3. The method of claim 1, further comprising the steps of:
   (f) measuring a corrected uniformity profile;
   (g) comparing the measured corrected uniformity profile to a predetermined value; and
   (h) modifying the map generated in step (a) and repeating steps (c) through (g) if the measured corrected uniformity profile does not meet the predetermined value.

4. The method of claim 1, further comprising:
   after step (a),
   calculating a plurality of initial values for the plurality of adjustable components to correct for a standard uncorrected uniformity profile; and
   using the plurality of initial values as an initial condition for the calculation in step (c).

5. An optics uniformity correction subsystem, comprising:
   (a) a correction device, which resides in a defocused plane, wherein the correction device has a plurality of adjustable components configured to adjust an illumination output from a selectable pupil, wherein the plurality of adjustable components comprises a set of adjustable fingers configured to extend into an aperture;
   (b) a plurality of independent drivers configured to set positions of the plurality of the adjustable components;
   (c) a plurality of illumination intensity meters located substantially on an exposure plane; and
   (d) a feedback device configured to cause the plurality of independent drivers to drive the plurality of adjustable components to the positions.

6. The optics uniformity correction subsystem of claim 5, wherein the correction device is configured be rotated.

7. The optics uniformity correction subsystem of claim 5, wherein the set of adjustable fingers are configured to extend into the aperture from one side of the aperture.

8. The optics uniformity correction subsystem of claim 5, wherein the set of adjustable fingers are configured to extend into the aperture from more than one side of the aperture.

9. The optics uniformity correction subsystem of claim 5, wherein the set of adjustable fingers are substantially uniform in width.

10. The optics uniformity correction subsystem of claim 5, wherein the set of adjustable fingers are ununiform in width.

11. The optics uniformity correction subsystem of claim 5, wherein the set of adjustable fingers overlap, substantially eliminating any gap between adjacent fingers.

12. The optics uniformity correction subsystem of claim 5, wherein the set of adjustable fingers are spaced apart, such that gaps are formed between adjacent fingers.

13. The optics uniformity correction subsystem of claim 5, wherein the plurality of independent drivers are driven by linear displacement.

14. The optics uniformity correction subsystem of claim 5, wherein the illumination intensity meters integrate light intensity in a cross-scanned direction.

15. The optics uniformity correction subsystem of claim 5, wherein the feedback device comprises a microprocessor and memory unit.

16. The optics uniformity correction subsystem of claim 15, wherein the microprocessor and memory unit are configured to calculate the positions of the plurality of adjustable components to minimize non-uniformity in the exposure field.

17. The optics uniformity correction subsystem of claim 16, wherein the non-uniformities in the exposure field comprise uneven pupil illumination or pupil ellipticity.

* * * * *